United States Patent
Kao et al.

(10) Patent No.: US 11,942,368 B2
(45) Date of Patent: Mar. 26, 2024

(54) THROUGH SILICON VIAS AND METHODS OF FABRICATING THEREOF

(71) Applicant: Taiwan Semiconductor Manufacturing Company, Ltd., Hsinchu (TW)

(72) Inventors: Min-Feng Kao, Chiayi (TW); Hsing-Chih Lin, Tainan (TW); Jen-Cheng Liu, Hsin-Chu (TW); Dun-Nian Yaung, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 109 days.

(21) Appl. No.: 17/465,232

(22) Filed: Sep. 2, 2021

(65) Prior Publication Data

US 2022/0277998 A1    Sep. 1, 2022

Related U.S. Application Data

(60) Provisional application No. 63/200,275, filed on Feb. 26, 2021.

(51) Int. Cl.
*H01L 21/768*    (2006.01)
*H01L 23/48*    (2006.01)

(52) U.S. Cl.
CPC ...... *H01L 21/76898* (2013.01); *H01L 23/481* (2013.01)

(58) Field of Classification Search
CPC ....... H01L 23/48; H01L 23/58; H01L 23/481; H01L 23/522; H01L 23/528; H01L 23/585; H01L 23/5226; H01L 21/768; H01L 21/76898
USPC .................................................. 438/629, 637
See application file for complete search history.

(56) References Cited

U.S. PATENT DOCUMENTS

| 6,309,956 B1 * | 10/2001 | Chiang | H01L 21/76819 257/E21.589 |
|---|---|---|---|
| 7,633,165 B2 | 12/2009 | Hsu et al. | |
| 8,202,800 B2 | 6/2012 | Chen et al. | |
| 11,094,650 B1 | 8/2021 | Liu | |
| 11,658,069 B2 * | 5/2023 | Chen | H01L 24/83 438/118 |
| 2010/0140749 A1 * | 6/2010 | Kuo | H01L 23/552 257/621 |
| 2013/0020721 A1 * | 1/2013 | Nakae | H01L 23/544 257/E21.597 |
| 2017/0154850 A1 | 6/2017 | Kao et al. | |

FOREIGN PATENT DOCUMENTS

TW    201917801 A    5/2019

* cited by examiner

*Primary Examiner* — Chuong A Luu
(74) *Attorney, Agent, or Firm* — Haynes and Boone, LLP

(57) ABSTRACT

Methods and devices of having an enclosure structure formed in a multi-layer interconnect and a through-silicon-via (TSV) extending through the enclosure structure. In some implementations, a protection layer is formed between the enclosure structure and the TSV.

11 Claims, 36 Drawing Sheets

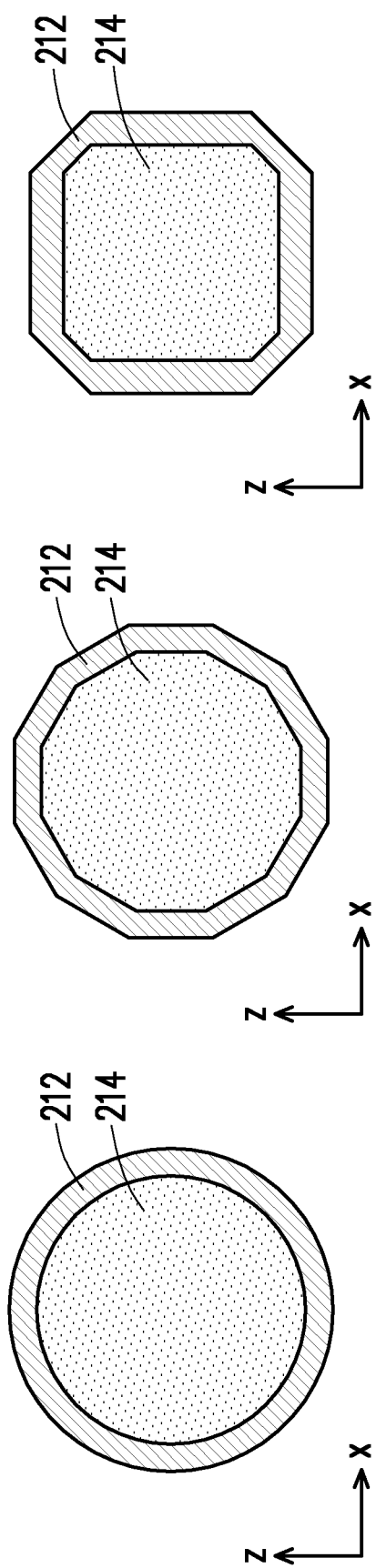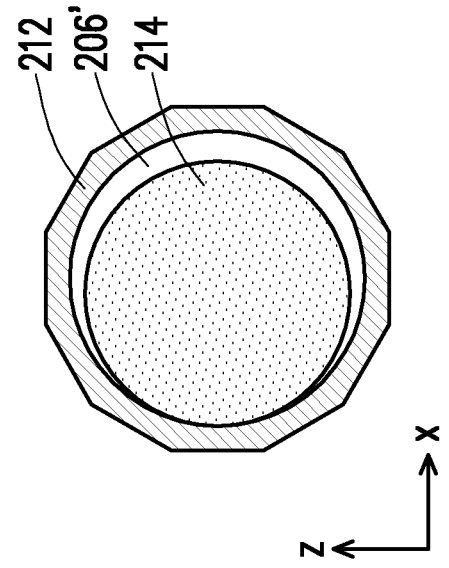

THROUGH SILICON VIAS AND METHODS OF FABRICATING THEREOF

CROSS-REFERENCE TO RELATED APPLICATIONS

This application claims the benefit of U.S. Provisional Application No. 63/200,275, filed Feb. 26, 2021, which is hereby incorporated by reference in its entirety.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. As a part of the semiconductor fabrication, conductive elements may be formed to provide electrical interconnections for the various components for an IC. For example, metal layers and vias route signals from one component to another. While these metal lines and vias have generally been satisfactory in some respects, manufacturability, performance and reliability improvements are desired.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2B, 2C, 2D, 2E and 2F are embodiments of a top view of a via having an enclosure structure, according various aspects of the present disclosure;

DETAILED DESCRIPTION

Figure 1:
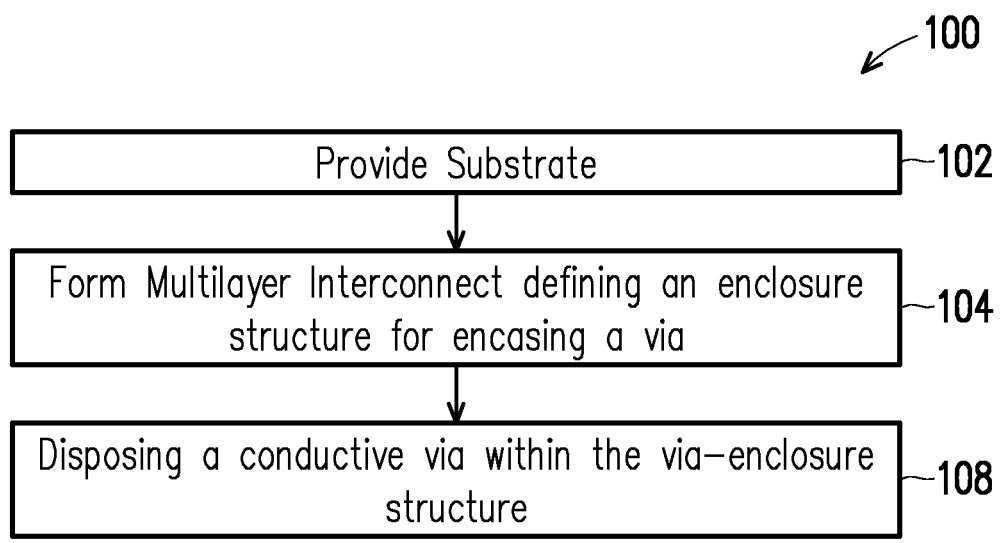
FIG. 1 is a flow chart illustrating an embodiment of a method of fabricating a conductive via of a semiconductor device according to various aspects of the present disclosure.

The present disclosure relates generally to integrated circuit devices, and more particularly, to interconnect structures for integrated circuit devices.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

A multilayer interconnect (MLI) feature electrically couples various devices (for example, transistors, resistors, capacitors, and/or inductors) and/or components (for example, gate structures and/or source/drain features) of an integrated circuit (IC) device, such that the various devices and/or components can operate as specified by design requirements. The MLI feature includes a combination of dielectric layers and conductive layers configured to form various interconnect structures. The conductive layers are configured to form vertical interconnect features, such as device-level contacts and/or vias, and/or horizontal interconnect features, such as conductive lines also referred to as metal layers. Vertical interconnect features typically connect horizontal interconnect features in different layers (or different planes) of the MLI feature. A typical semiconductor device may have a plurality of conductive layers extending a plurality of layers (or planes) providing for a MLI. For example, in some implementations, semiconductor devices include a dozen or more levels of horizontal interconnect features—metal lines—interposed by vertically extending interconnect features—vias. During operation of the IC device, the interconnect structures route signals between the devices and/or the components of the IC device and/or distribute signals (for example, clock signals, voltage signals, and/or ground signals) to the devices and/or the components. An MLI is formed in a back-end-of-the-line (BEOL) process, typically formed after the front-end-of-the-process (FEOL) forms the active devices such as a transistor on a substrate. The BEOL may be start from a first interconnect above the active device (e.g., first via V0 or first metal line M1) or one or more layers may be formed over the active device before the BEOL process is considered to be applied.

In some implementations of semiconductor devices, it is desired to provide a vertical interconnect that extends through various layers and/or the substrate of the semiconductor device. Such a vertical interconnect may be referred to as a through-silicon or through-substrate via (TSV) as it extends through, in whole or in part, the semiconductor substrate (which is typically, though not exclusively silicon). In some implementations, TSV are formed from a backside of the device (referred to as backside TSV or BTSV). The term TSV in the present disclosure broadly encompasses the electrical connections made both from the frontside and the backside of the substrate.

TSV can provide an electrical connection that presents an alternative to other interconnect techniques (e.g., wire bond). In some implementations, TSV allow for fabricating 3D packages or integrated circuits, providing for devices on different substrates to be interconnected. TSV can provide for an interconnection that is robust, provides higher device density, and a shorter interconnection path. The introduction of TSV can provide for device performance improvements such as a reduction in RC delay. The semiconductor devices suitable for TSV including those of the present disclosure are various and include, but are not limited to, image sensors such as CMOS image sensors (CIS), 3D packages, 3D ICs, MEMS devices, RF devices, wafer-on-wafer devices (WoW), and the like.

However, fabrication of TSV may encounter challenges due to the methods and structures providing for the TSVs that may extend a relatively long distances, raising challenges in etching the openings/holes for the via and challenges in filling said openings. In some implementations, TSV must traverse dielectric materials that can be damaged due to the etching and deposition processes. For example, extreme low-k dielectric materials may be implemented a MLI to provide for mechanical stability and electrical insulation of the conductive lines and vias. However, extreme low-k materials (ELK) may be damaged by the etching and deposition processes to provide for TSVs that extend through some or all of the ELK materials of the MLI. For example, etching an opening/hole for a TSV may cause delamination and/or other damage to the dielectric materials such as ELK that the TSV is fabricated within. Further, the conductive material provided to form the TSV (e.g., copper) may unwantedly diffuse into the dielectric materials causing contamination and/or an undesired modification of the conductivity of the material.

Embodiments of the present disclosure provide for surrounding a TSV with an enclosure structure. The enclosure structure interposes the TSV and the surrounding materials (e.g., dielectric, such as ILD layers). The enclosure structures may be fabricated in conjunction with the conductive layers (vias and metal layers) of the MLI. Thus, the enclosure structures are provided within the MLI, coplanar to the vias and metal layers, and can comprise the same materials (e.g., same metals). The enclosure structures in some implementations mitigate delamination or damage of dielectric materials providing for a protective enclosure, also referred to as a ring or sleeve, around the area where etching to form a TSV will be performed. Some implementations may provide for reduction and/or elimination of metallic (e.g., Cu) diffusion by providing a protective barrier layer (e.g., dielectric) between the TSV and the enclosure structure. In some implementations, the protective barrier layer (e.g., dielectric) between the TSV sidewalls and the enclosure structure, both metal, acts to reduce the stress exhibited by the metallization. Different embodiments may have different advantages, and no particular advantage is required of any embodiment.

Figure 2A:
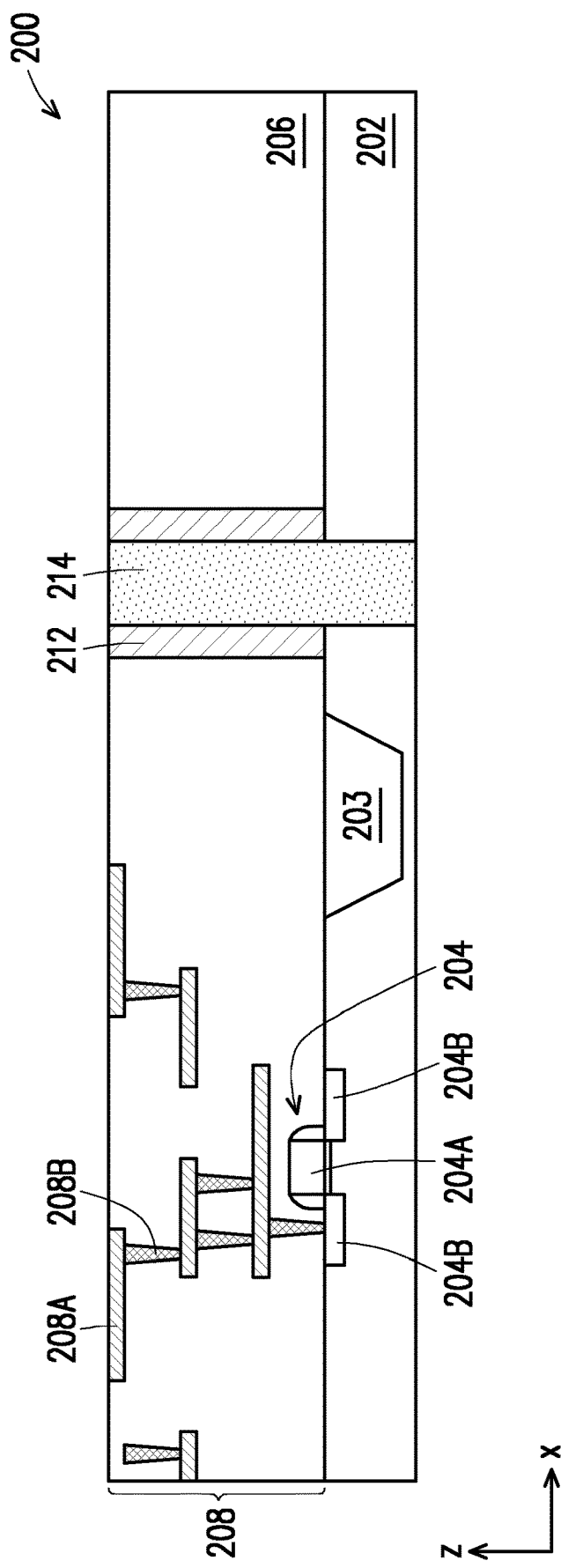
FIG. 2A is a cross-sectional view of an embodiment of a semiconductor device having a via having an enclosure structure according to various aspects of the present disclosure.

FIG. 1 is a flowchart illustrating a method 100 of providing a conductive via, such as a TSV, according to various aspects of the present disclosure. FIG. 2A is a fragmentary diagrammatic view of an integrated circuit device 200, in portion or entirety, according to various aspects of the present disclosure. Integrated circuit device 200 may be included in a microprocessor, a memory, and/or other integrated circuit device. In some implementations, integrated circuit device 200 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LD-MOS) transistors, high voltage transistors, high frequency transistors, other suitable components, or combinations thereof. The transistors may be planar transistors or multi-gate transistors, such as fin-like FETs (FinFETs) or gate-all-around (GAA) transistors. The GAA transistors may include channel regions of various shapes including nanowire, nanobar, or nanosheet, all collectively referred to as nanostructures. FIG. 2A has been simplified for the sake of clarity to better understand the inventive concepts of the present disclosure. Additional features can be added in integrated circuit device 200, and some of the features described below can be replaced, modified, or eliminated in other embodiments of integrated circuit device 200.

The method 100 begins at block 102 where a substrate is provided. Turning to the example of FIG. 2A, integrated circuit device 200 includes a substrate (wafer) 202. In an embodiment, substrate 202 includes silicon. Alternatively or additionally, substrate 202 includes another elementary semiconductor, such as germanium; a compound semiconductor, such as silicon carbide (SiC), gallium arsenide (GaAs), gallium phosphide (GaP), indium phosphide (InP), indium arsenide (InAs), and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 202 can include various doped regions (not shown) depending on design requirements of integrated circuit device 200. In some implementations, substrate 202 includes p-type doped regions (for example, p-type wells) doped with p-type dopants, such as boron (for example, $BF_2$), indium, other p-type dopant, or combinations thereof. In some implementations, substrate 202 includes n-type doped regions (for example, n-type wells) doped with n-type dopants, such as phosphorus, arsenic, other n-type dopant, or combinations thereof. In some implementations, substrate 202 includes doped regions formed with a combination of p-type dopants and n-type dopants. The various doped regions can be formed directly on and/or in substrate 202, for example, providing a p-well structure, an n-well structure, a dual-well structure, a raised structure, or combinations thereof. An ion implantation process, a diffusion process, and/or other suitable doping process can be performed to form the various doped regions.

Isolation feature(s) 203 are formed over and/or in substrate 202 to isolate various regions, such as various device regions, of integrated circuit device 200. For example, isolation features 203 define and electrically isolate active device regions and/or passive device regions from each other. Isolation features 203 include silicon oxide, silicon nitride, silicon oxynitride, other suitable isolation material (for example, including silicon, oxygen, nitrogen, carbon, or other suitable isolation constituent), or combinations thereof. Isolation features 203 can include different structures, such as shallow trench isolation (STI) structures, deep trench isolation (DTI) structures, and/or local oxidation of silicon (LOCOS) structures. In some implementations, isolation features 203 are formed by etching a trench in substrate 202 (for example, using a dry etch process and/or wet etch process) and filling the trench with insulator material (for example, using a chemical vapor deposition (CVD) process or a spin-on glass process). A chemical mechanical polishing (CMP) process may be performed to remove excessive insulator material and/or planarize a top surface of isolation features 203. In some embodiments, isolation features 203 can be formed by depositing an insulator material over substrate after forming fins (in some implementations, such that the insulator material layer fills gaps (trenches) between the fins) and etching back the insulator material layer. In some implementations, isolation features 203 include a multi-layer structure that fills trenches, such as a bulk dielectric layer disposed over a liner dielectric layer, where the bulk dielectric layer and the liner dielectric layer include materials depending on design requirements (for example, a bulk dielectric layer that includes silicon nitride disposed over a liner dielectric layer that includes thermal oxide). In some implementations, isolation features 203 include a dielectric layer disposed over a doped liner layer (including, for example, boron silicate glass (BSG) or phosphosilicate glass (PSG)). While the isolation feature 203 interposes the TSV 214 (discussed below) and the active device 204 (also discussed below) in the illustration of FIG. 2A, other configurations are possible including those where the TSV 214 passes through the isolation feature 203 (see, e.g., FIGS. 15-18).

A device 204 is positioned on the substrate 202. The device 204 may include a n-type or p-type field effect transistor (FET). The device 204 includes a gate structure 204A disposed over the substrate 202. Gate structure 204A interposes a source region 204B and a drain region 204B, where a channel region is defined between the source region and the drain region. Gate structure 204A engages the channel region, such that current can flow between the source/drain regions during operation. In some implementations, gate structure 204A is formed over a fin structure, such that gate structure 204A wraps a portion of the fin structure. For example, gate structure 20A wraps a channel region of the fin structure, thereby interposing a source region and a drain region of the fin structure. In some implementations, gate structure 204A is formed over and surrounding a plurality of nanostructures, such that gate structure 204A wraps each of the nanostructures interposing a source region and a drain region forming channel regions in the nanostructures. Gate structure 204A includes a gate stack that is configured to achieve desired functionality according to design requirements of integrated circuit device 200. In some implementations, the gate stack includes a gate dielectric (for example, a gate dielectric layer) and a gate electrode (for example, a work function layer and/or a bulk conductive layer). Gate stack may include numerous other layers, for example, capping layers, interfacial layers, diffusion layers, barrier layers, hard mask layers, or combinations thereof. In some implementations, the gate dielectric layer is disposed over an interfacial layer (including a dielectric material, such as silicon oxide), and the gate electrode is disposed over the gate dielectric layer. The gate dielectric layer includes a dielectric material, such as silicon oxide, high-k dielectric material, other suitable dielectric material, or combinations thereof. Examples of high-k dielectric material include hafnium dioxide ($HfO_2$), HfSiO, HfSiON, HfTaO, HfSiO, HfZrO, zirconium oxide, aluminum oxide, hafnium dioxide-alumina ($HfO_2$—$Al_2O_3$) alloy, other suitable high-k dielectric materials, or combinations thereof. In some implementations, the gate dielectric layer of the gate structure 204A is a high-k dielectric layer. The gate electrode of the gate structure 204A includes a conductive material, such as polysilicon, aluminum (Al), copper (Cu), titanium (Ti), tantalum (Ta), tungsten (W), molybdenum (Mo), cobalt (Co), TaN, NiSi, CoSi, TiN, WN, TiAl, TiAlN, TaCN, TaC, TaSiN, other conductive material, or combinations thereof. In some implementations, the work function layer is a conductive layer tuned to have a desired work function (such as an n-type work function or a p-type work function), and the conductive bulk layer is a conductive layer formed over the work function layer. In some implementations, the work function layer includes n-type work function materials, such as Ti, silver (Ag), TaAl, TaAlC, TiAlN, TaC, TaCN, TaSiN, manganese (Mn), zirconium (Zr), other suitable n-type work function materials, or combinations thereof. In some implementations, the work function layer includes a p-type work function material, such as TiN, TaN, ruthenium (Ru), Mo, Al, WN, $ZrSi_2$, $MoSi_2$, $TaSi_2$, $NiSi_2$, WN, other suitable p-type work function materials, or combinations thereof. The bulk (or fill) conductive layer includes a suitable conductive material, such as Al, W, and/or Cu. The bulk conductive layer may additionally or collectively include polysilicon, Ti, Ta, metal alloys, other suitable materials, or combinations thereof. The present disclosure further contemplates embodiments where the gate dielectric layer, the work function layer, the bulk conductive layer, and/or other layer of gate stack has a multi-layer structure.

Gate structure 204A is formed by deposition processes, lithography processes, etching processes, other suitable processes, or combinations thereof. The deposition processes include CVD, physical vapor deposition (PVD), ALD, high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof. The lithography patterning processes include resist coating (for example, spin-on coating), soft baking, mask aligning, exposure, post-exposure baking, developing the resist, rinsing, drying (for example, hard baking), other suitable processes, or combinations thereof. Alternatively, the lithography exposure process is assisted, implemented, or replaced by other methods, such as maskless lithography, electron-beam writing, or ion-beam writing. The etching processes include dry etching processes, wet etching processes, other etching processes, or combinations thereof. Gate structure 204A is fabricated according to a gate last process, a gate first process, or a hybrid gate last/gate first process.

Gate structure 204A further includes gate spacers, which are disposed adjacent to (for example, along sidewalls of) gate stack, respectively. Gate spacers are formed by any suitable process and include a dielectric material. The dielectric material can include silicon, oxygen, carbon, nitrogen, other suitable material, or combinations thereof (for example, silicon oxide, silicon nitride, silicon oxynitride, or silicon carbide). After deposition of the dielectric materials, the material may be anisotropically etched to form gate spacers. In some implementations, gate spacers include a multi-layer structure. In some implementations, more than one set of spacers, such as seal spacers, offset spacers, sacrificial spacers, dummy spacers, and/or main spacers, are formed adjacent to gate stack. Epitaxial growth, implantation, diffusion, and/or annealing processes may be performed to form source/drain regions 204B including lightly doped source and drain (LDD) features and/or heavily doped source and drain (HDD) features on substrate 202 (e.g., within the substrate, on or within a fin extending from the substrate, and the like), depending on design requirements of integrated circuit device 200. An epitaxy process can implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. Source/drain features 204B are doped with n-type dopants and/or p-type dopants. For example, where the transistor is configured as an n-type device (for example, having an n-channel), source/drain features 204B may be epitaxial layers including silicon and/or carbon, where silicon-containing epitaxial layers or silicon-carbon-containing epitaxial layers are doped with phosphorous, other n-type dopant, or combinations thereof (for example, forming a Si:P epitaxial layer or a Si:C:P epitaxial layer). In another example, where the transistor is configured as a p-type device (for example, having a p-channel), source/drain features 204B are epitaxial layers including silicon and germanium, where the silicon germanium containing epitaxial layers are doped with boron, other p-type dopant, or combinations thereof (for example, forming a Si:Ge:B epitaxial layer).

The method 100 then proceeds to block 104 where a multilayer interconnect (MLI) is formed over the substrate. The MLI is formed in a back-end-of-the-line (BEOL) process, typically formed after the front-end-of-the-process (FEOL) forms the active devices such as the transistor 204 on the substrate 202. The BEOL processes provide an MLI as discussed above, such as providing conductive layers providing the routing and interconnection between devices formed on the substrate. In addition to forming the electrical interconnections to/from the device described above in block 102 by way of horizontally extending metal lines and vertically extending vias or contacts, forming the MLI of block 104 includes defining and forming a structure for enclosing a via. This structure may be referred to herein as an enclosing or encasing structure, or a ring or a sleeve. The enclosing structure is discussed in further detail below.

In forming the MLI, a plurality of interlayer dielectric (ILD) layers are disposed over the substrate. The ILD layers may include a same or different composition. Within each ILD layer, a metal feature—e.g., metal line and/or via—is formed. Referring to the example of FIG. 2, ILD layers are illustrated together as ILD layer 206 formed over the substrate 202, ILD layer 206 include dielectric materials including, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Xerogel, Aerogel, amorphous fluorinated carbon, Parylene, BCB, polyimide, other low-k dielectric materials, or combinations thereof. In some implementations, ILD layer 206 has a multilayer structure having multiple dielectric materials. For example, in some implementations, etch stop layers (ESLs) interpose portions of the ILD layer 206 and/or interpose the ILD layer 206 and the device 204 or substrate 202, such as a contact etch stop layer (CESL). The ESL/CESL may include a material different than other portions of the ILD layer 206. In an embodiment, ILD layer 206 includes a low-k dielectric material portion(s) and a ESL/CESL portion(s) includes silicon and nitrogen (for example, silicon nitride or silicon oxynitride). ILD layer 206 is formed over substrate 202, for example, by a deposition process (such as CVD, PVD, ALD, HDPCVD, MOCVD, RPCVD, PECVD, LPCVD, ALCVD, APCVD, other suitable methods, or combinations thereof). In some implementations, ILD layer 206 is formed by a flowable CVD (FCVD) process that includes, for example, depositing a flowable material (such as a liquid compound) over substrate 202 and converting the flowable material to a solid material by a suitable technique, such as thermal annealing and/or ultraviolet radiation treating. Forming the ILD layer 206 may include multiple deposition steps, followed by patterning the ILD layer to define the conductive features to be formed in the ILD layer 206, forming the conductive features, performing planarization processes, and/or other suitable processes.

As suggested above, forming the MLI includes defining and forming the conductive lines 208A and vias 208B that are embedded within the ILD layer 206. The conductive layers are configured to form vertical interconnect features, such as device-level contacts 208B (contacting source/drain 204B) and/or vias 208B, and/or horizontal interconnect features, such as conductive lines 208A. Vertical interconnect features 208B typically connect horizontal interconnect features in different layers (or different planes) of MLI feature. During operation of integrated circuit device 200, the interconnect structures 208A, 208B are configured to route signals between the devices including device 203 and/or the components of integrated circuit device 200 and/or distribute signals (for example, clock signals, voltage signals, and/or ground signals) to the devices and/or the components of integrated circuit device 200. In some implementations, the conductive lines or vias are formed by depositing conductive material such as copper, aluminum, tungsten and/or other suitable conductive materials in channels or openings formed in a respect layer of ILD material as discussed below. In some implementations, the conductive interconnect features have a multi-layer structure such as including seed layers, adhesion promotion layers, barrier layers, and the like. The MLI structure, MLI 208 of FIG. 2A, includes the conductive features 208A, 208B and the surrounding dielectric 206.

In the method 100, forming the MLI also includes defining an enclosure structure for encasing a (subsequently formed) via (e.g., through silicon-via, TSV) according to one or more aspects of the present disclosure. The enclosure structure is formed concurrently with the conductive lines and vias. The enclosure structure is formed of a plurality of layers each formed within the same level (or plane) of the vias and metal lines of MLI. Each layer of the enclosure structure may be formed at the same time, and may include the same material(s) (e.g., conductive material such as copper, aluminum, tungsten and/or other suitable conductive materials), as the corresponding via and/or metal line of said layer. Each layer of the enclosure structure combines to form a contiguous metal-containing structure (e.g., a ring, or sleeve) that extends the height of the MLI.

Referring to the example of FIG. 2A, an enclosure structure 212 of the MLI 208 is illustrated. The enclosure structure 212 is a feature comprising metal-comprising material extending through the ILD layer 206 in much the same way as the conductive lines 208A and vias 208B discussed above and continued below.

For example, as introduced above, the MLI 208 may be formed in successive layers. In some implementations, after deposition of a portion of the ILD layer 206, the ILD layer is patterned to form openings in the portion of the ILD layer 206, where the openings correspond to the conductive lines and/or vias and opening correspond to a portion of the enclosure structure 212. The formation of the conductive portions of the MLI 208 may be by a damascene process or dual damascene process.

In an embodiment, the patterning process of the ILD layer 206, or layer thereof, includes lithography processes and/or etching processes. For example, forming openings includes performing a lithography process to form a patterned resist layer over a portion of ILD layer 206 and performing an etching process to transfer a pattern defined in the patterned resist layer to ILD layer 206. The lithography process can include forming a resist layer on ILD layer 206 (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during a developing process depending on characteristics of the resist layer and characteristics of a developing solution used in the developing process. After development, the patterned resist layer includes a resist pattern that corresponds with the mask. The etching process uses the patterned resist layer as an etch mask to remove portions of ILD layer 206 forming openings or channels, the channels can correspond to the conductive path from the device 204 and also include channels corresponding to the enclosure structure 212. The etching process can include a dry etching process, a wet etching process, other suitable etching process, or combinations thereof. After the etching process, the patterned resist layer is removed from ILD layer 206, for example, by a resist stripping process.

The process continues to provide conductive material or materials in the etched channels of the ILD layer. In an implementation, the patterning and etching processes provide defining a first via and a subsequent patterning and etching process defines a first metal line in an ILD layer to form a continuous opening defining the via and the metal line (e.g., a dual damascene process). In such a process, the defined via and first metal line are then filled concurrently. The portion of the enclosure structure 212 co-planar with each of the conductive feature (e.g., via and line) are formed concurrently with the respective feature (e.g., via or line). In other implementations, a single layer of a conductive feature (e.g., via or line) and the corresponding layer of the enclosure structure 212 are formed independently from the adjacent metallization layer though a single damascene process. Again, the portion of the enclosure structure 212 co-planar with the conductive feature providing routing for an electrical signal from the device 204 (e.g., line or via) is formed concurrently with said conductive feature.

The filling the channels of in the ILD layer (e.g., the vias, metal lines, layers of the enclosure structure 212) may include deposition of a conductive material. The conductive material or materials may be deposited by a deposition process (such as CVD, PVD, ALD, HDPCVD, MOCVD, RPCVD, PECVD, LPCVD, ALCVD, APCVD, plating, other suitable methods, or combinations thereof). The conductive features may be multi-layered and may include any suitable conductive material, such as Ta, Ti, Al, Cu, Co, TaN, TiN, TaN, and/or other suitable conductive materials. For example, in some implementations, a liner or barrier layer (e.g., TiN, TaN, WN) is deposited (e.g., PVD, ALD), followed by a seed layer, and a conductive fill material (e.g., copper). A chemical mechanical polishing step removes excess metal to complete the layer of interconnect. In some implementations as capping or ESL (e.g., SiCN) is formed over the planarized surface. These processes are repeated such that each layer of the MLI is formed.

The enclosure structure 212 formed with the MLI 208 in some implementations includes a contiguous structure extending from a bottom of the ILD layer 206 to a top surface of the ILD layer 206. That is, in some implementations, the MLI 208 includes x via layers (e.g., V0, V1, V2 and so forth) and y metal layers (e.g., M1, M2, M3 and so forth). In an embodiment, the enclosure structure 212 includes portions/layers formed on each of the x via layers and each of the y metal layers. In an embodiment, the enclosure structure 212 includes portions formed on each of the x–1 via layers and each of the y metal layers. For example, the enclosure structure 212 may not extend coplanar with a first contact-level interconnect (e.g., a vertically extending contact extending up from source/drain 204B to a first metallization of the MLI 208 (e.g., a bottom via 208B)).

The enclosure structure 212 provides an encasement or ring, which will surround a subsequently formed via (e.g., TSV). The term ring, as used herein, does necessitate a structure having an inner edge and an outer edge that are circular and thus, comprised of curvilinear lines. Rather, the enclosure structure can be various shapes that surround the via (which may also comprise various shapes) from the top view. FIG. 2B illustrates an embodiment of the enclosure structure 212 from a top view illustrating the enclosure structure 212 being substantially circular. However, it may be desired or necessitated, for example for lithography limits and/or processes (e.g., metal fill) to provide edges of the enclosure structure 212 that form a different shape. FIGS. 2C, 2D, 2E, and 2F show top view of embodiments of the enclosure structure 212 that are substantially polygonal. The shape of the enclosure structure 212 is determined by the patterning discussed above. For example, the lithography process defining the channels in the dielectric layer 206 corresponding to a given layer of the enclosure structure 212.

The method 100 then proceeds to block 108 where a conductive via is formed within the via enclosure structure formed with the MLI in block 104. The conductive via may be defined such that delivers an electrical path from an exposed top of the device to and/or through the substrate. For example, providing an electrical path from the topside of the device to the backside of the device. This type of via may be referred to as a through-substrate via, or through silicon via (TSV). Referring to the example of FIG. 2A, the via 214 extends from a top of the device 200, in particular the top of the ILD 206, through to the backside of the substrate 202. The via 214 is referred to as TSV 214. The TSV 214 is provided within the enclosure structure 212. Thus, in some implementations, the TSV 214 itself does not contact the ILD 206, but is predominately separated from the ILD 206 by the enclosure structure 212. In some implementations, the TSV 214 directly interfaces the enclosure structure 212, in other embodiments, as discussed below, a protection layer is formed between the enclosure structure 212 and the ILD 206. Within the enclosure structure 212 the ILD 206 may be completely removed.

In an embodiment, formation of the TSV 214 includes patterning, etching an opening, and filling the opening with conductive material(s). The patterning process may include lithography processes and/or etching processes. For example, forming the TSV 214 openings includes performing a lithography process to form a patterned resist layer over the ILD layer 206 and performing an etching process to transfer a pattern defined in the patterned resist layer to ILD layer 206 and underlying layers, and/or substrate 202. The lithography process can include forming a resist layer on ILD layer 206 (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during a developing process depending on characteristics of the resist layer and characteristics of a developing solution used in the developing process. After development, the patterned resist layer includes a resist pattern that corresponds with the mask. The etching process uses the patterned resist layer as an etch mask when removing portions of ILD layer 206 and the underlying substrate 202. The etching process can include a dry etching process, a wet etching process, other suitable etching process, or combinations thereof. After the etching process, the patterned resist layer is removed from ILD layer 206, for example, by a resist stripping process.

The opening etched for the TSV 214 is then filled with various layers including protection layers, barrier layers, and conductive fill material(s). These layers are discussed in further detail below. After filling the TSV 214 with conductive material(s), a planarization process may remove the excess material. In some implementations, the substrate 202 is then thinned from the backside to expose and end of the TSV 214.

It is noted that while the TSV 214 is formed within the enclosure structure 212, it is not necessary that the TSV 214 be centered (e.g., share a center axis) with that of the enclosure structure 212. As illustrated in FIG. 2E, the TSV 214 may be offset to one side of the enclosure structure 212. In another embodiment as illustrated in FIG. 2F, the TSV 214 is formed within the enclosure structure 212. However, a portion of the ILD layer 206, annotated ILD 206', remains between the TSV 214 and the enclosure structure 212. It is noted that the ILD 206' is separated from the remainder of the ILD 206 by the enclosure structure 212. In some embodiments, a protection layer interposes the TSV 214 and the enclosure structure 212, including as discussed below.

An interconnection can be made at the top and/or bottom of the TSV 214 to other conductive features such as, other metal lines, bond pads, conductive bumps, other input/output features, and/or other suitable interconnections.

The exemplary device 200 and method 100 provide embodiments were the dielectric layer (e.g., ILD 206) is protected from damage such as delamination during the formation of the TSV (e.g., TSV 214) by the enclosure structure (enclosure structure 212). The enclosure structure provides an encasement of the TSV such that damage to surrounding materials (e.g., ILD layer) during the etching and/or filling of the TSV is mitigated. The enclosure structure may provide benefits such as mitigation of delamination of the ILD layer. The benefits of features of the device 200 and/or the method 100 may include mitigation of diffusion of conductive material (e.g., copper) in the TSV to the surrounding areas (e.g., ILD layer). The methods and/or devices may also provide for a performance improvement such as an RC improvement. The prevention of damage to the ILD layer in some embodiments allows for protection of extreme low-k dielectric materials desirable for use in the ILD layer, but which easily are damaged by processes such as the etching the opening for the TSV.

Figure 3:
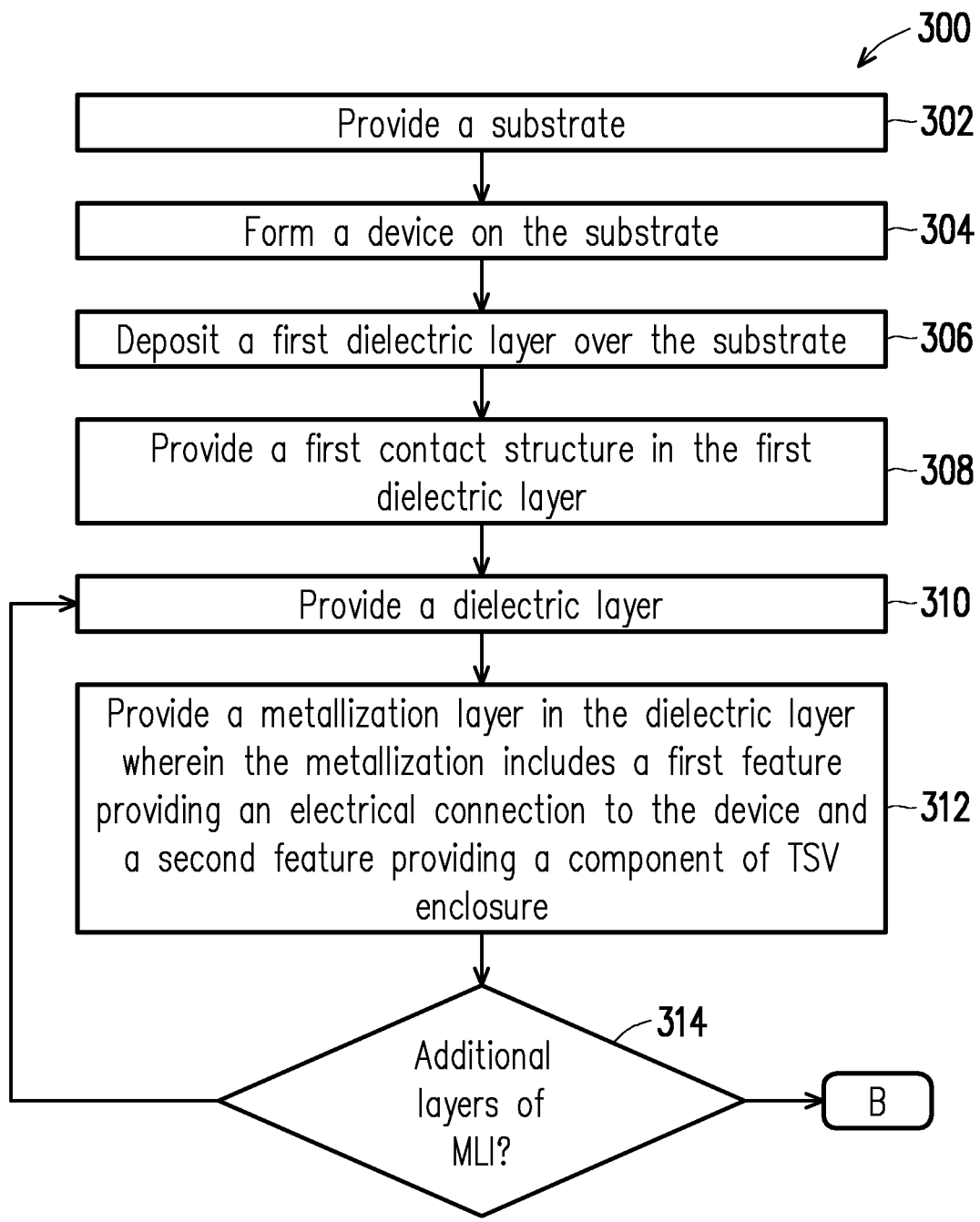
FIG. 3 is a flow chart illustrating an embodiment of a method of fabricating a semiconductor device having a multi-layer interconnect (MLI) providing an enclosure structure, according to various aspects of the present disclosure.

Referring now to FIG. 3, illustrated is a method 300 of fabricating a MLI having an enclosure structure. The enclosure structure formed surrounds a region of the device where a via will be subsequently formed, such as a TSV. The method 300 provides an exemplary embodiment of the method 100 of FIG. 1. The enclosure structure formed in the method 300 may be substantially similar to the enclosure structure 212 discussed above. The method 300 is exemplary only and may include other steps than those enumerated.

The method 300 begins at block 302 where a substrate is provided. Block 302 may be substantially similar to the block 102 discussed above with reference to the method 100 of FIG. 1. The substrate provided may be substantially similar to the substrate 202 of FIG. 2A. For example, in an embodiment, the substrate is a silicon substrate (or wafer). Referring to the example of FIG. 6, a device 600 includes the substrate 202. The device 600 may be substantially similar to the device 200 discussed above.

The method 300 then proceeds to block 304 where a device (e.g., active device) is formed on the substrate. The device may include a n-type or p-type field effect transistor (FET). In an embodiment, the device may be a fin-type field effect transistor (FinFET), gate-all-around (GAA) transistor, and/or other semiconductor device types including, but not limited to capacitors, resistors, memory elements, junctions, image components, and/or other features. Referring to the example of FIG. 6, a device 204 (e.g., FET) includes a gate structure 204A and corresponding source/drain regions 204B and is formed on the substrate 202. The device 204 including gate structure 204A and source/drain regions 204B may be substantially similar to as discussed above.

The method 300 then proceeds to block 306 where a first dielectric layer is deposited over the substrate. The first dielectric layer may be a first inter-layer dielectric (ILD) layer. Referring to the example of FIG. 6, a dielectric layer 602 is formed over the substrate 202. The dielectric layer 602 may be substantially similar to a portion of the dielectric layer 206, discussed above with reference to FIG. 2A. In an embodiment, the dielectric layer 602 includes a dielectric material including, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Xerogel, Aerogel, amorphous fluorinated carbon, Parylene, BCB, polyimide, other low-k dielectric materials, or combinations thereof. In some implementations, the dielectric layer 602 has a multilayer structure having multiple dielectric materials such as a contact etch stop layer (CESL). In an embodiment, ILD layer 602 includes a low-k dielectric material and a CESL of silicon and nitrogen (for example, silicon nitride or silicon oxynitride). The dielectric layer 602 is formed over substrate 202, for example, by a deposition process (such as CVD, PVD, ALD, HDPCVD, MOCVD, RPCVD, PECVD, LPCVD, ALCVD, APCVD, other suitable methods, or combinations thereof). In an embodiment, the material of the dielectric layer 602 is different than that of the overlying ILD layers (e.g., 702). For example, the dielectric layer 602 may have a composition having a different etch selectivity to that of the overlying dielectric 702.

The method 300 then proceeds to block 308 where a first contact structure is formed in the first dielectric layer. The first contact structure may provide an electrical interconnection to the device formed in block 304 and/or a portion thereof. Referring to the example of FIG. 6, in an embodiment, a first contact structure 604 is formed extending through the dielectric layer 602 to the source/drain feature 204B of the device 204. The first contact feature 604 includes a conductive material such as titanium nitride (TiN), titanium (Ti), ruthenium (Ru), nickel (Ni), cobalt (Co), copper (Cu), molybdenum (Mo), tungsten (W), tantalum (Ta), tantalum nitride (TaN), and/or other suitable materials. In some implementations, the contact feature 604 includes a liner (e.g., barrier) layer such as titanium (Ti), tantalum (Ta), titanium nitride (TiN), cobalt nitride (CoN), nickel nitride (NiN), tantalum nitride (TaN), and/or other materials. The contact feature 604 may be formed through patterning the dielectric layer 602 to form a trench or opening, that is subsequently filled with conductive material such as discussed above with reference to MLI 208. In some implementations, a silicide layer is formed between the first contact structure 604 and the source/drain 204B. The contact feature 604 may be substantially similar to a bottom via 208B of the device 200, discussed above with reference to FIG. 2A.

The method 300 then proceeds to block 310 where a subsequent dielectric layer is formed. The subsequent dielectric layer may be an ILD dielectric layer as discussed above. Referring to the example of FIG. 7, a dielectric layer 702 is formed over the substrate 202. The dielectric layer 702 may be substantially similar to a portion of the dielectric layer 206, discussed above with reference to FIG. 2A. In an embodiment, the dielectric layer 702 includes a dielectric material including, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Xerogel, Aerogel, amorphous fluorinated carbon, Parylene, BCB, polyimide, other low-k dielectric materials, or combinations thereof. In some implementations, the dielectric layer 702 has a multilayer structure. The dielectric layer 702 is formed over substrate 202, for example, by a deposition process (such as CVD, PVD, ALD, HDPCVD, MOCVD, RPCVD, PECVD, LPCVD, ALCVD, APCVD, other suitable methods, or combinations thereof).

The method 300 then proceeds to block 312 where a metallization layer of the MLI is formed. The metallization layer may include a vertically extending via (e.g., V0) and/or a horizontally extending metal line (e.g., M1) of a MLI providing routing of an electrical signal to/from the device 200. According to aspects of the present disclosure, the forming of the metallization layer of the MLI further includes forming a feature that provides a component (or portion or level) of an enclosure structure for a TSV. The metallization layer of the MLI may be formed substantially similar to as discussed above including by lithography processes, etch processes, and deposition processes to form channels within the dielectric layer which are filled with conductive material(s) in a single damascene or dual damascene process.

Figure 7:
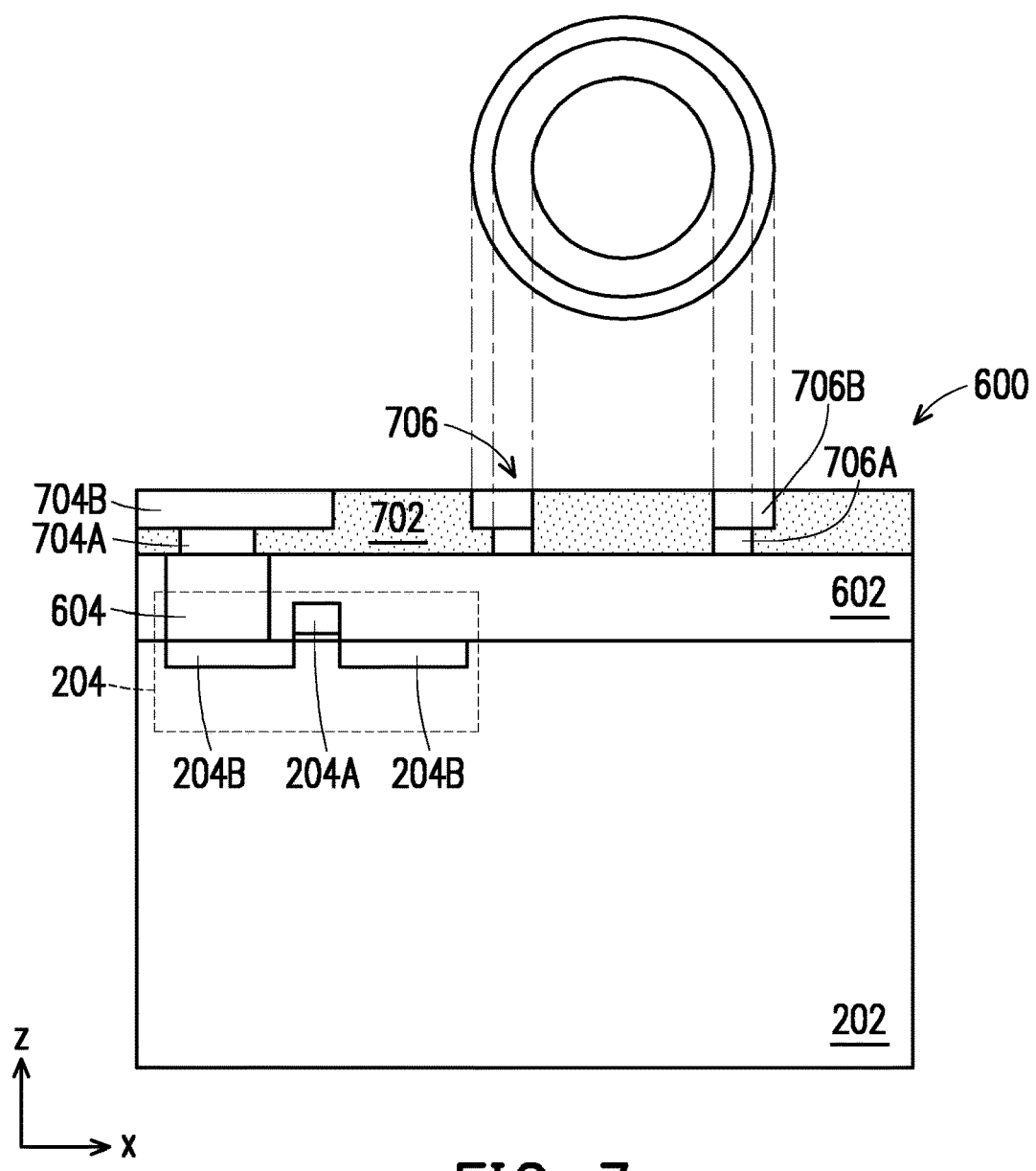

Referring to the example of FIG. 7, a first conductive feature 704 is formed in the dielectric layer 702. The first conductive feature 704 includes a conductive via 704A and a conductive metal line 704B. The conductive via 704A and conductive line 704B may be formed in a dual damascene process. In an embodiment, the conductive via 704A and conductive line 704B are each separately formed in a single damascene process. The conductive via 704A and conductive line 704B form conductive features that provide routing to/from the device 204.

As illustrated in FIG. 7, a second feature 706 is formed in the metallization layer of the MLI structure. The second feature 706 includes a first portion 706A formed coplanar with the first via 704A and a second portion 706B formed coplanar with the first metal line 704B. The first and second features 706A, 706B may be formed concurrently with the first via 704A and the first metal line 704B respectively, for example, in a dual damascene or single damascene process. The second feature 706 provides a first level or portion of an enclosure structure substantially similar to the enclosure structure 212 discussed above. That is, the second feature 706 surrounds a region of dielectric 702 within which a via (e.g., TSV) is subsequently formed. As illustrated by the inset of the top view, the first and second feature 706A, 706B may be circular; however, other configurations of a ring enclosing the via-region are possible including as discussed above with reference to FIGS. 2B, 2C, 2D, 2E, and 2F. It is also noted that second feature 706 that forms a portion of the enclosure structure illustrates the first portion 706A that has a width that is less than the second portion 706B, where the first portion 706A is formed on the via level of the MLI and the second portion 706B is formed on the metal layer level of the MLI. In other embodiments, the width may vary differently between the first and second portions 706A, 706B. For example, the width of 706B may be less than the width of 706A.

The first feature 704 and the second feature 706 of the MLI may be comprised of a metal or conductive material. The first feature 704 and/or the second feature 706 may be a multi-layer structure, for example including liner layers and/or metallization layers as discussed above with reference to conductive layers 208A, 208B, and the enclosure structure 212 of FIG. 2A. Example conductive materials may include titanium nitride (TiN), titanium (Ti), ruthenium (Ru), nickel (Ni), cobalt (Co), copper (Cu), molybdenum (Mo), tungsten (W), tantalum (Ta), tantalum nitride (TaN), iridium (Ir), rhenium (Re), aluminum (Al), silver (Ag), and/or other suitable materials.

The method 300 then proceeds to block 314 where it is determined if there are additional layers of the MLI to be formed in the BEOL processes to fabricate the target semiconductor device. The MLI may include a plurality of layers or levels including, for example, a dozen or more conductive layers or levels providing horizontal routing (metal lines, M1, M2, M3 and so forth). If additional layers are to be formed, the method 300 returns to block 310 where a dielectric layer is again deposited (and in some implementations, planarized), and then the method 300 proceeds again to block 312 where another metallization layer (e.g., via and/or metal line) is fabricated in the dielectric layer. The additional layers include the routing portion coupled to the device 204 (e.g., vias and metal lines) and a corresponding portion or layer of the enclosure structure. These steps continue until a top metallization layer is formed.

Figure 8:
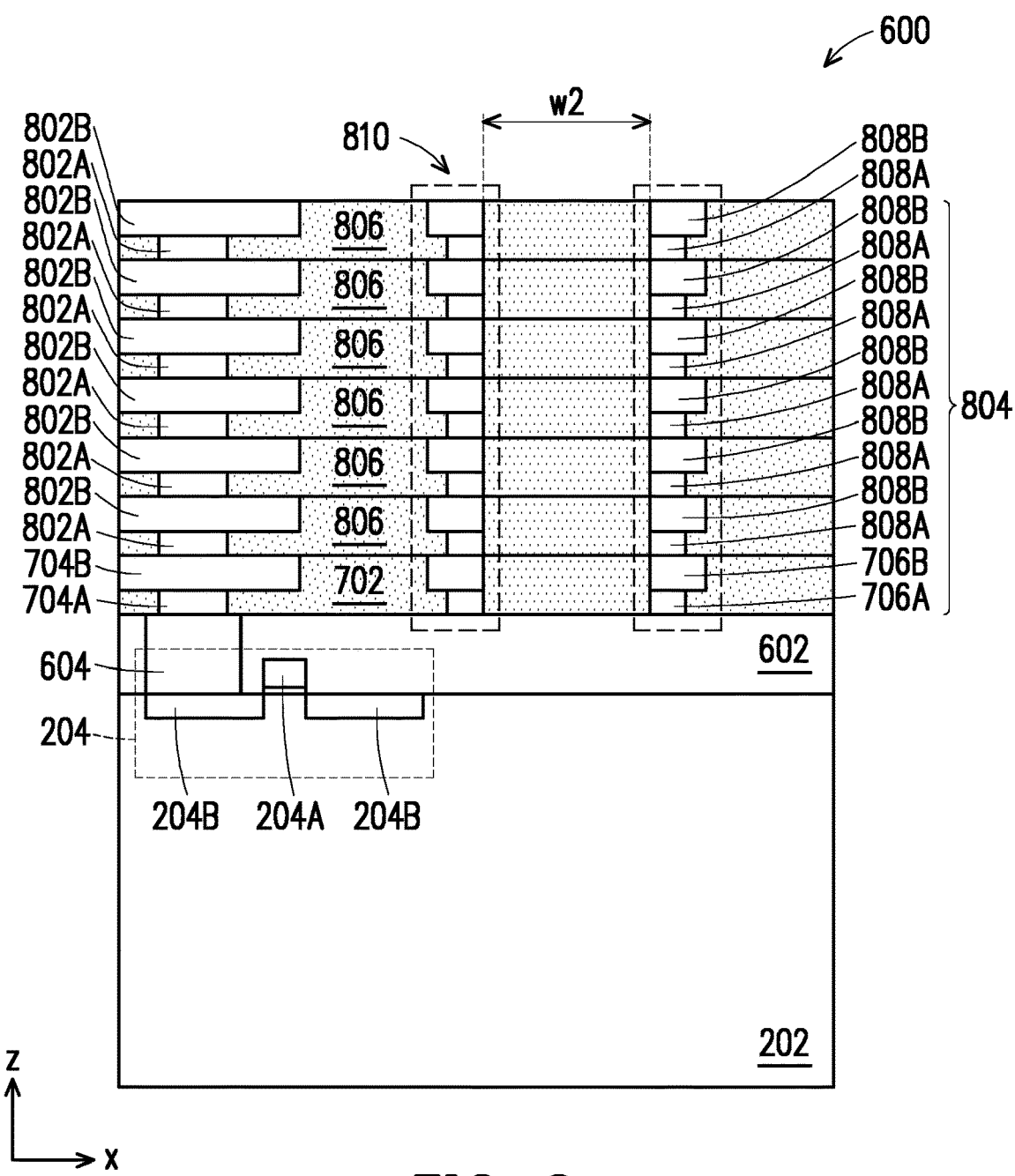
Figure 9:
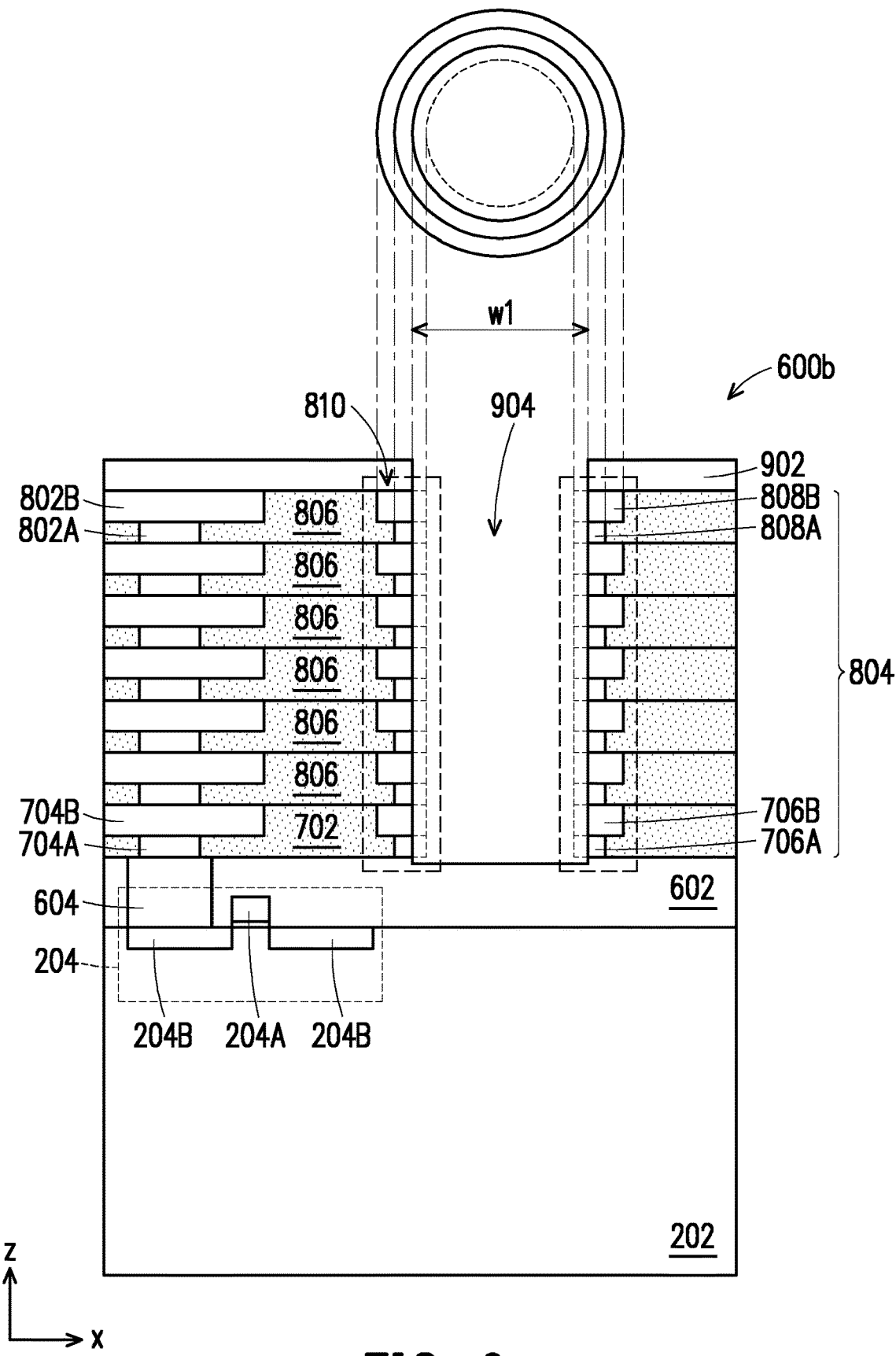
FIGS. 9-14 are fragmentary diagrammatic views of an integrated circuit device, in portion or entirety, at various fabrication stages associated with forming a TSV in an enclosure structure according to various aspects of the present disclosure corresponding to the method of FIG. 4.
Figure 10:
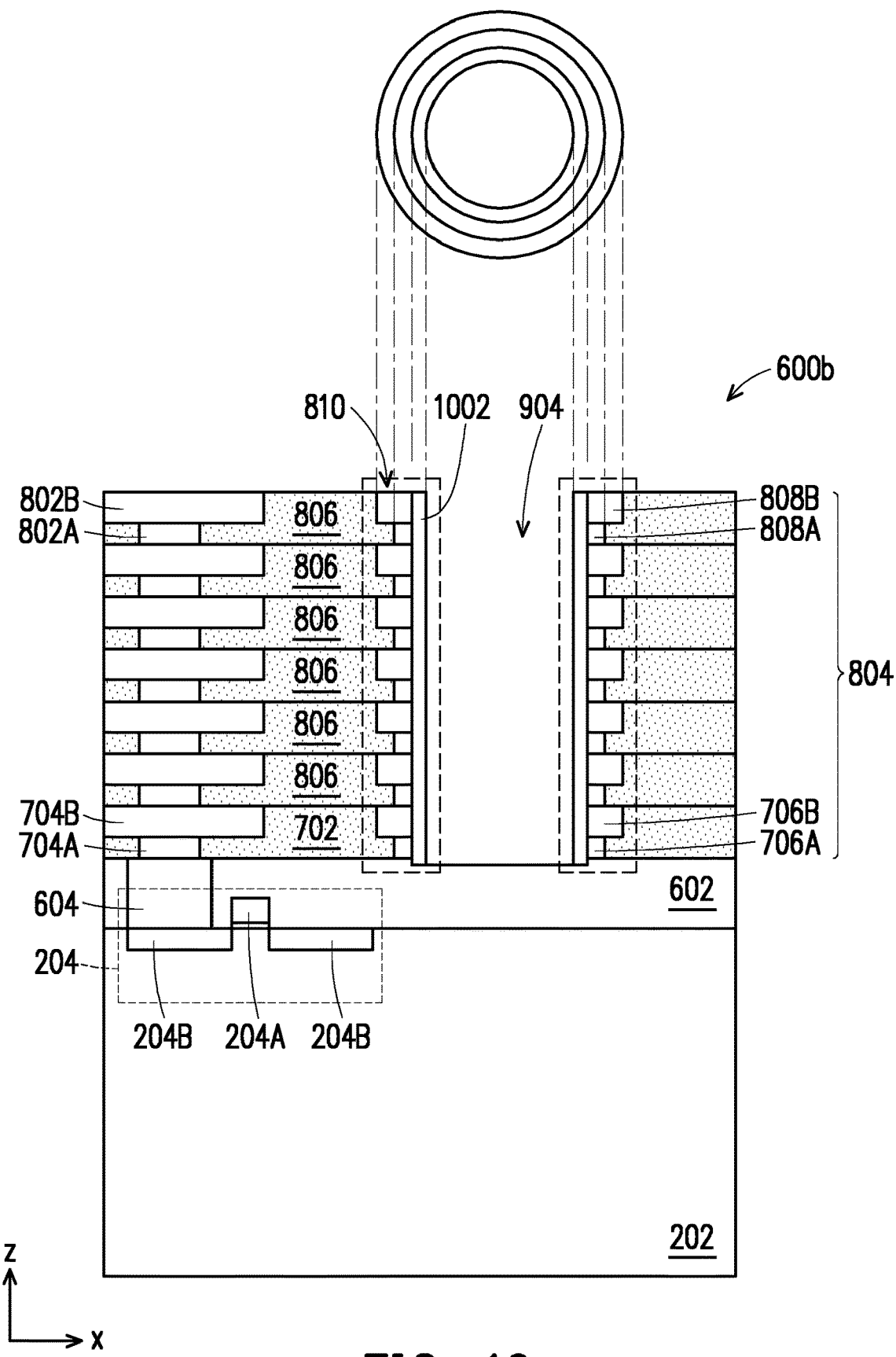

Referring to the example of FIG. 8, the blocks 310 and 312 are repeated to form a plurality of metallization layers and interposing vias, with a corresponding portion of the enclosure structure on each level that provides via and metal lines of the MLI. FIG. 8 illustrates an MLI structure 804 that includes a path providing electrical single to the device 204 that comprises the first via 704A, the first metal line 704B, and subsequent vias 802A and subsequent metal lines 802B. The vias 802A and metal lines 802B are formed within dielectric layers 806. The dielectric layers 806 may be substantially similar to the layer 702. The vias 802A and the metal lines 802B may be substantially similar to the first via 704A and the first metal line 704B respectively. While the device of FIG. 8 illustrates six (6) additional metallization layers in addition to the first via/line 704A/704B to form an MLI of seven (7) metallization layers (with seven interposing vias), this is exemplary only and any number of layers may be fabricated.

Figure 35:
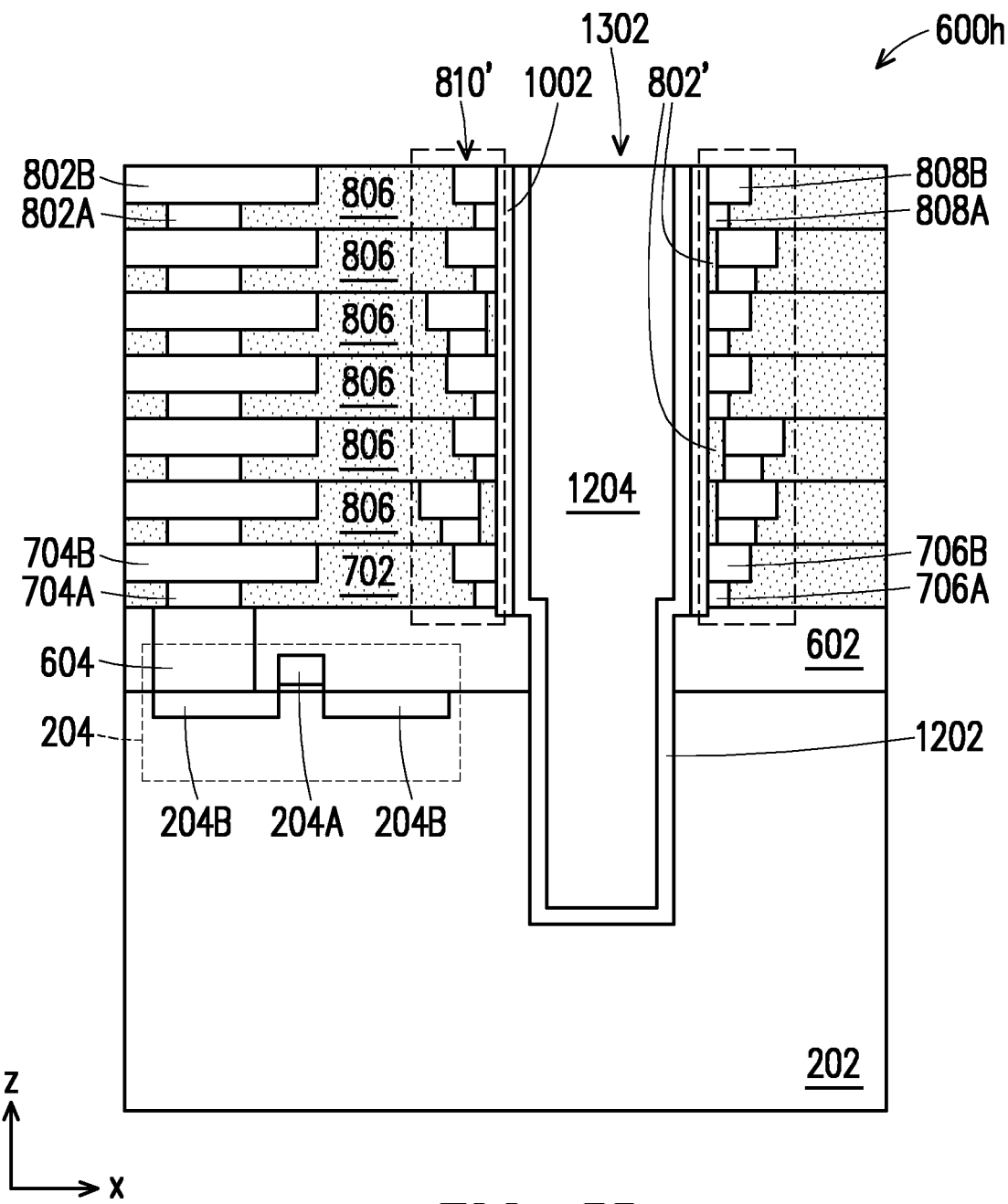
FIG. 35 is fragmentary diagrammatic views of an integrated circuit device, in portion or entirety, having a TSV or BTSV according to one or more aspects of the present disclosure.

For each layer of the MLI structure 804 providing a conductive via 802A or conductive line 802B, coplanar to the respective via 802A or the metal line 802B is a portion of the enclosure structure annotated as portion or layer 808A corresponding to the level of vias 802A and the portion or layer 808B corresponding to the level of metal lines 802B. In some embodiments each of the portions 808A and 808B are substantially similar to the portions 706A and 706B respectively. For example, the top view illustrated in FIG. 7 may similarly apply to each of the portions 808A and 808B. In other embodiments, the portions 808A and 808B may differ in configuration. However, in embodiments, together the portions 706A, 706B, 808A, 808B form an enclosure structure 810 of contiguous conductive material that surrounds a center region of dielectric 806, 702 within which a via (e.g., TSV) may be formed. The enclosure structure 810 may also be referred to as a ring or sleeve. In some implementations, the portions 706A, 706B, 808A, 808B of the enclosure structure may be aligned with one another, while in other implementations the portions 706A, 706B, 808A, 808B may be vertically offset as illustrated in FIG. 35. It is noted however, in implementations that a contiguous, metal-comprising enclosure structure 810 is provided that contiguously extends vertically and within a ring-shape around a portion of the dielectric layer 806.

Figure 6:
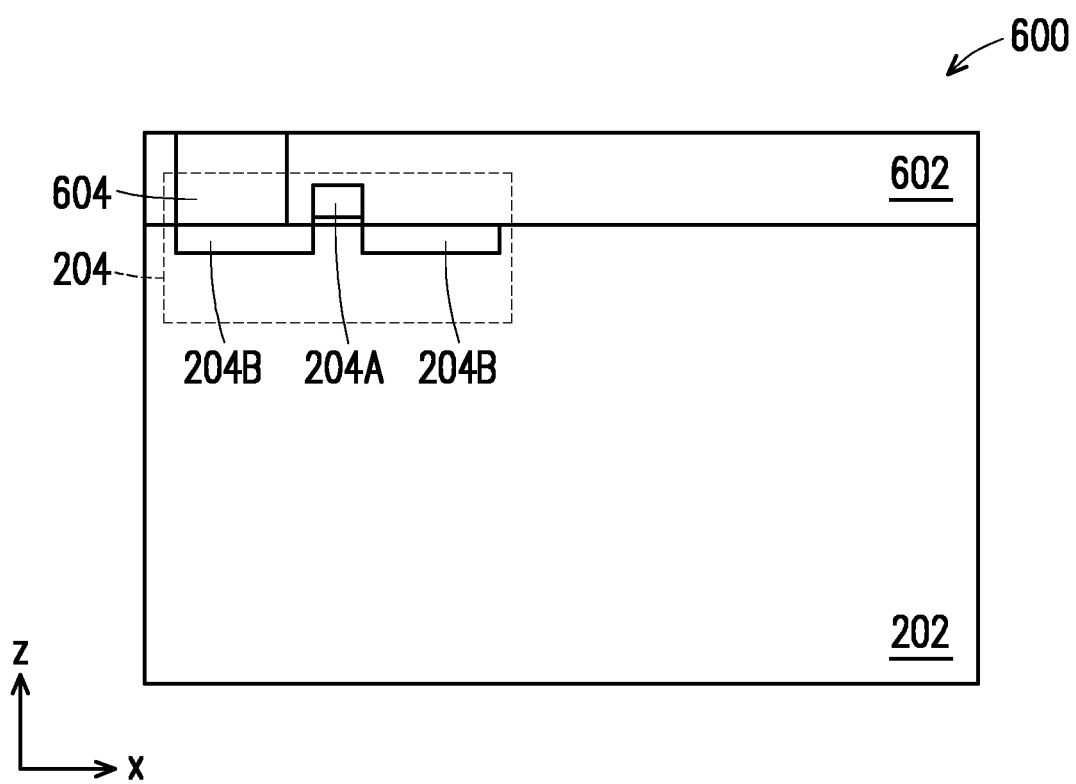
FIGS. 6-8 are fragmentary diagrammatic views of an integrated circuit device, in portion or entirety, at various fabrication stages associated with forming a MLI including an enclosure structure according to various aspects of the present disclosure corresponding to the method of FIG. 3.

The method 300 illustrated in FIG. 3 and exemplified by the device 600 of FIGS. 6, 7, and 8 may be used in different embodiments of forming a via through the enclosure structure formed by the method 300. In particular, the formation of the TSV within the enclosure structure 810 may be implemented in various ways. Some of these embodiments are discussed below.

Figure 4:
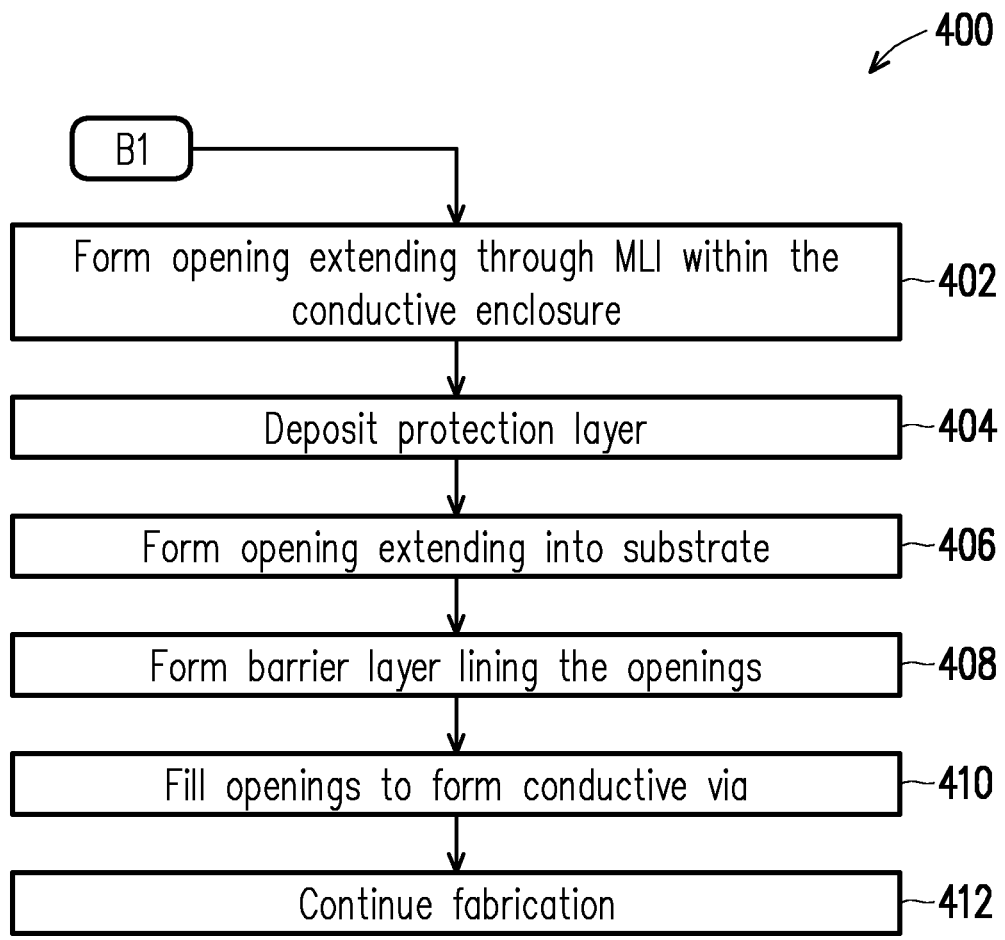
FIG. 4 is a flow chart illustrating steps of an embodiment of a method of fabricating a though silicon via (TSV) in an enclosure structure according to various aspects of the present disclosure continuing from the method of FIG. 3

Turning to FIG. 4, illustrated is a method 400 which may continue from the method 300 of FIG. 3 (e.g. from B to B1) in some embodiments of forming a TSV within the enclosure structure provided by the method 300. An embodiment of the method 400 is illustrated by the example of a device 600b in FIGS. 9-14. The device 600b is an embodiment of the device 600 having a TSV.

Block 402 of the method 400 provides an opening extending through the dielectric layers of the MLI in the region within the enclosure structure. Referring to the example of FIG. 9, an opening 904 is formed within the enclosure structure 810.

To form the opening 904, a masking layer 902 is formed over the substrate 202 and the MLI 804. The masking layer 902 may be patterned using photolithography techniques discussed above to define an opening of the masking layer. The masking layer 902 may be a suitable material such as photoresist, hard mask (e.g., SiN, SiON) and/or other materials. In an embodiment, the masking element 902 has an opening having a width w1 which is greater than a width w2 of the enclosure structure 810 provided by 706A, 706B, 808A, 808B (see annotation in FIG. 8).

Using the masking layer 902 as a masking element during the etching, an opening 904 is etched in the dielectric layers 806, 702 within the enclosure structure 810. The opening 904 extends to a top surface of the first dielectric layer 602. In an embodiment, an end portion of one or more of the features 706A, 706B, 808A, 808B is etched. The amount of lateral etchback of features 706A, 706B, 808A, 808B is dependent upon the width of the opening of the masking element 902. In particular, the amount of decrease in the features 706A, 706B, 808A, 808B may be due to the width w1 of the masking element 902 opening being greater than the width w2 between opposing portions of the enclosure structure 810 provided by 706A, 706B, 808A, 808B. The decrease in width of one of more of 706A, 706B, 808A, 808B may provide a widening of opening 904 that allows for improved gap fill. However, sufficient width of 706A, 706B, 808A, 808B should be maintained to protect the dielectric layers 806, 702 from the etching process. In an embodiment, the opening 904 is defined by conductive sidewalls of 706A, 706B, 808A, 808B.

The etching process forming the opening 904 may include dry etch such as a reactive ion etch or other plasma assisted etching process, a wet etch, or other suitable etching process or processes. In some embodiments, the first dielectric layer 602 includes a composition providing for etch selectivity to the dielectric layers 702, 806, and thus provides an etch stop to the process. During the etching of the opening 904, it is noted that a remaining portion of the dielectric layers 806 and/or 702, including that portion adjacent the vias 704A, 802A and metal lines 704B, 802B, are substantially protected from etchants by the enclosure structure 810 provided by metal-containing features 706A, 706B, 808A, 808B. In some implementations, the etching stops at the dielectric layer 602 which may advantageously avoid exposure of the substrate 202 during the etching of the opening 904, avoiding contaminates generated including by the etching of the metal-containing material of 706A, 706B, 808A, 808B.

As illustrated previously discussed with respect to FIGS. 2B, 2C, 2D, 2E, and 2F, the opening 904 can but need not be a circular shape and can, but need not be, centered within the enclosure structure 810. As further illustrated in FIG. 2F, in some implementations, the etching may leave a residual amount of dielectric 806 within the opening 904. After forming the opening 904, the masking element 902 may be removed (e.g., stripped) from the substrate 202.

The method 400 then proceeds to block 404 where a protection layer is formed on the sidewalls of the opening provided in block 402. Referring to the example of FIG. 10, a protection layer 1002 is formed on the sidewalls of opening 904. In some implementations, the protection layer 1002 is formed directly interfacing features 706A, 706B, 808A, 808B. Thus, in some implementations, the protection layer 1002 covers the exposed sidewalls of metal-containing material of features 706A, 706B, 808A, 808B.

The protection layer 1002 may include an oxide, such as silicon oxide; a nitride such as silicon nitride; an oxynitride such as silicon oxynitride; combinations thereof; and/or other suitable materials. The protection layer 1002 may be a different composition than that of the dielectric layer 806 and 702. The protection layer 1002 may be deposited by a deposition process (such as CVD, PVD, ALD, HDPCVD, MOCVD, RPCVD, PECVD, LPCVD, ALCVD, APCVD, other suitable methods, or combinations thereof). In an embodiment, the protection layer 1002 is formed by depositing dielectric material by CVD process or processes and performing an etching (e.g., dry etching process) to remove the dielectric layer such that it remains only the sidewalls of the opening 904. The protection layer 1002 in some implementations serves to protect the enclosure structure 810 provided by 706A, 706B, 808A, 808B from generating metallic contamination and/or diffusion during subsequent processes (e.g., etching of dielectric layer 602 and/or the substrate 202). In some implementations, the thickness of the protection layer 1002 may be between approximately 30 Å and approximately 3000 Å. In an embodiment, a thickness of the protection layer 1002 may be substantially equal to an amount of lateral etchback of the features 706A, 706B, 808A, 808B discussed above.

The method 400 then proceeds to block 406 where the opening through the dielectric layer(s) of the MLI is extended into the substrate. Referring to the example of FIG. 11, a masking layer 1102 is formed over the sidewalls of the opening 904 illustrated in FIG. 10, for example, on the sidewalls of the protection layer 1002. The masking layer 1102 may be formed to a first thickness t1. In some implementations, the thickness t1 and the protection layer 1002 thickness in sum provide for a difference in width of an upper portion of the via and a lower portion of the via as discussed below.

Figure 11:
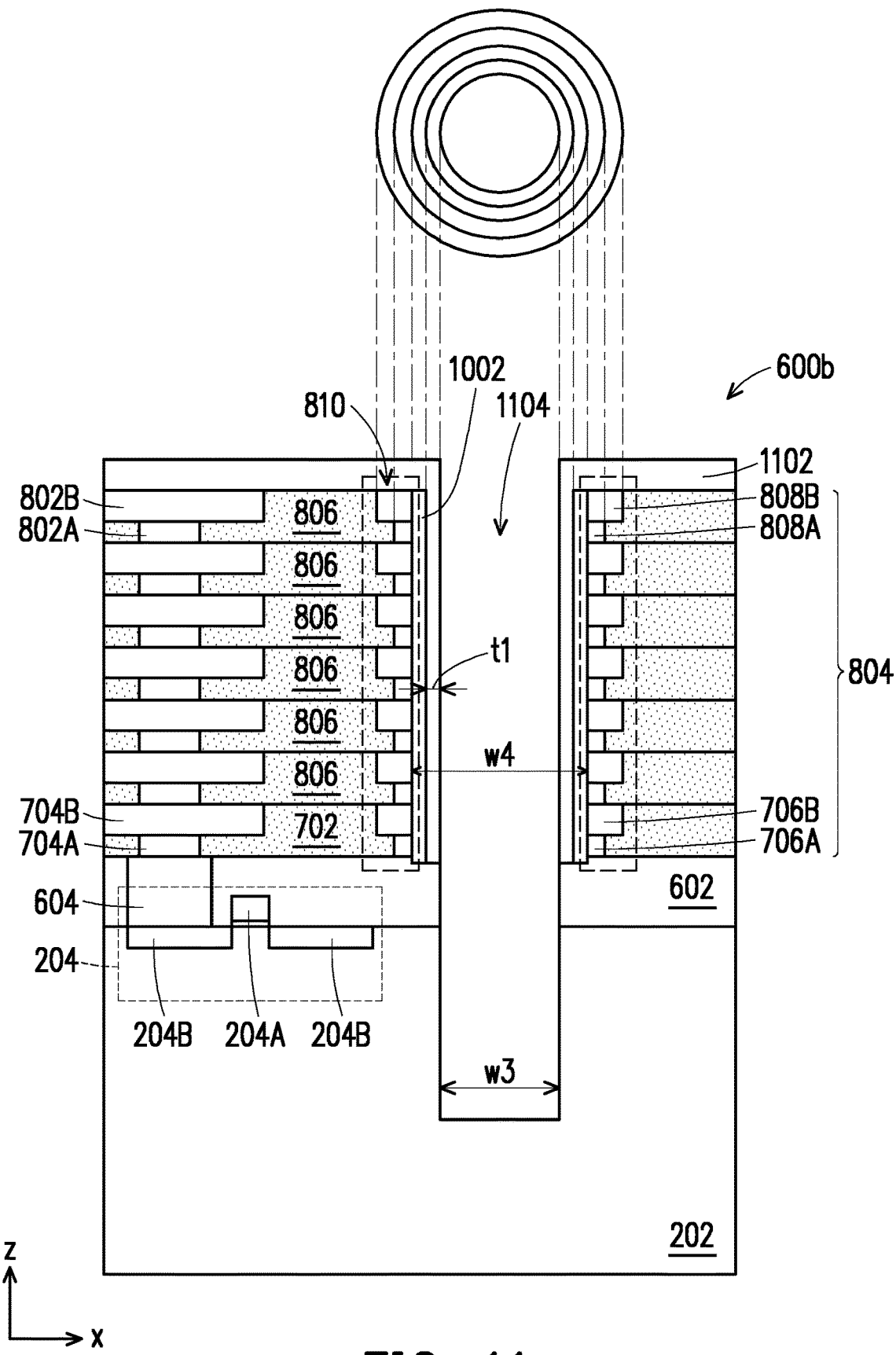
Figure 12:
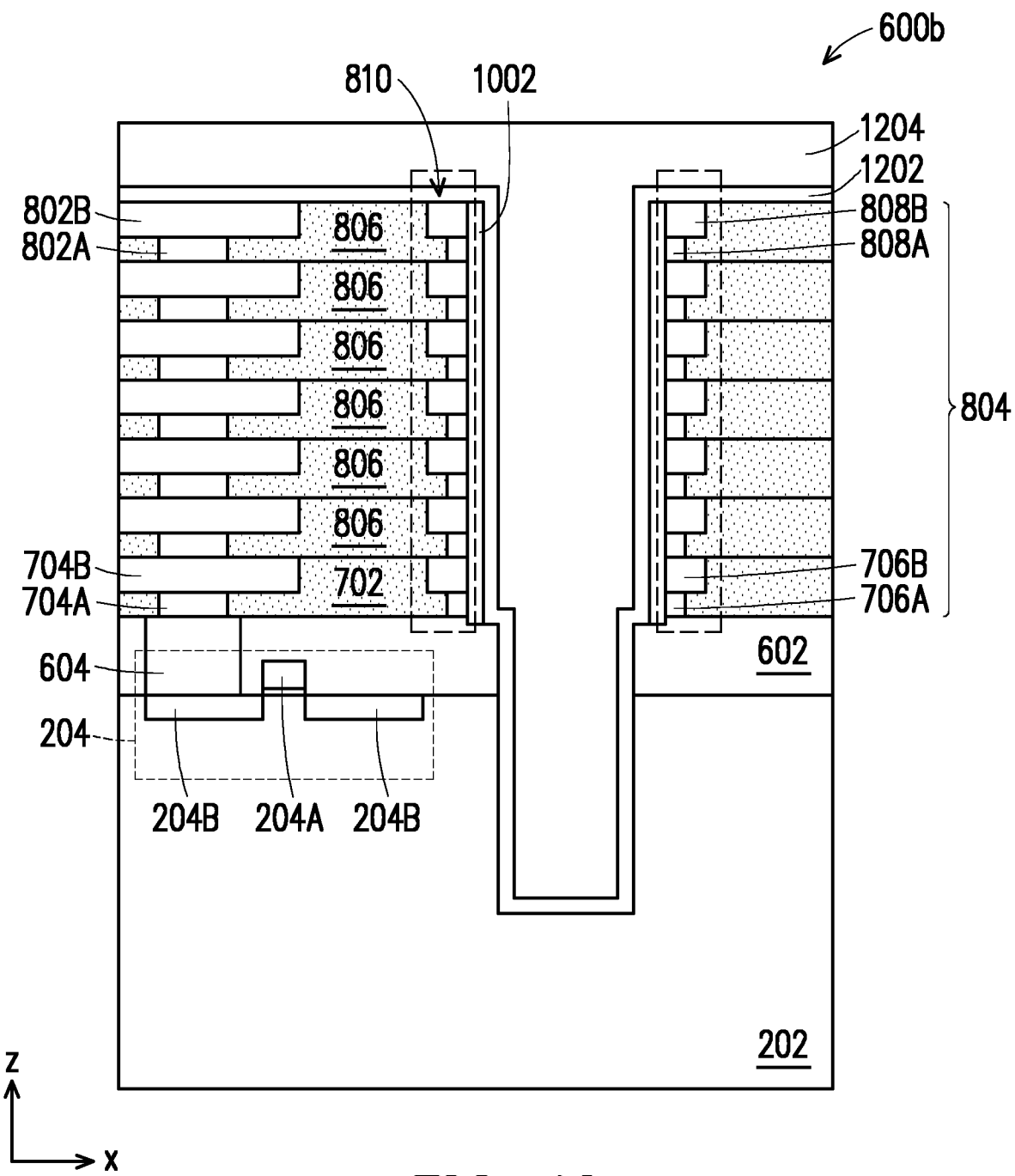

An etching process may extend the opening (previously opening 904) through the dielectric layer 602 and into at least a portion of the substrate 202 forming an extended opening 1104. The etching of the dielectric layer 602 and the substrate 202 may be performed in the same or different etching steps. As illustrated in FIG. 11, an opening 1104 is formed that extends into the substrate 202. The etching process forming the opening 1104 may include dry etch such as a reactive ion etch or other plasma assisted etching process, a wet etch, or other suitable etching processes. After etching the opening 1104, the masking layer 1102 may be removed (e.g., stripped).

After removal of the masking layer 1102, the opening 1104 has a first width w3 at a lower portion within the substrate 202 and/or within the dielectric layer 602. The opening 1102 has a second width w4 at an upper portion within the dielectric layers 806 of the MLI 804. The second width w4 is greater than the first width w3. In some implementations, the first width w3 is between approximately 0 and 40% less than the width w4.

The method 400 then proceeds to block 408 where a barrier layer is formed lining the opening. Exemplary compositions include, but are not limited to, metal nitrides such as TaN, TiN, WN, TbN, VN, ZrN, CrN, WC, WN, WCN, NbN, AlN, or combinations thereof. In some implementations, the barrier layer may be omitted. In some implementations, other dielectric materials may be provided. Referring to the example of FIG. 12, a barrier layer 1202 is formed on the sidewalls of the opening 1104 of FIG. 11. In some implementations, the barrier layer 1202 has a thickness of between approximately 30 Å and approximately 3000 Å.

The method 400 then proceeds to block 410 where a conductive fill metal is provided in the opening to form the conductive via. Referring to the example of FIG. 12, a conductive fill metal 1204 is formed in the opening 1104 (FIG. 11) and over the barrier layer 1202 (if provided). In an embodiment, the conductive fill metal 1204 is copper. However, other conductive materials may also be possible such as Ta, Ti, Al, Cu alloys, Co, TaN, TiN, TaN, W, Zr, and/or other suitable conductive materials. After deposition of the conductive fill metal, a planarization process (e.g., CMP) may be performed providing, as illustrated in FIG. 13, a planar top surface removing the excess material from the top of the dielectric layer 806.

Figure 13:
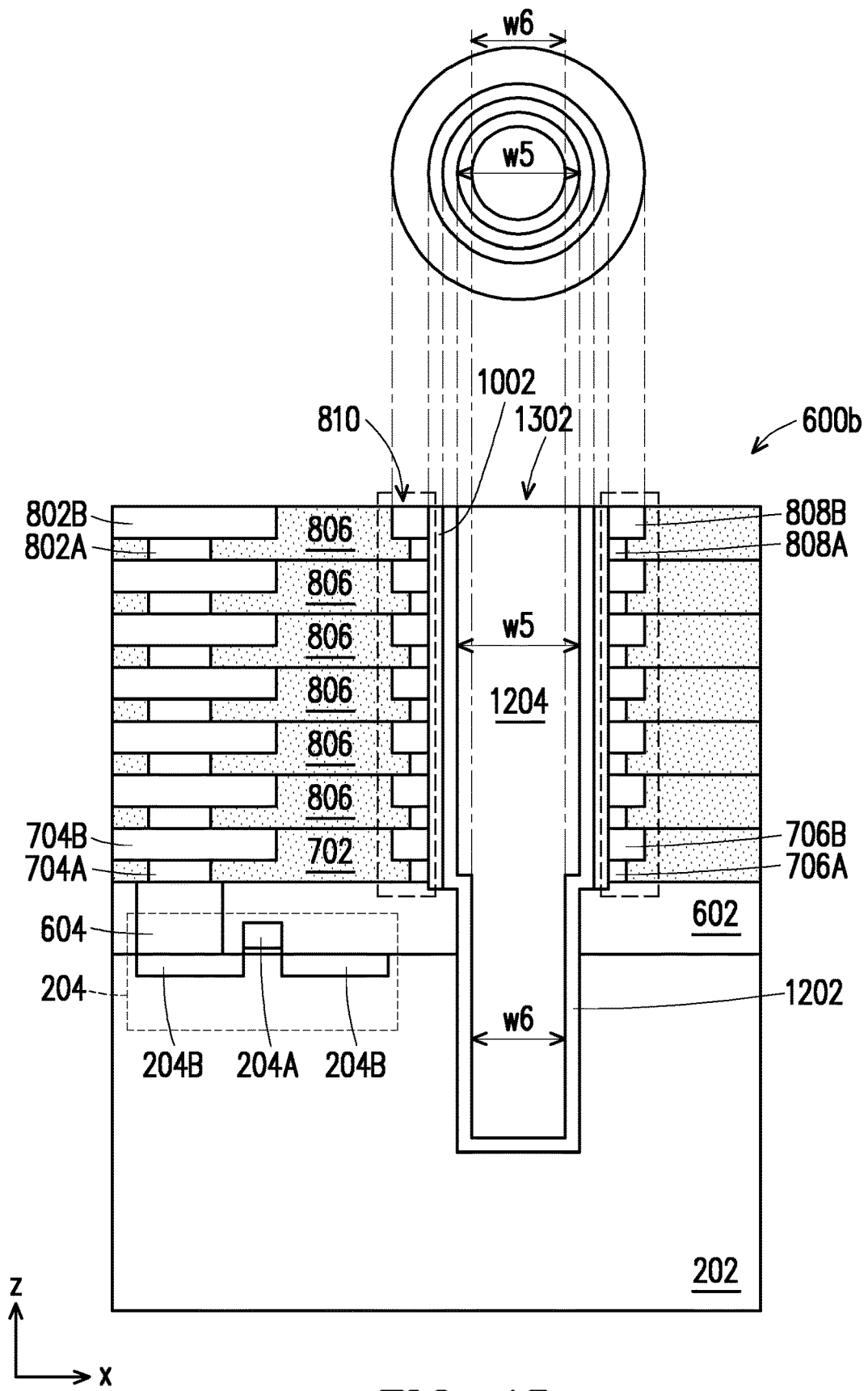

As illustrated in FIG. 13, a conductive via 1302 is formed including the conductive fill metal 1204. The width w5 of an upper portion of the conductive via 1302 is greater than the width w6 of a lower portion of the conductive via 1302. In some implementations, the width w6 is 0 to 40% less than w5. The width w6 may be adjusted depending on the thickness of the protection layer 1002. The difference in width w5 and w6 may allow for tuning the ease of gap filling the conductive material 1204.

Figure 14:
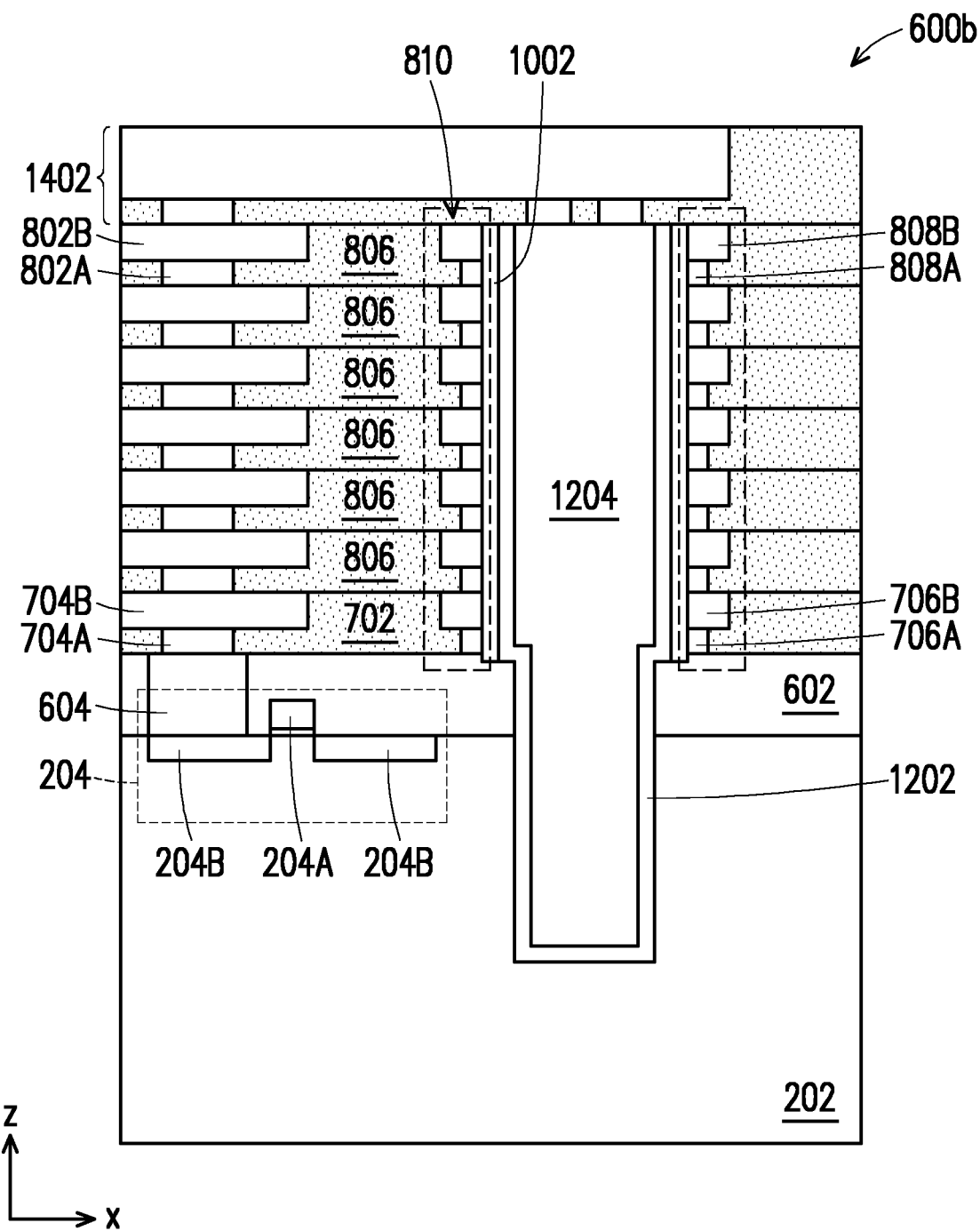
Figure 15:
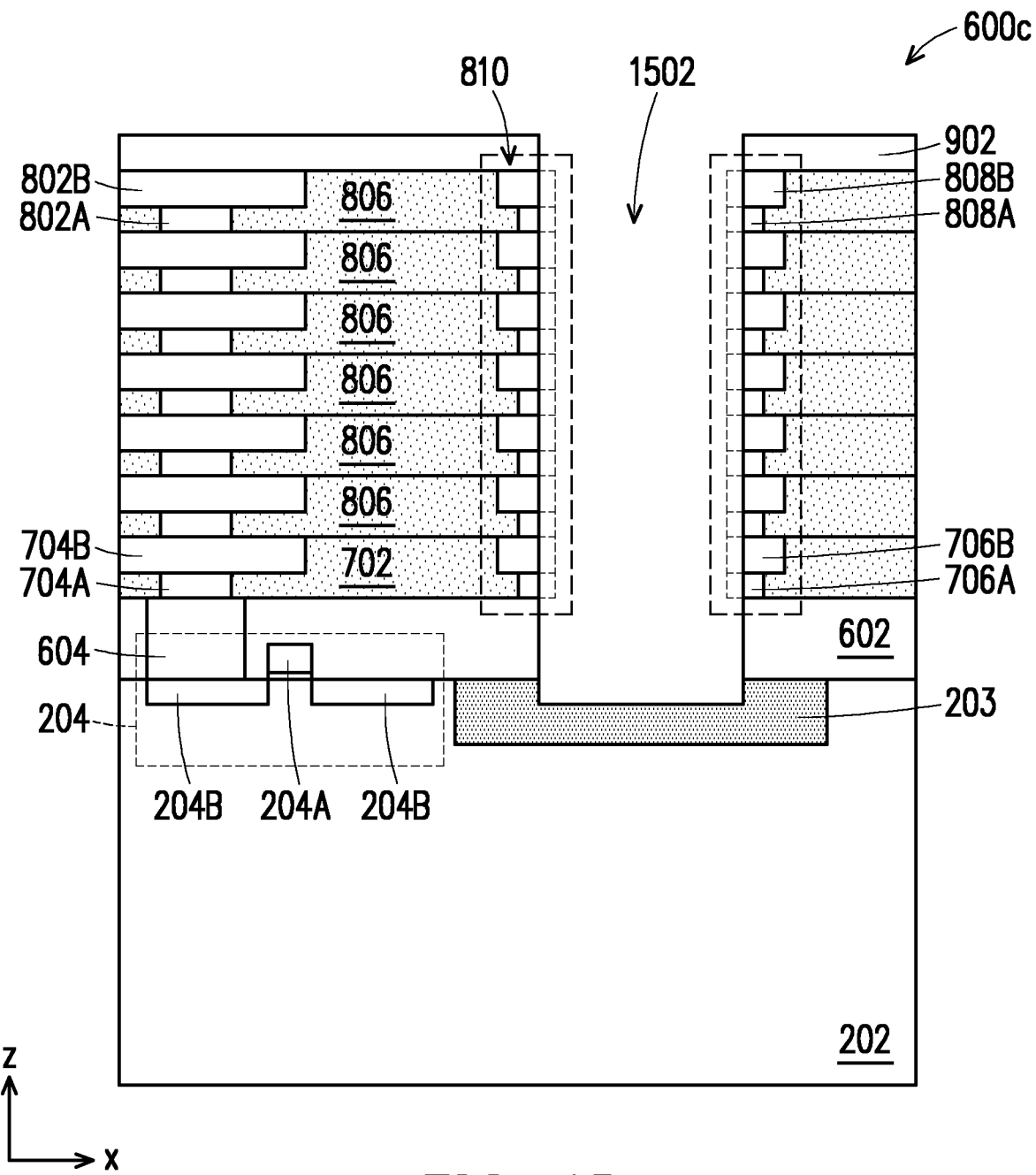
FIGS. 15-18 are fragmentary diagrammatic views of an integrated circuit device, in portion or entirety, at various fabrication stages associated with forming another TSV in an enclosure structure according to various aspects of the present disclosure corresponding to the method of FIG. 4.
Figure 16:
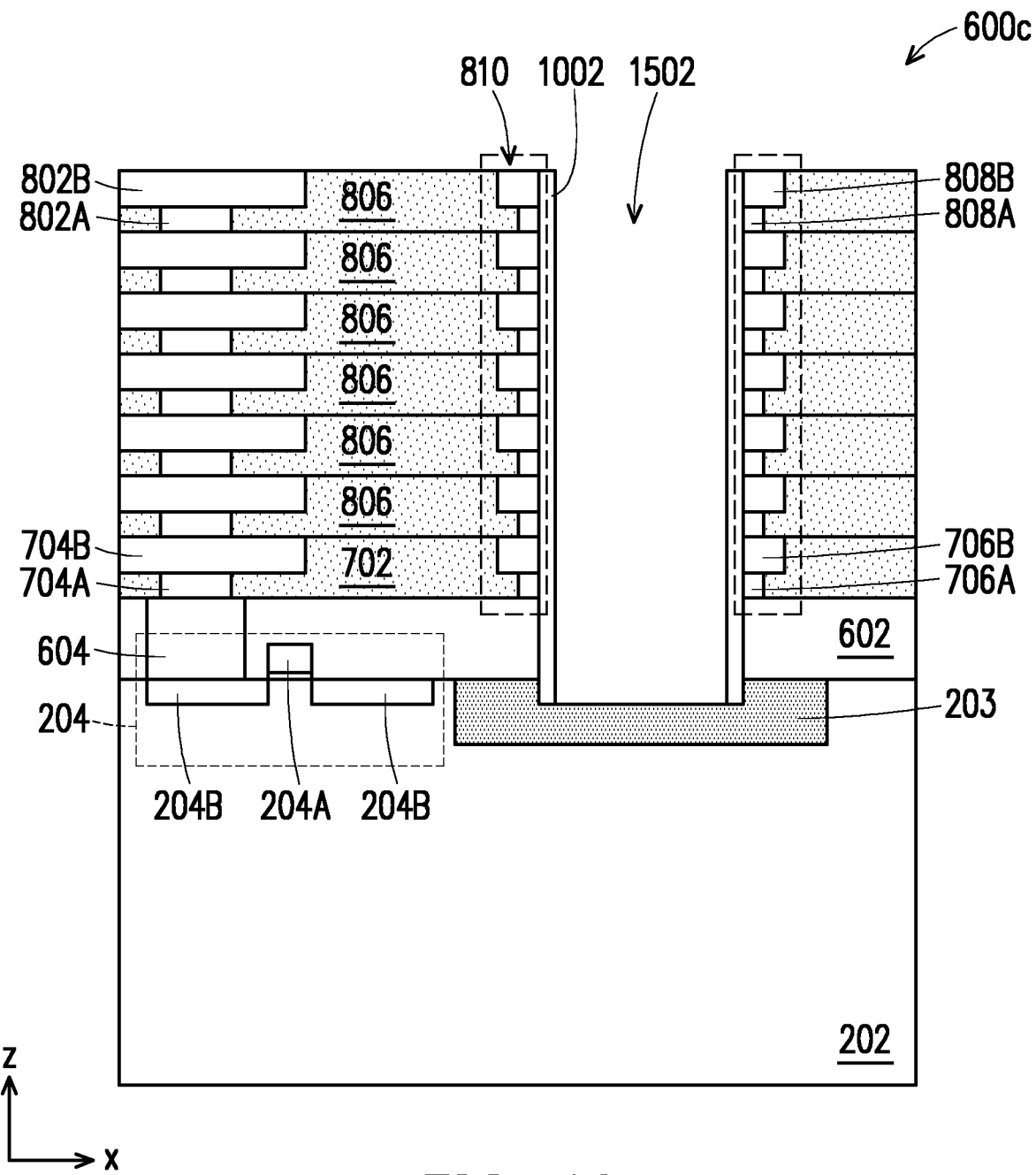
Figure 17:
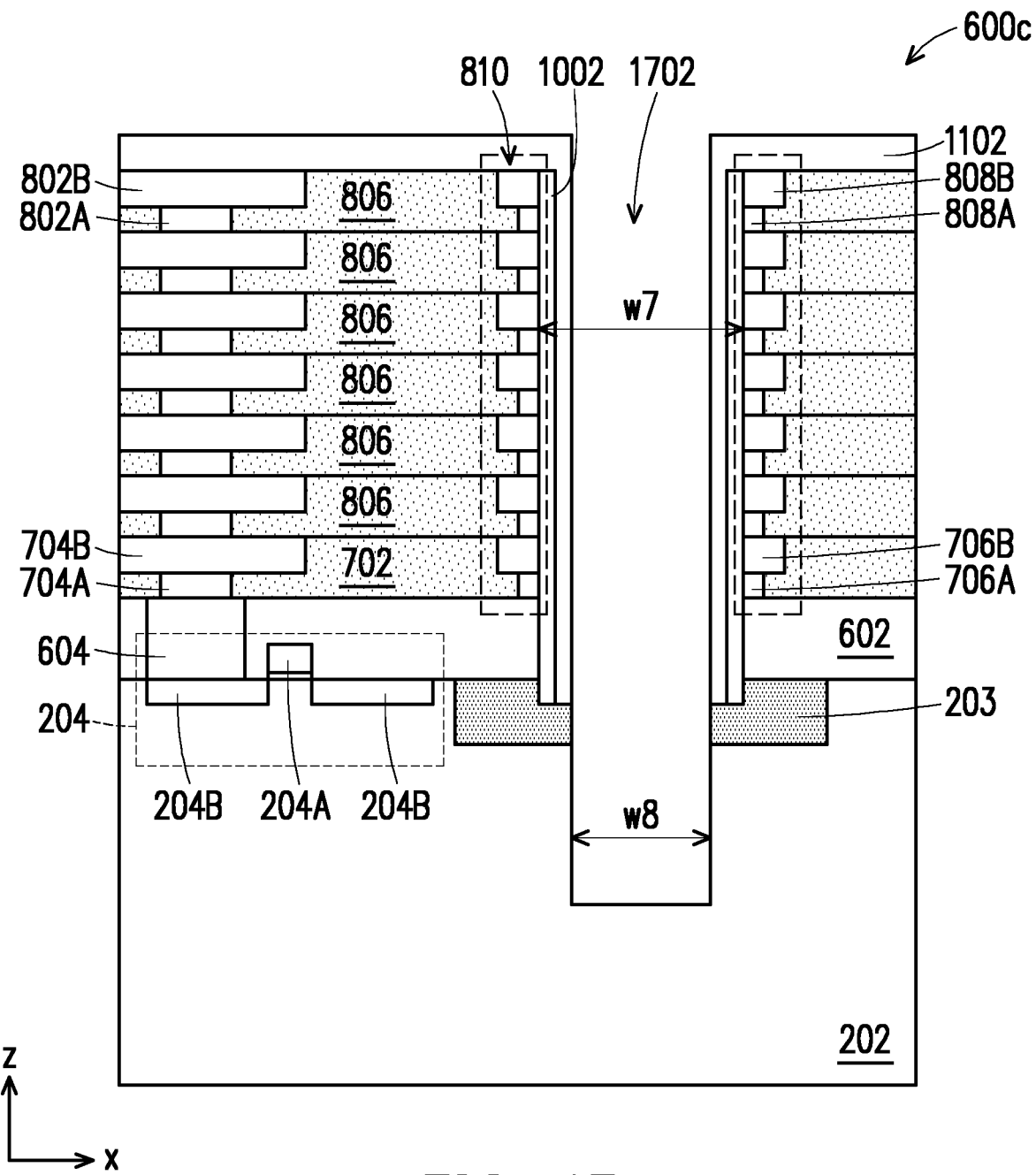

The method 400 may then proceed to block 412 where fabrication may continue to further steps. In some implementations, as illustrated in FIG. 14, an interconnect structure 1402 (e.g., metal lines and vias having surrounding dielectric) may be formed on a front surface of the device connecting to a top of the via 1302. In some implementations, the substrate 202 may be thinned (e.g., from the backside of substrate 202) to expose a bottom portion of the via 1302. Subsequent processing may include providing interconnect structure formed on the back side of the device connecting to a bottom of the via 1302. In some implementations, one or more of interconnect structures on the top or bottom of the device may connect to or be provided on another device.

Thus, the method 400 as illustrated by device 600*b* of FIGS. 9-14 provides an example of providing a conductive via 1302 that extends from a top surface of an MLI 804 formed over a semiconductor substrate 202 to a backside of the substrate 202. The conductive vias 1302 may be referred to as a TSV 1302. The TSV 1302 is provided within the enclosure structure 810 provided by 706A, 706B, 808A, 808B, such that the enclosure structure completely surrounds or encases the portion of the TSV 1302 that extends through dielectric layers 806. The enclosure structure 810 encloses the upper portion of the TSV 1302 that has an increased width (e.g., w5). In some implementations, the dielectric layer 806 is an extreme low-k material, and the enclosure structure 810 provides protection of the extreme low-k material from an etching process used to form the opening (e.g., within the dielectric material) within which the TSV 1302 is formed. In an embodiment, the enclosure structure 810 is not provided on a second portion of the TSV (e.g., width w6) that is surrounded by dielectric layer 602 and/or the substrate 202.

Continuing with examples of the method 400 of FIG. 4, illustrated in FIGS. is another embodiment of the method 400 which may continue from the method 300 of FIG. 3 (e.g. from B to B1) to include forming a TSV within the enclosure structure. The embodiment of device 600*c* illustrated in FIGS. 15-18 shares many similarities with the device 600*b* discussed above, but includes an illustration of the substrate 202 having an isolation feature such as isolation feature 203 within the region where a TSV is formed.

In block 402 of the embodiment of the method 400, an opening extending through the dielectric layers of the MLI in a region within the enclosure structure is provided. However, due to the isolation feature 204 underlying the enclosure structure, the etching may continue without risk of introducing contaminates into the substrate. Referring to the example of FIG. 15, an etching process forms opening 1502 within the enclosure structure 810 provided by 706A, 706B, 808A, 808B, where the opening is defined by the masking layer 902 as discussed above. The etching process forming the opening 1502 may include one or more dry etch processes such as a reactive ion etch or other plasma assisted etching process, a wet etch, or other suitable etching processes. In some embodiments, the material of the isolation feature 203 includes a composition providing for etch selectivity to the dielectric layers 602, 702, and/or 806 and provides an etch stop. In a further implementation, an over etch is performed such that a portion of the isolation feature 203 is etched. During the etching of the opening 1502, it is noted that, as described in the embodiment of device 600*b*, regions of the dielectric layers 806 and/or 702 outside of the enclosure structure 810 are substantially protected from the etchants and/or contaminates by the enclosure structure 810. As discussed above, end portions of 706A, 706B, 808A, 808B may be etched along with the dielectric layer 806, 702 within the enclosure structure 810.

The method 400 then proceeds to block 404 where a protection layer is formed on the sidewalls of the opening provided in block 402. Referring to the example of FIG. 16, a protection layer 1002 is formed on the sidewalls of opening 1502. In some implementations, the protection layer 1002 is formed directly interfacing features 706A, 706B, 808A, 808B; directly interfacing the dielectric layer 602; and/or directly interfacing the isolation feature 203. The protection layer 1002 may be substantially similar to as discussed above including, for example, in some implementations, the thickness of the protection layer 1002 may be between approximately 30 Å and approximately 3000 Å.

The method 400 then proceeds to block 406 where the first opening (e.g., the opening extending through the dielectric layer(s) of the MLI as described in block 402) is extended into the substrate. Referring to the example of FIG. 17, a masking layer 1102 is formed over the sidewalls of the openings 1502 illustrated in FIG. 16 including on the sidewalls of the protection layer 1002. The masking layer 1102 may be substantially similar to as discussed above with reference to the example of FIG. 11.

An etching process may extend the opening (previously opening 1502) through the isolation feature 203 and into at least a portion of the substrate 202 forming an extended opening 1702. The etching of a lower portion of the isolation feature 203 and the substrate 202 may be performed in the same or different etching steps. The etching process forming the opening 1702 may include dry etch such as a reactive ion etch or other plasma assisted etching process, a wet etch, or other suitable etching processes. After etching the opening 1702, the masking layer 1102 may be removed (e.g., stripped).

The opening 1702 has a first width w8 within the substrate 202 and/or within the lower portion of the isolation structure 203. The opening 1702 has a second width w7 within the dielectric layers 806 of the MLI 804, within the dielectric layer 602, and/or within an upper portion (e.g., over etch region) of the isolation structure 204. The width w8 is less than the width w7. In some implementations, w8 may be less than the w7 by 0 to 40%.

Figure 18:
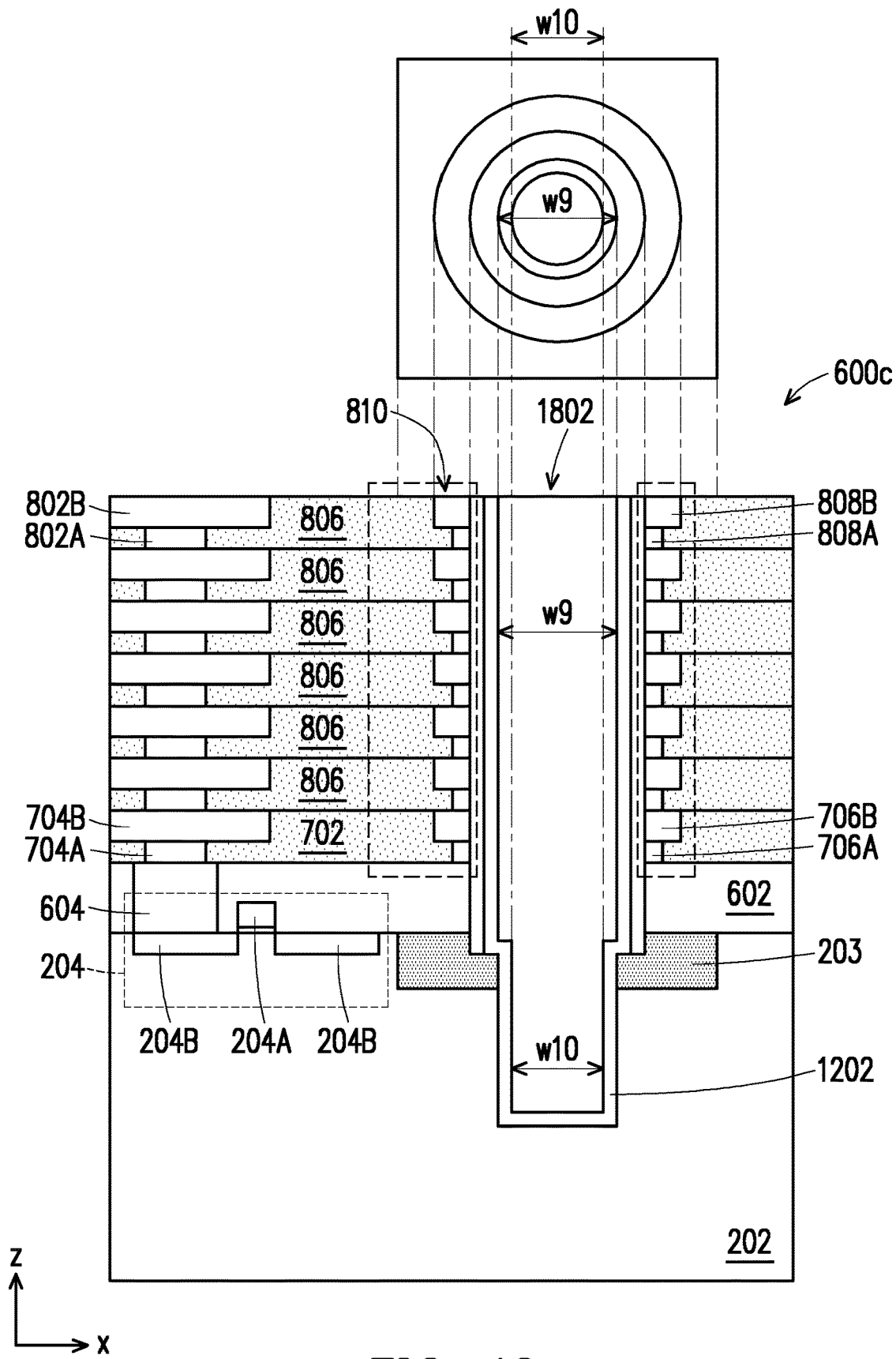

The method 400 then proceeds to blocks 408 and 410 where a barrier layer and a conductive fill are formed in the opening, substantially similar to as discussed above with reference to device 600*b*. Referring to the example of FIG. 18, the barrier layer 1202 and the metal fill 1204 are formed in the opening 1702. As illustrated in FIG. 18, a conductive via 1802 is formed including the conductive fill metal 1204. The width w9 of an upper portion of the conductive via 1802 is greater than the width w10 of a lower portion of the conductive via 1802. In some implementations, the width w10 is 0 to 40% less than w9. The width w10 may be adjusted depending on the thickness of the protection layer 1002. The difference in width w10 and w9 may allow for tuning the gap filling ability when forming the conductive fill 1204.

Thus, the method 400 as illustrated by device 600*c* of FIGS. 15-18 provides for a conductive via 1802 that extends from a top surface of an MLI 804 formed over a semiconductor substrate 202 to a backside of the substrate 202. Thus, the conductive vias 1802 may be referred to as a TSV 1802. The TSV 1802 is provided within the enclosure structure 810 provided by 706A, 706B, 808A, 808B, such that the enclosure structure 810 completely surrounds or encases the portion of the TSV 1802 that extends through dielectric layers 806. The enclosure structure 810 provided by 706A, 706B, 808A, 808B encloses a portion of the TSV 1802 that has an increased width (e.g., w9). In some implementations, the dielectric layer 806 is an extreme low-k material, the enclosure structure 810 provides protection of the extreme low-k material outside of the enclosure structure 810 from an etching process used to form the opening for the TSV 1802. In contrast, the enclosure structure 810 is not provided on a second portion of the TSV that is surrounded by dielectric layer 602, the isolation structure 203, and/or the substrate 202.

Figure 5:
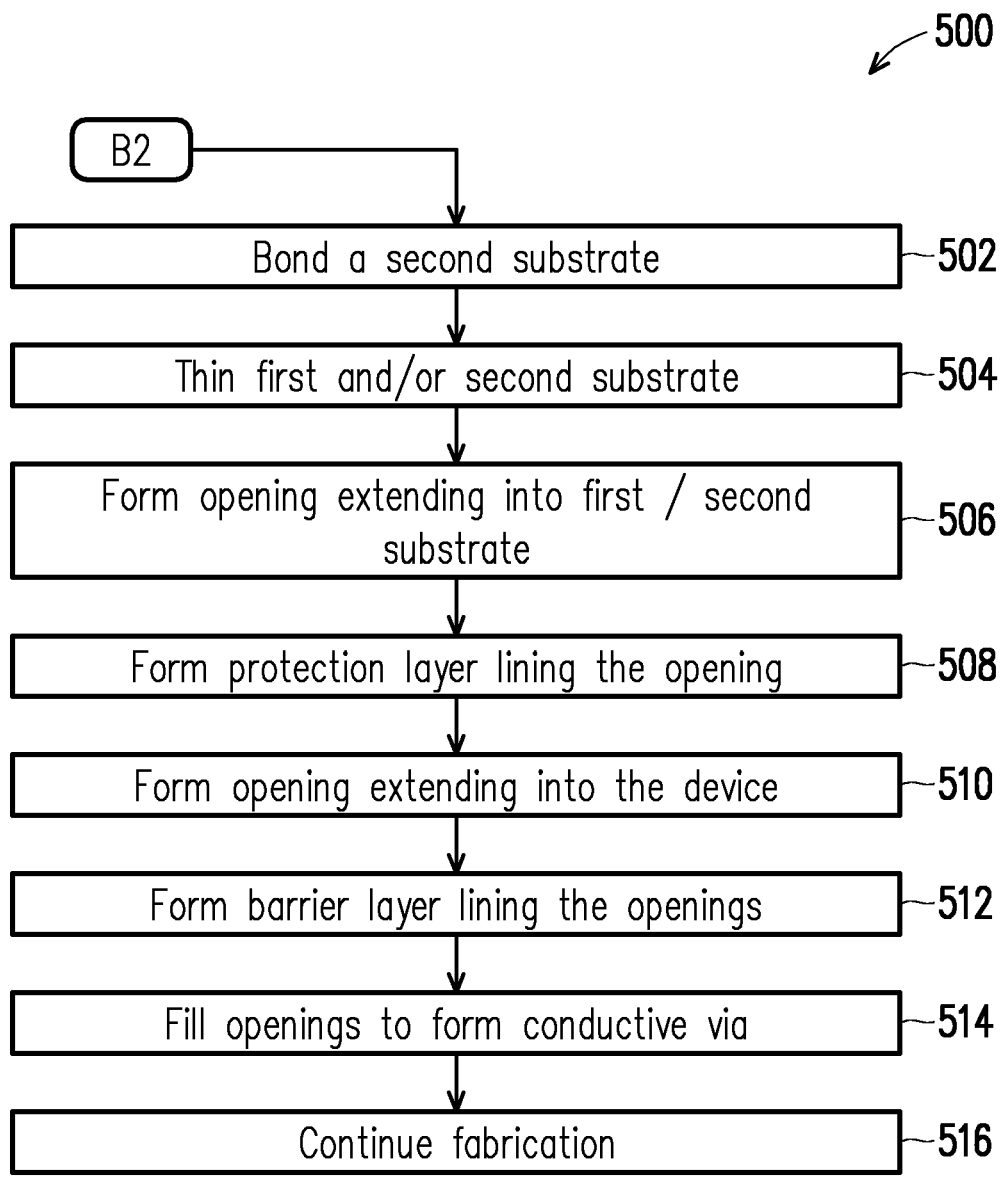
FIG. 5 is a flow chart illustrating additional steps of an embodiment method of fabricating a backside though silicon via (BTSV) in an enclosure structure according to various aspects of the present disclosure continuing from the method of FIG. 3

Turning to FIG. 5, illustrated is a method 500 which may continue from the method 300 of FIG. 3 (e.g. from B to B2) in some embodiments of forming a TSV within the enclosure structure provided by the method 300. In particular, the TSV is formed from a backside of the device, and thus, may be referred to as a backside TSV or BTSV. An embodiment of the method 500 is illustrated by the example of a device 600*d* in FIGS. 19-28.

Figure 19:
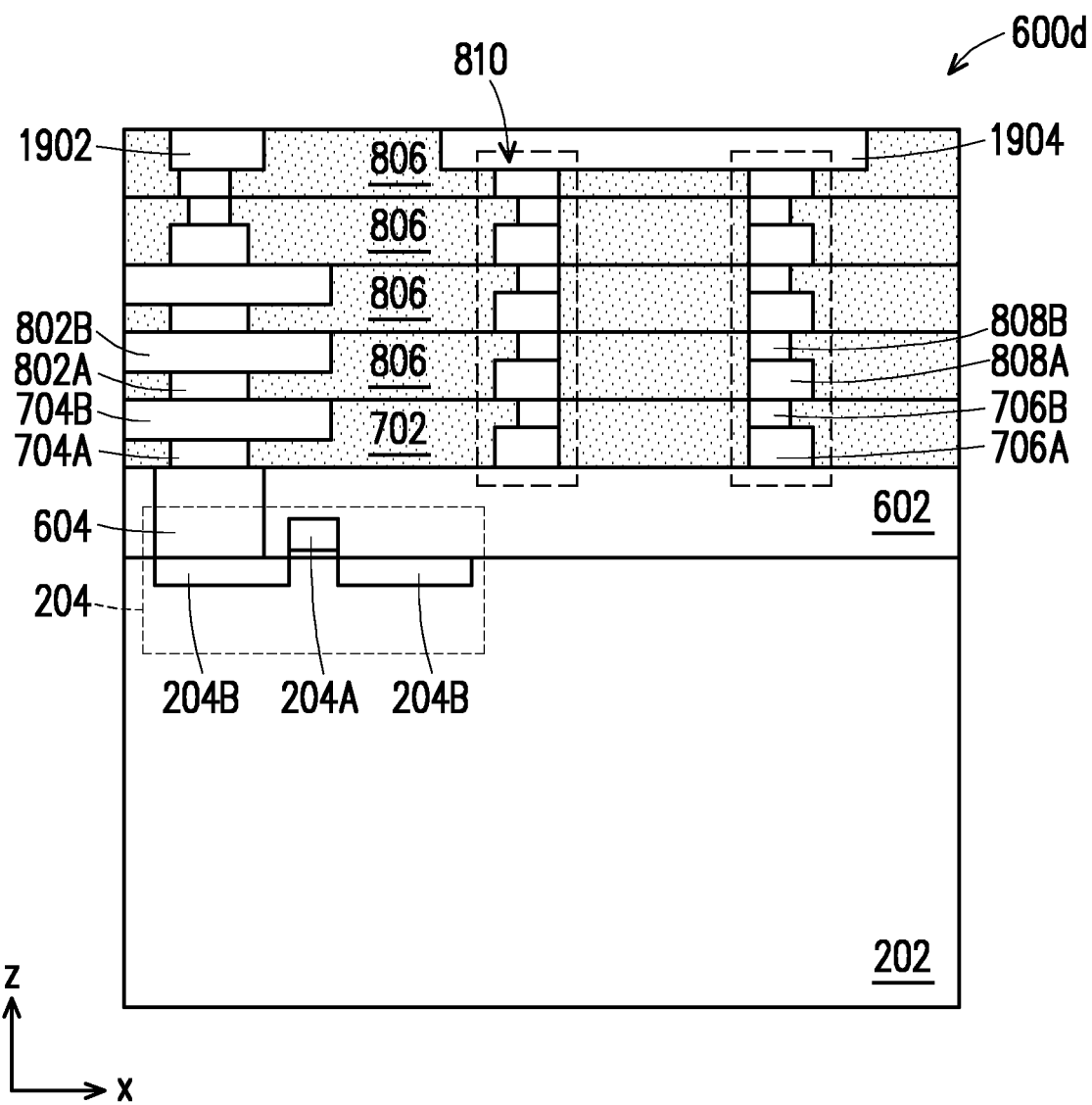
FIGS. 19-28 are fragmentary diagrammatic views of an integrated circuit device, in portion or entirety, at various fabrication stages associated with forming a TSV according to various aspects of the present disclosure corresponding to the method of FIG. 5.

The method 500 proceeds from the method 300 which forms a MLI over a substrate where the MLI includes an enclosure structure. Referring to FIG. 19, a device 600*d* substantially similar to as discussed above with reference to FIG. 8 is provided. The device 600*d* includes an enclosure structure 810 comprised of 706A, 706B, 808A, 808B formed in the dielectric layers 702, 806 coplanar with vias 704A, 802A and lines 704B, 802B of the MLI 804. The active device 204 is disposed within a first dielectric layer 602 over the substrate 202.

The device 600*d* further includes a bonding region disposed on a top surface of the device 600*d*. The bonding region includes a conductive feature 1902 disposed over and coupled to the metal lines and vias (704A, 704B) providing an interconnection to the active device 204 of the device 600*d*. The bonding region further includes a conductive feature 1904 formed over the enclosure structure 810. The conductive features 1902, 1904 are exemplary only and may include other configurations. In an embodiment, the conductive feature 1904 extends from over a first side of the enclosure structure 810 to over a second, opposing side of the enclosure structure 810 (e.g., in the x-direction and/or y-direction). In some embodiments, the conductive feature 1904 is thicker (e.g., in the z-axis) than the metal lines 704B of the MLI.

Block 502 of the method 500 provides a second device formed on a second substrate; the second device is bonded to a first device such as the first device illustrated by the method 300 of FIG. 3 having an enclosure structure formed in an MLI. Referring to the example of FIG. 20, a second device 2002 is illustrated. The second device 2002 is illustrated as an integrated circuit device 2002, in portion or entirety. Integrated circuit device 2002 may be included in a microprocessor, a memory, and/or other integrated circuit device. In some implementations, integrated circuit device 2002 is a portion of an IC chip, SoC, or portion thereof, that includes various passive and active microelectronic devices such as resistors, capacitors, inductors, diodes, PFETs, NFETs, MOSFETs, CMOS transistors, BJTs, LDMOS transistors, high voltage transistors, high frequency transistors, other suitable components, or combinations thereof. The transistors may be planar transistors or multi-gate transistors, such as FinFETs or GAA transistors. In other embodiments, the second device 2002 is a portion of a MEMs device. As illustrated for simplicity, the device 2002 includes an active device 2004 such as a transistor and an MLI structure 2006 formed over the active device 2004, where the MLI 2006 includes a plurality of metal lines and interposing vias. The MLI 2006 includes a contact level dielectric layer 2006*a* within which conductive contacts 2006*b* extend to a terminal of the active device 2004. The device 2002 includes a substrate (wafer) 2008. The substrate 2008 may be substantially similar to the substrate 202. For example, in an embodiment, substrate 2008 includes silicon.

Figure 20:
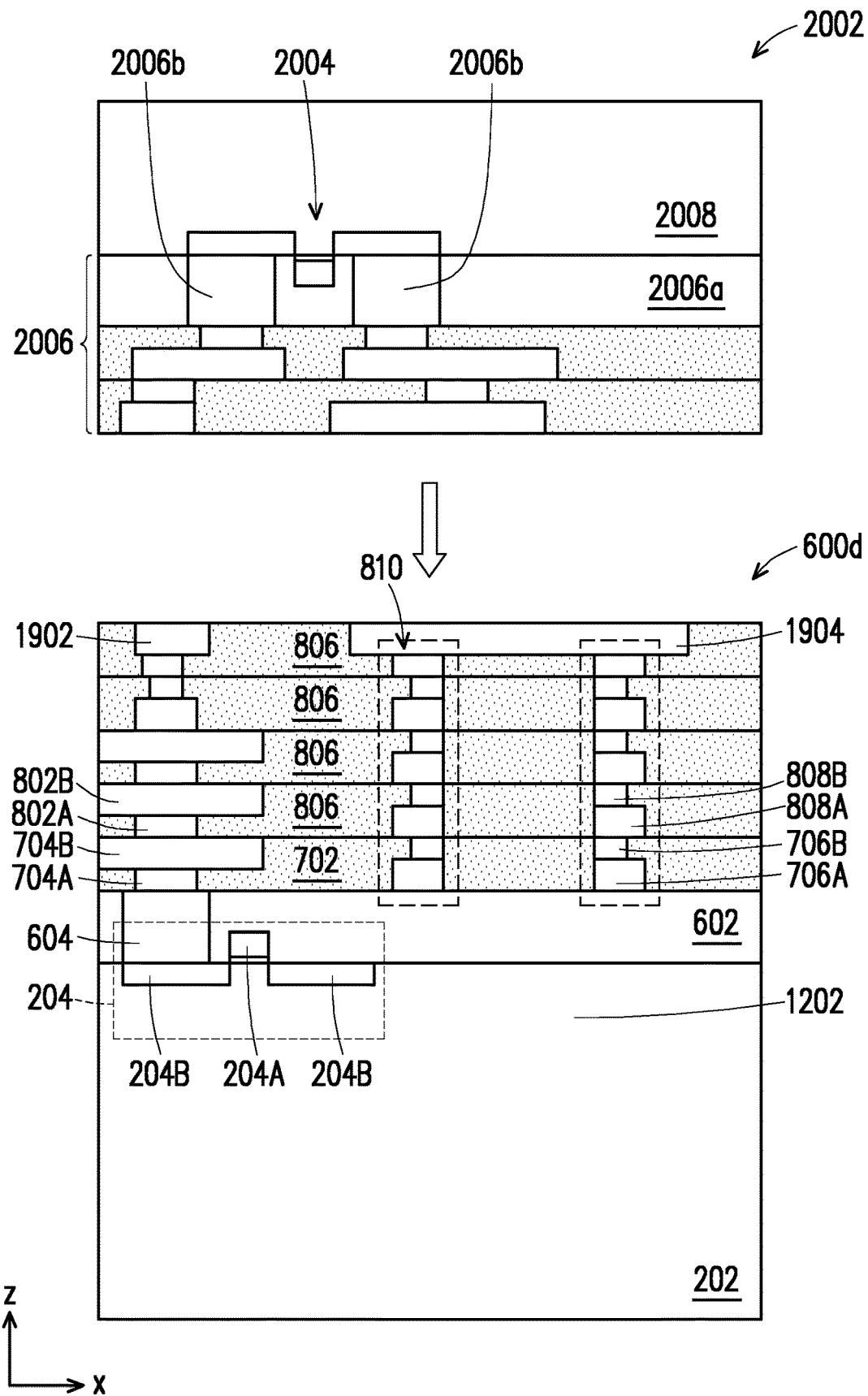
Figure 21:
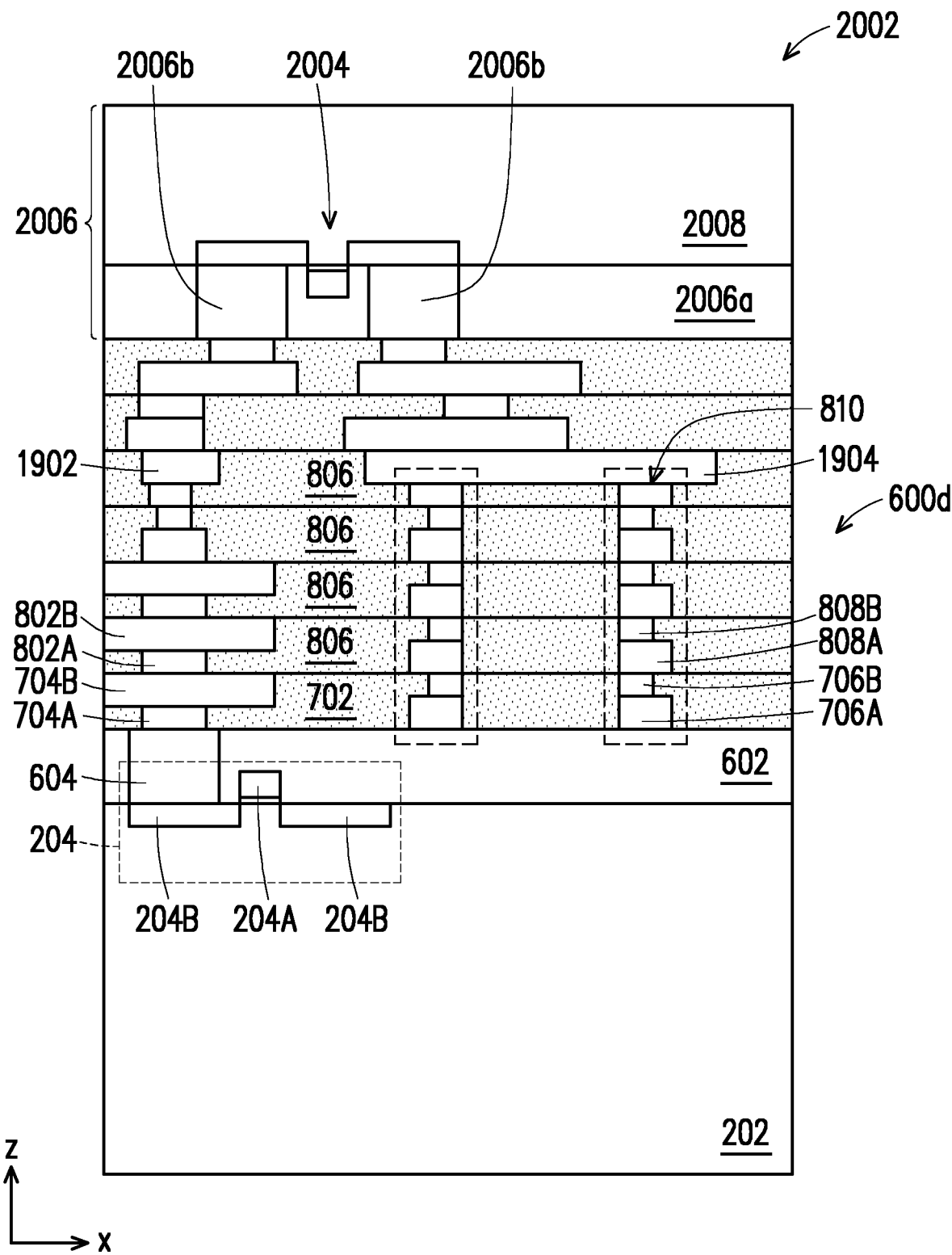
Figure 22:
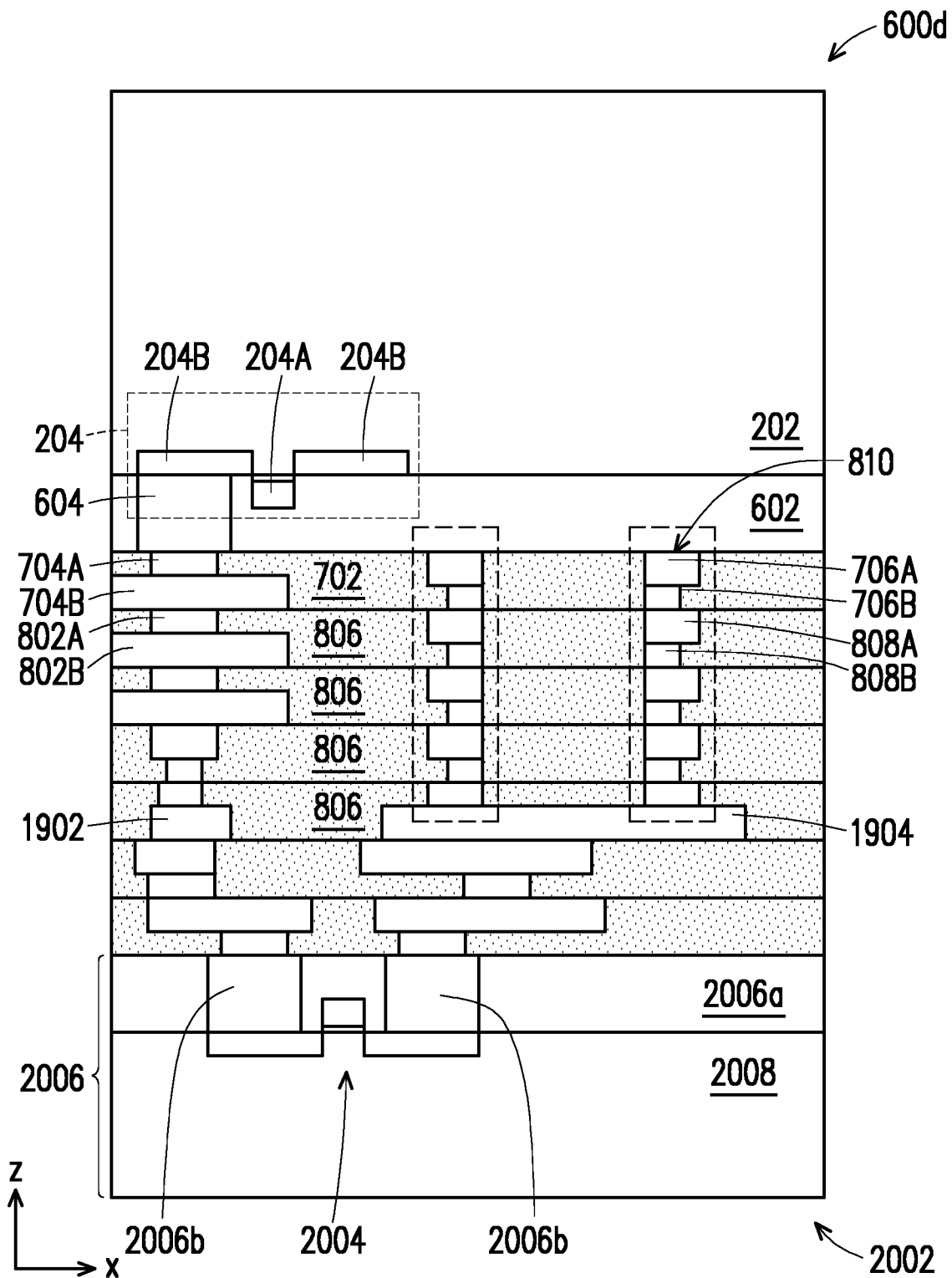

As illustrated in FIGS. 20-21, the device 2002 is inverted and bonded to the device 600*d*. The bonding may be performed by fusion bonding, hybrid bonding, and/or other suitable bonding process. In some implementations, bonding, in whole or in part, is provided between conductive features 1902 and 1904 of the device 600*d* and a corresponding conductive element of the MLI 2006 of the device 2002. In some implementations, a eutectic bond is formed between conductive components of the device 2002 and the device 600*d*. After bonding, the structure may be inverted as shown in FIG. 22.

The method 500 then proceeds to block 504 where the first and/or second substrate are thinned. Referring to the example of FIG. 23, the substrate 202 is thinned. The substrate(s) may be thinned using mechanical grinding, chemical mechanical polish and/or other suitable processes.

The method 500 then proceeds to block 506 where an opening is formed in the substrate of a device. In an embodiment, the opening is formed in the substrate of the first device. Referring to the example of FIG. 24, an opening 2402 is formed in the substrate 202 of the device 600*d*.

Figure 24:
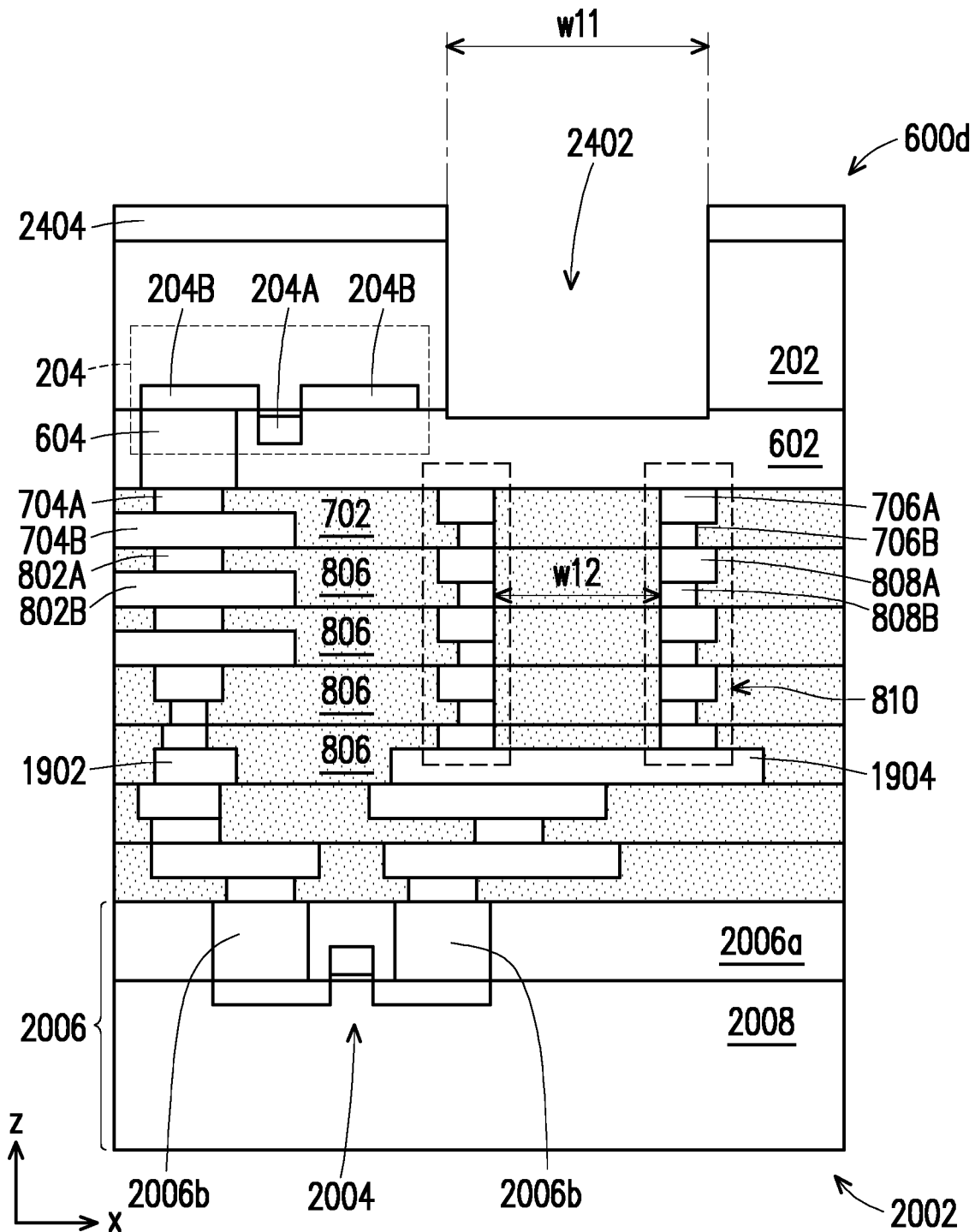

To form the opening 2402, a masking layer 2404 is formed on the substrate 202 (e.g., on a backside of the substrate 202, oriented upwards in the example of FIG. 24). The masking layer 2404 may be patterned using photolithography techniques discussed above to define an opening of the masking layer 2404. The masking layer 2404 may be a suitable material such as photoresist, hard mask (e.g., SiN, SiON) and/or other materials. In an embodiment, the masking element 2404 has an opening with a width w11 which is greater than a width w12 of the enclosure structure 810 provided by 706A, 706B, 808A, 808B.

Using the masking layer 2404 as a masking element during the etching, an opening 2402 is etched in substrate 202. In an embodiment, the dielectric layer 602 is used as an etch stop layer for the etching of the substrate 202. In some implementations, the etching includes a slight over etch into the dielectric layer 602. The etching process forming the opening 2402 may include dry etch such as a reactive ion etch or other plasma assisted etching process, a wet etch, or other suitable etching processes. After etching, the masking layer 2404 is removed (e.g., stripped) from the substrate 202.

The method 500 then proceeds to block 508 where a protection layer is formed on the sidewalls of the opening provided in block 506. Referring to the example of FIG. 25, a protection layer 2502 is formed on the sidewalls of opening 2402. The protection layer 2502 may include an oxide, such as silicon oxide; a nitride such as silicon nitride; an oxynitride such as silicon oxynitride; combinations thereof; and/or other suitable materials. The protection layer 2502 may be deposited by a deposition process (such as CVD, PVD, ALD, HDPCVD, MOCVD, RPCVD, PECVD, LPCVD, ALCVD, APCVD, other suitable methods, or combinations thereof). In an embodiment, the protection layer 2502 is formed by depositing dielectric material by CVD process or processes and performing an etching (e.g., dry etching process) to remove the dielectric layer such that it remains only the sidewalls of the opening 2402. The protection layer 2502, in some implementations, provides a protective barrier for the substrate 202 such that the substrate 202 is protected from exposure to contamination that may be produced in later processes such as the etching of the enclosure structure 810 (e.g., metal particulates).

The method 500 then proceeds to block 510 where the opening provided in block 506 is extended into the device. Referring to the example of FIG. 26, an extended opening 2602 is formed into the device 600d and in particular, though the dielectric layer 702, 806 within the enclosure structure 810 of the device 600d.

Figure 25:
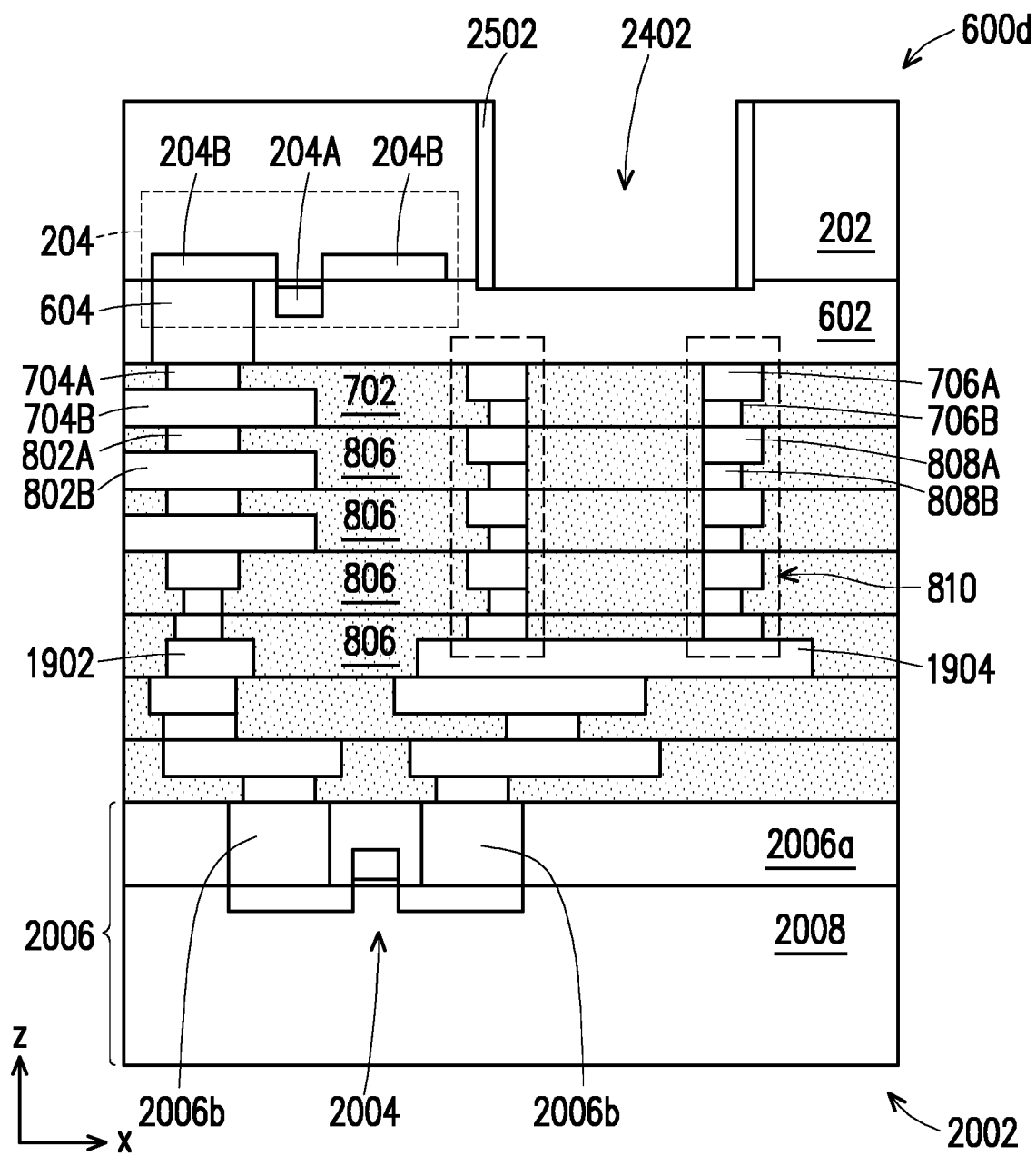
Figure 26:
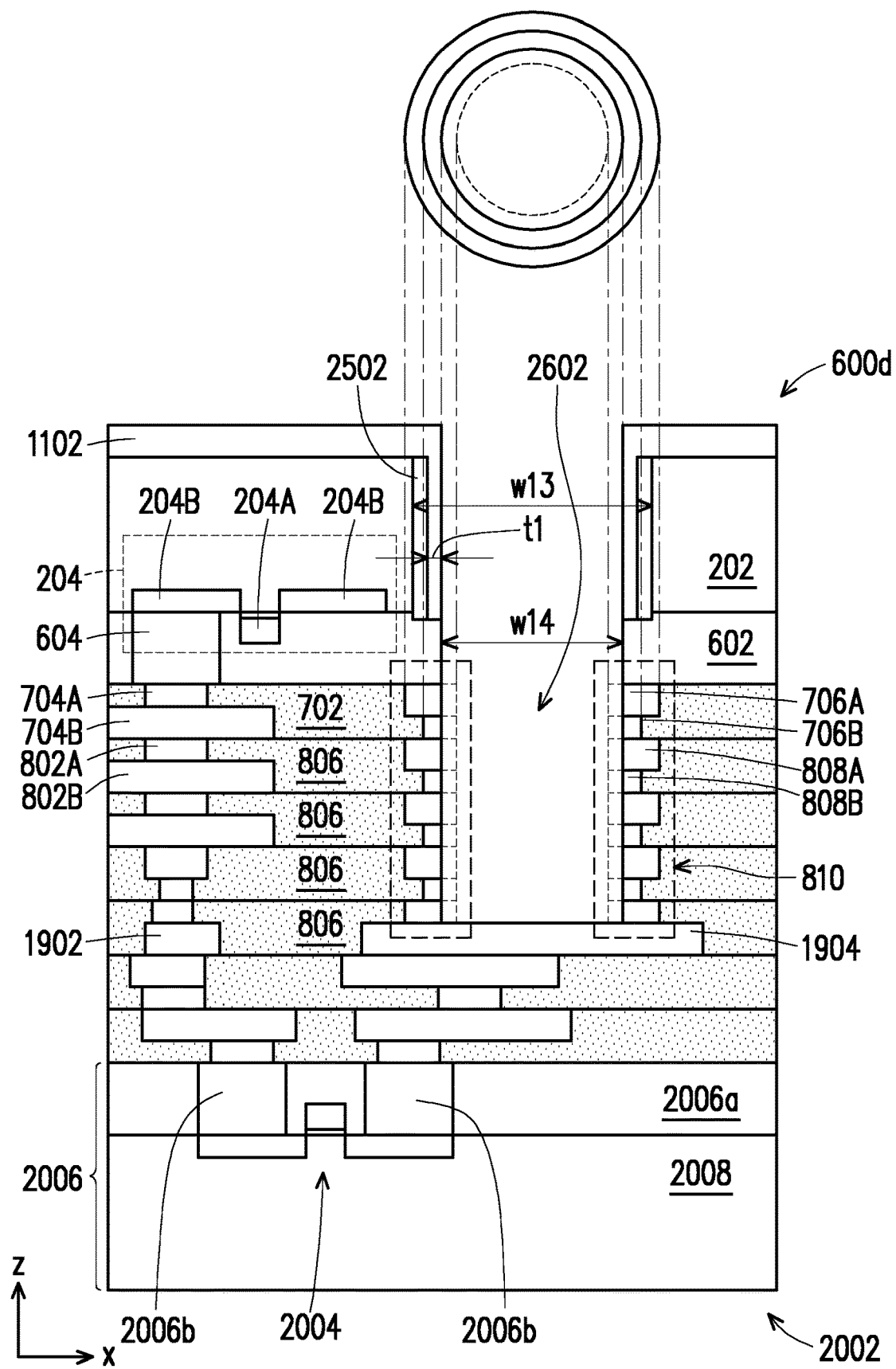

In an embodiment of forming the opening 2602, a masking layer 1102 is formed over the sidewalls of the opening 2402 illustrated in FIG. 25, for example, on the sidewalls of the protection layer 2502. The masking layer 1102 may be patterned using photolithography and/or etching techniques as discussed above. The masking layer 1102 may be a suitable material such as photoresist, hard mask (e.g., SiN, SiON) and/or other materials. The masking layer 1102 may be formed to a first thickness t1. In some implementations, the thickness t1 and the protection layer 2502 thickness in sum provide for a difference in width of a first portion of the via and a second portion of the via as discussed below.

Using the masking layer 1102 as a masking element during the etching, the opening 2602 is etched extending into the dielectric layers 602, 702, 806. The etching of the opening 2602 may be performed by a wet etch, dry etch (including plasma and/or REI) processes in one or more etching processes. In an embodiment, an end portion of one or more of the features 706A, 706B, 808A, 808B is etched to form the opening 2602. The amount of removal of the end portions of 706A, 706B, 808A, 808B is dependent upon the thickness of the first dielectric layer 2502. The decrease in width of one of more of 706A, 706B, 808A, 808B may provide a widening of opening 2602 allowing for improved gap fill. However, sufficient width of 706A, 706B, 808A, 808B should be maintained to protect the dielectric layers 806, 702 disposed in regions outside of the enclosure structure 810 from the etching process. During the etching of the opening 2602, it is noted that the dielectric layers 806 and/or 702 in regions outside of the enclosure structure 810 are substantially protected from the etchants by the enclosure structure 810 provided by 706A, 706B, 808A, 808B.

As illustrated previously including with respect to FIGS. 2B, 2C, 2D, 2E, and 2F, the opening 2602, like the opening 2402, can but need not be a circular shape and can, but need not be, centered within the enclosure structure 810. As further illustrated in FIG. 2F, in some implementations, the etching may leave a residual amount of dielectric 806 within the opening 2602. After etching the opening 2602, the masking layer 1102 may be removed (e.g., stripped).

After removal of the masking layer 1102, the opening 2602 has a first width w13 at a portion of the opening 2602 within the substrate 202 and a second width w14 at a portion of the opening 2602 within the dielectric layer 602 and/or within the enclosure structure 810. The second width w14 is less than the first width w13. In some implementations, the second width w14 may be less than the first width w13 by 0 to 40%.

The method 500 then proceeds to block 512 where a second protection layer is formed lining the opening. Referring to the example of FIG. 27, a second protection layer 2702 is formed lining the opening 2602. The protection layer 2702 may include an oxide, such as silicon oxide; a nitride such as silicon nitride; an oxynitride such as silicon oxynitride; combinations thereof; and/or other suitable materials. The protection layer 2702 may be deposited by a deposition process (such as CVD, PVD, ALD, HDPCVD, MOCVD, RPCVD, PECVD, LPCVD, ALCVD, APCVD, other suitable methods, or combinations thereof). In an embodiment, the protection layer 2702 is formed by depositing dielectric material by CVD process or processes and performing an etching (e.g., dry etching process) to remove the dielectric layer such that it remains only the sidewalls of the opening 2602.

Figure 27:
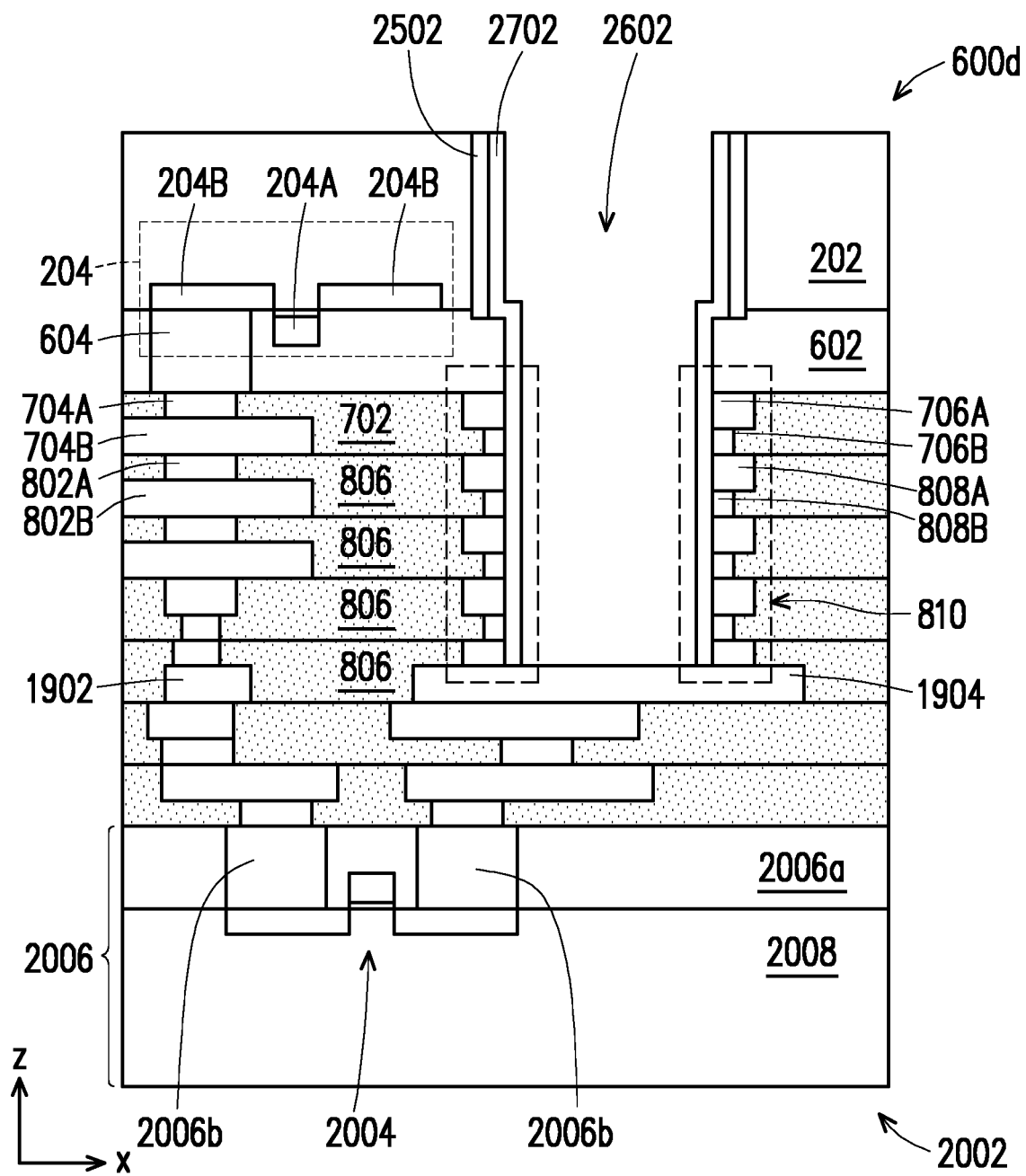
Figure 28:
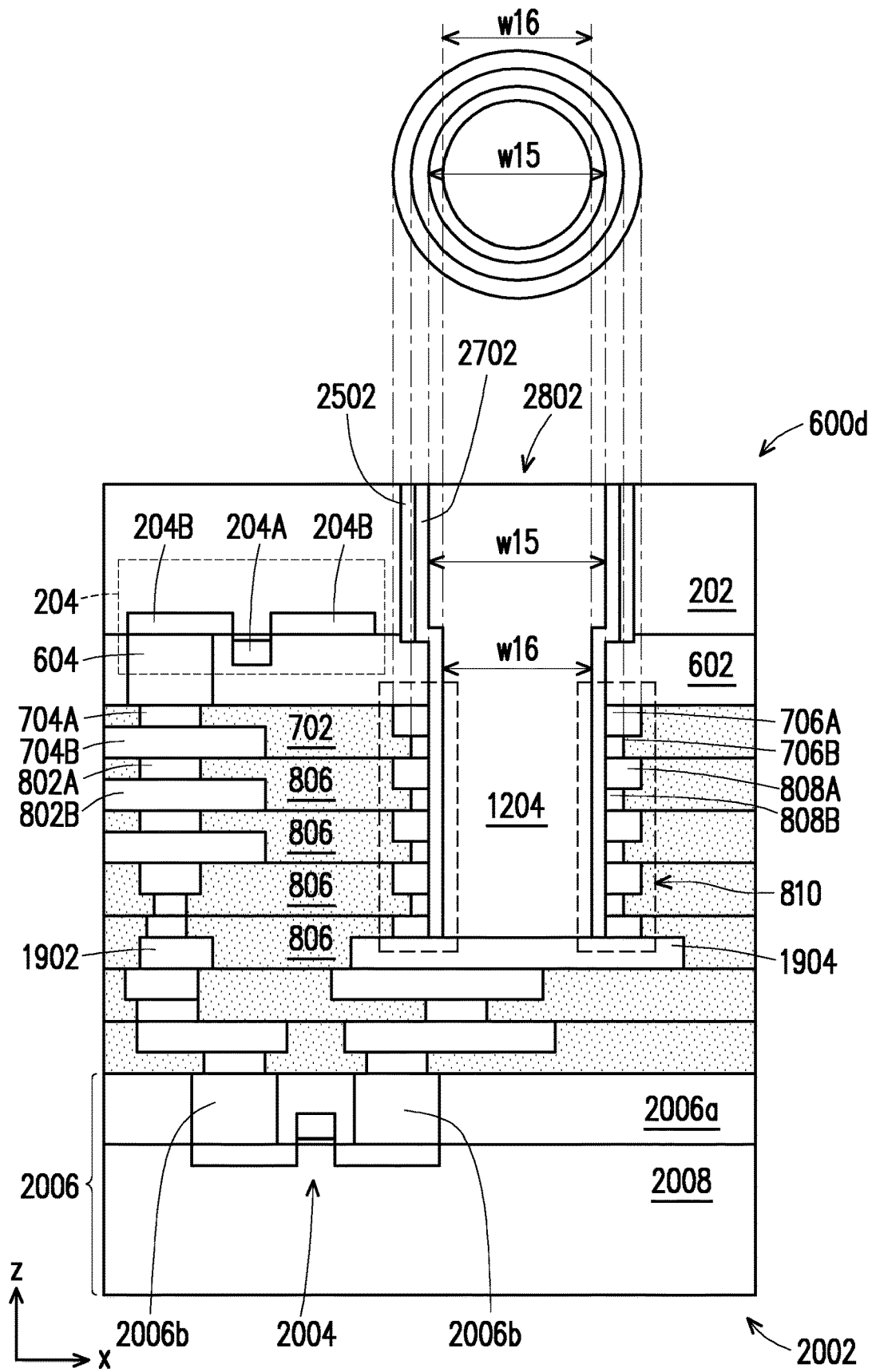

The method 500 then proceeds to block 514 where a conductive material(s) are provided in the opening to form the conductive via. Referring to the example of FIG. 28, a metal layer 1204 is formed in the opening 2602 (FIG. 27). In an embodiment, the conductive fill metal 1204 is copper. However, other conductive materials may also be possible such as Ta, Ti, Al, Cu alloys, Co, TaN, TiN, TaN, and/or other suitable conductive materials. After deposition of the conductive fill metal, a planarization process (e.g., CMP) may be performed providing, as illustrated in FIG. 28, a planar top surface removing the excess material from the top of the substrate 202. In some implementations, a barrier layer such as TaN, TiN, WN, TbN, VN, ZrN, CrN, WC, WN, WCN, NbN, AlN, or combinations thereof may also be formed in the opening 2602.

As illustrated in FIG. 28, a conductive via 2802 is formed including the conductive fill metal 1204. The width w15 of an upper portion of the conductive via 2802 is greater than the width w16 of a lower portion of the conductive via 2802. In some implementations, the width w15 is 0 to 40% greater than w16. The width w16 may be adjusted depending on the thickness of the protection layer 2502. The difference in width w15 and w16 may allow for tuning the gap filling ability of forming the conductive via 2802. In an embodiment, the width w15 of the TSV 2802 ranges from between approximately 1 μm and approximately 10 μm. In an embodiment, the width w16 of the TSV 2802 ranges between approximately 0.5 μm and approximately 2.8 μm.

In some embodiments, the dielectric layers 2502 and/or 2702 are disposed between the TSV 2802 and the enclosure structure 810 and provide for a benefit of balancing stress induced by the metal composition of the TSV 2802.

The method 500 may then proceed to block 516 where continued fabrication may be performed. In some implementations, an interconnect structure (e.g., metal lines and vias having surrounding dielectric) may be formed on an exposed surface of the device connecting to a top of the via 2802. For example, in some implementations, an interconnect structure such as metal bump or bond pad may be coupled to the via 2802. Thus, the method 500 as illustrated by device 600d of FIGS. 19-28 provides for a conductive via 2802 that extends from a backside of the substrate 202 to a conductive feature 1904 of the device 600d, which may be coupled to the MLI of the second structure 2002.

The conductive vias 2802 may be referred to as a backside TSV or BTSV 2802. The BTSV 1302 is provided within the enclosure structure 810 provided by 706A, 706B, 808A, 808B, such that the enclosure structure 810 completely surrounds or encases a portion of the BTSV 2802 that extends through dielectric layers 806. The enclosure structure 810 encloses the lower portion of the BTSV 2802 that has a decreased width (e.g., w16). In some implementations, the dielectric layer 806 is an extreme low-k material, the enclosure structure 810 provided by 706A, 706B, 808A, 808B provides protection of the extreme low-k material from an etching process used to form the opening (e.g., within the dielectric material) within which the TSV 1302. In contrast, the enclosure structure 810 is not provided on a second portion of the TSV (e.g., width w15) that is surrounded by dielectric layer 602 and/or the substrate 202.

Figure 29:
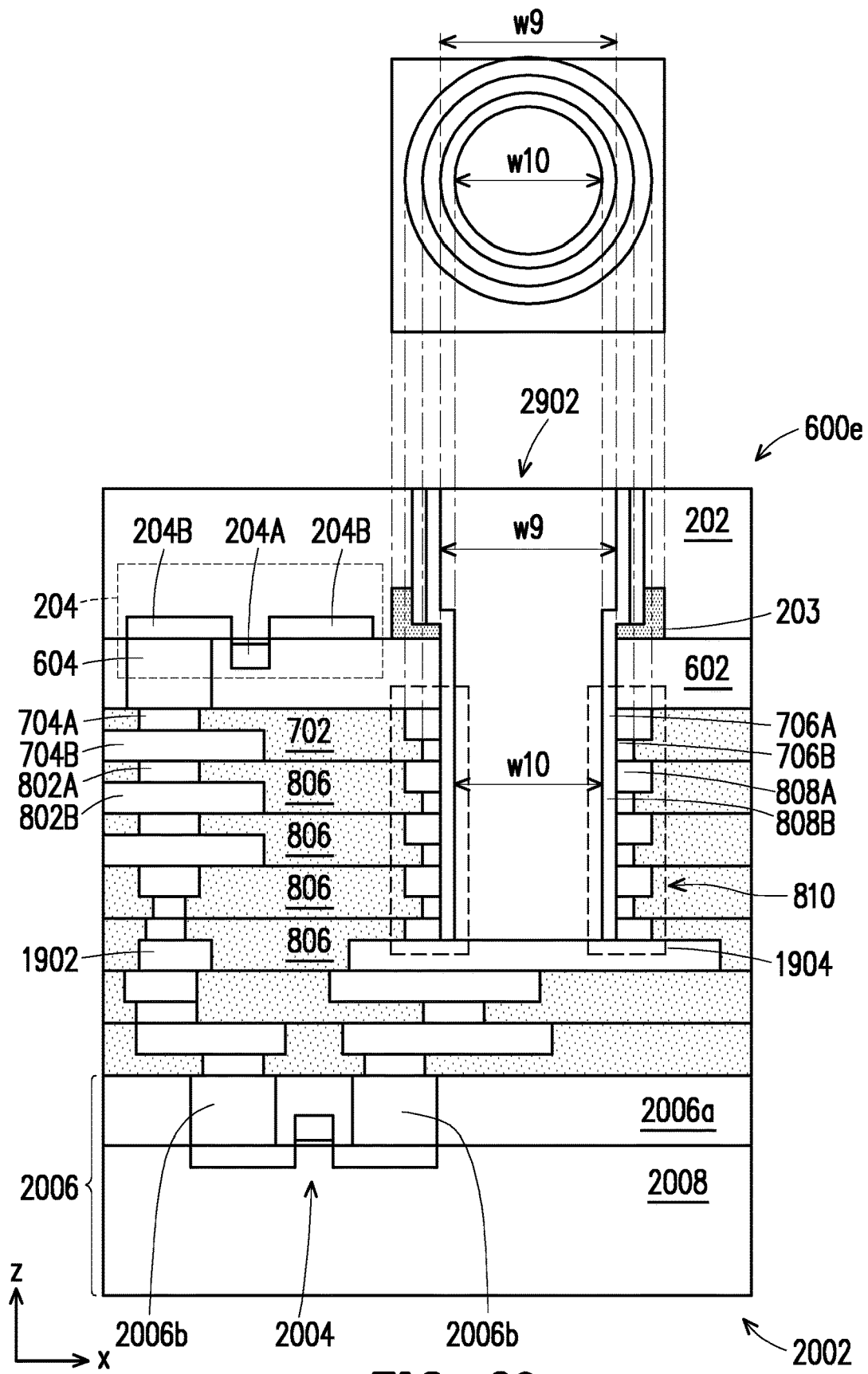
FIG. 29 is a fragmentary diagrammatic view of an integrated circuit device, in portion or entirety, fabricated according to various aspects of the present disclosure including those corresponding to FIG. 5.

Referring now to FIG. 29, illustrated is an embodiment of a device 600e that may be fabricated using one or more steps discussed herein, including as described in the method 500 of FIG. 5. The device 600e is substantially similar to the device 600d discussed above. The substrate 202 includes an isolation feature 203 through which a BTSV 2902 is formed. The BTSV 2902 may be substantially similar to the BTSV 2802. The isolation feature 203 interfaces a surface of the dielectric layer 602. Because of the presence of the isolation feature 203, the first etching process, such as discussed above with reference to block 506 of the method 500 and exemplified by FIG. 24, allows for the etching to form the opening ending within the substrate 202 and in particular, within the isolation feature 203. This can in some implementations eliminate the need for the over etch into the dielectric layer 602 discussed above.

Figure 30:
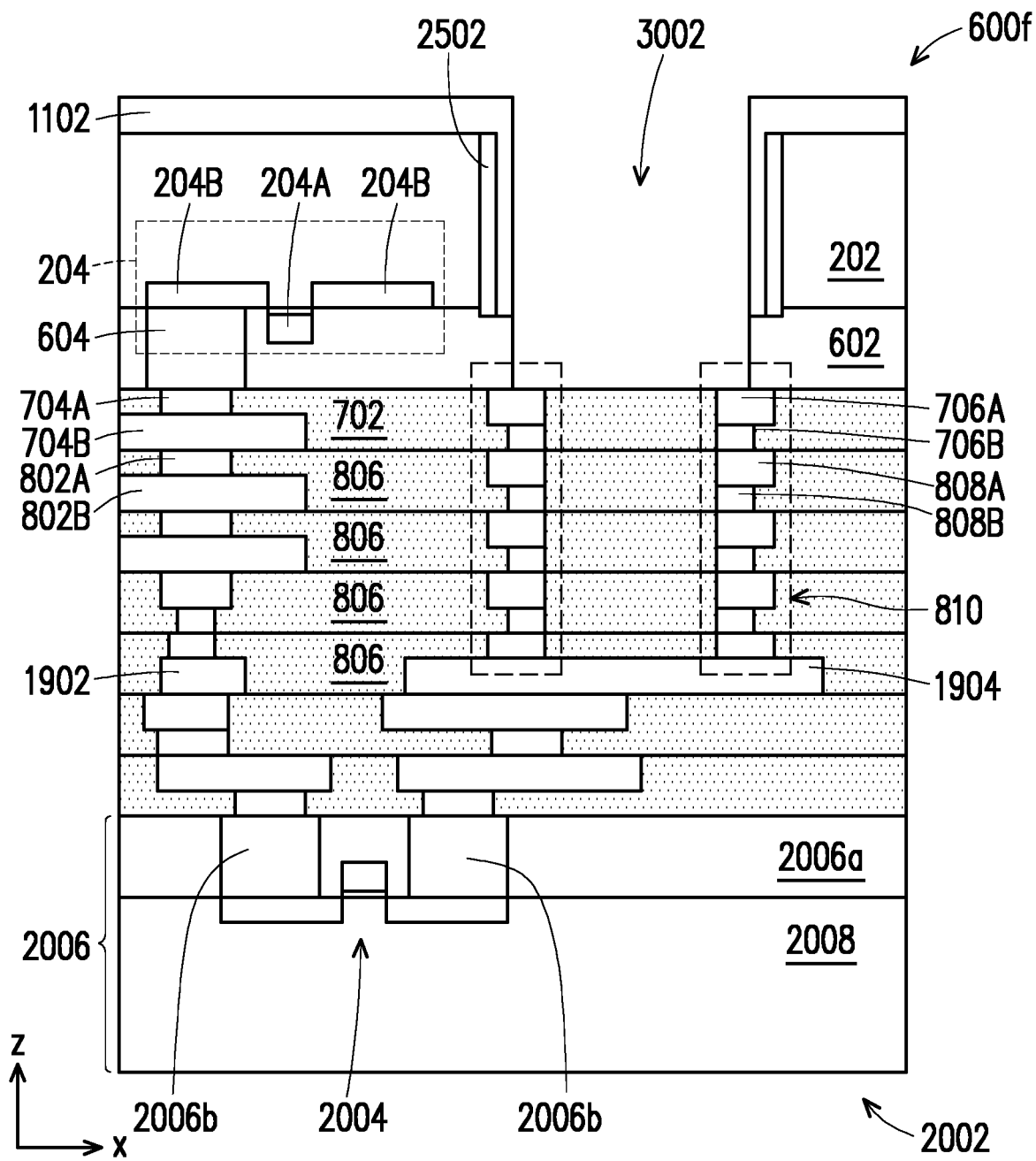
FIGS. 30-32 are fragmentary diagrammatic views of an integrated circuit device, in portion or entirety, at various fabrication stages associated with forming another TSV according to various aspects of the present disclosure corresponding to the method of FIG. 5.
Figure 31:
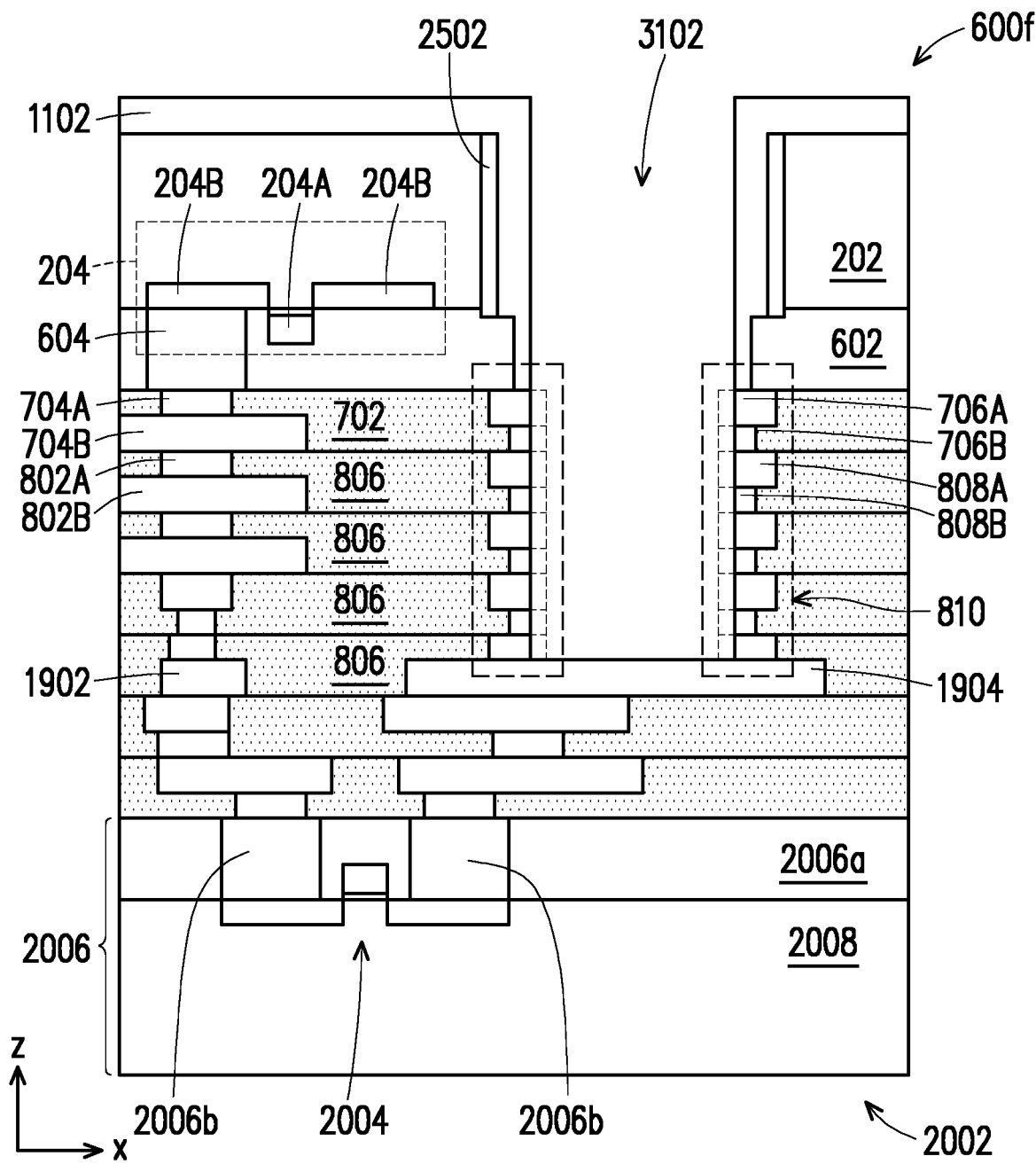
Figure 32:
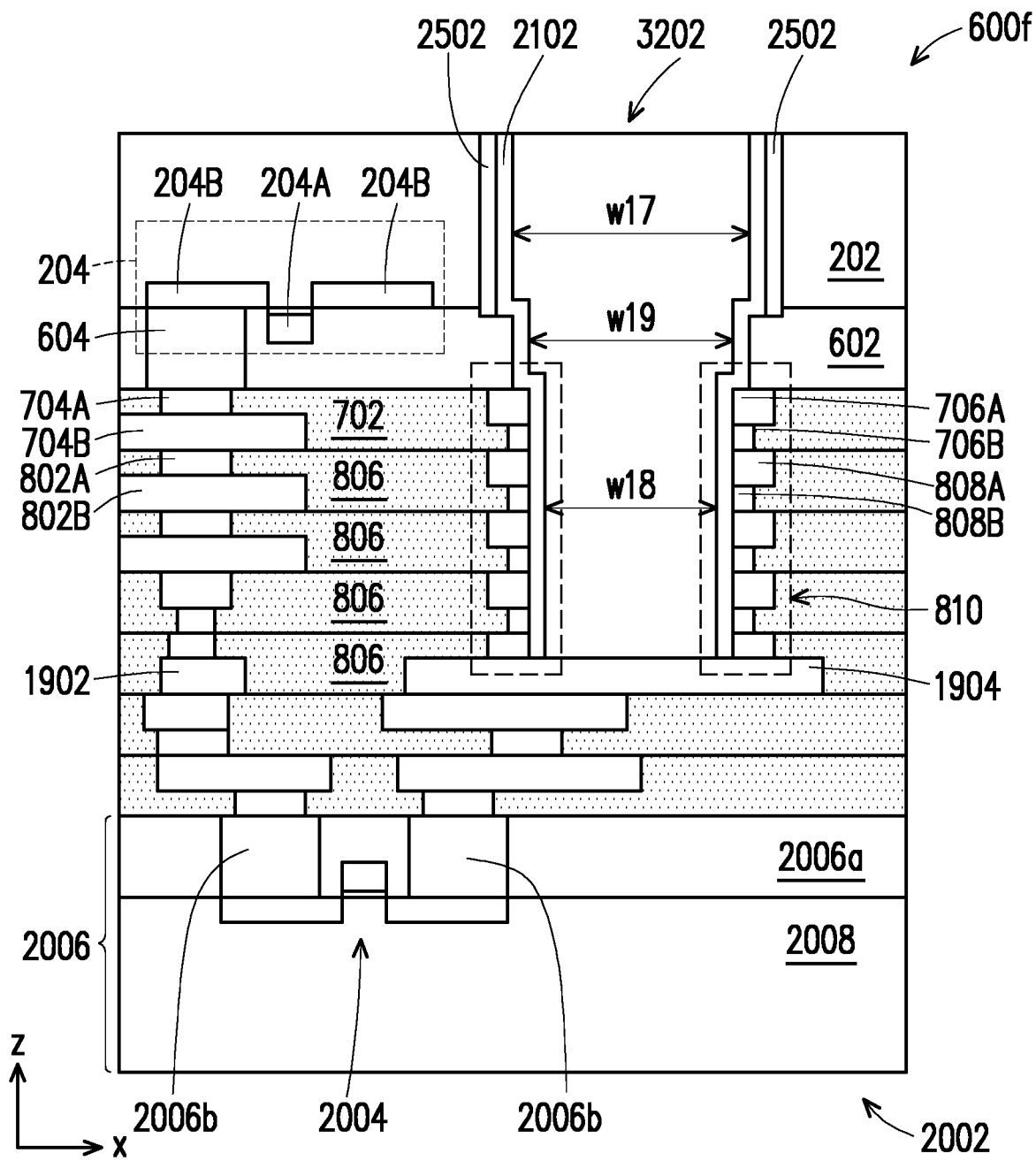

In another embodiment of the method 500 of FIG. 5, the TSV may be formed using additional etching steps and/or may provide a TSV that has at least three different widths. FIGS. 30-32 illustrate a device 600f as exemplary. In an embodiment of the method 500, the method 500 proceeds through block 508 as discussed above including the forming of a protection layer over a first opening. In an embodiment, an example device at this stage of the method 500 is illustrated in FIG. 25 and includes protection layer 2502. In an embodiment, a thickness of the dielectric protection layer 2502 is between approximately 30 Å and approximately 3000 Å.

In an embodiment, the embodiment of the method 500 then includes with an interim etching step that extends the opening within the substrate 202 such that the opening that extends through the dielectric layer 602 as illustrated in FIG. 30 and the extended opening 3002 is formed.

In an embodiment of forming the opening 3002, a masking layer 1102 is formed over the sidewalls of the opening 2402 illustrated in FIG. 25, for example, on the sidewalls of the protection layer 2502. The masking layer 1102 may be patterned using photolithography and/or etching techniques discussed above. The masking layer 1102 may be a suitable material such as photoresist, hard mask (e.g., SiN, SiON) and/or other materials.

Using the masking layer 1102 as a masking element during the etching, the opening 3002 is formed extending into and/or through the dielectric layer 602. The etching of the opening 3002 may be performed by a wet etch, dry etch (including plasma and/or REI) processes in one or more etching processes. In an embodiment, the dielectric layer 702, 802 differs in composition from that of dielectric layer 602 providing an etch stop for the formation of the opening 3002. In an embodiment, the enclosure structure 810 provides an etch stop for the formation of the opening 3002. After etching, the masking layer 1102 may be removed.

In an embodiment, the method then proceeds to block 510 where an additional etching step is formed further extend the opening into the device. Referring to the example of FIG. 31, an opening 3102 is provided that extends the opening through the dielectric layer 702, 802 within the enclosure structure 810 as illustrated in FIG. 31.

In an embodiment of forming the opening 3102, a masking layer 1102 is again formed over the sidewalls of the opening 3002 illustrated in FIG. 30, for example, on the sidewalls of the protection layer 2502 and the sidewalls of the etched dielectric layer 602. The masking layer 1102 may be patterned using photolithography and/or etching techniques discussed above. The masking layer 1102 may be a suitable material such as photoresist, hard mask (e.g., SiN, SiON) and/or other materials.

Using the masking layer 1102 as a masking element during the etching, the opening 3102 is etched in the dielectric layer(s) 702, 802 that are disposed within the enclosure structure 810. The etching of the opening 3102 may be performed by a wet etch, dry etch (including plasma and/or REI) processes in one or more etching processes. In an embodiment, the etching stops at the conductive feature 1904.

In some embodiments, the etching also removes ends of 706A, 706B, 808A, 808B as discussed above. In an embodiment, the protection layer 2502 serves to protect the substrate 202 from unwanted contamination produced by the etching of the metal-comprising material of the ends of 706A, 706B, 808A, 808B. After etching, the masking layer 1102 may be removed.

The method 500 then proceeds to block 512 where a second protection layer is formed lining the opening. Referring to the example of FIG. 32, a second dielectric protection layer 2702 is formed lining the opening 3102. The protection layer 2702 may include an oxide, such as silicon oxide; a nitride such as silicon nitride; an oxynitride such as silicon oxynitride; combinations thereof; and/or other suitable materials. The protection layer 2702 may be deposited by a deposition process (such as CVD, PVD, ALD, HDPCVD, MOCVD, RPCVD, PECVD, LPCVD, ALCVD, APCVD, other suitable methods, or combinations thereof). In an embodiment, the protection layer 2702 is formed by depositing dielectric material by CVD process or processes and performing an etching (e.g., dry etching process) to remove the dielectric layer such that it remains only the sidewalls of the opening 3102. In an embodiment, a thickness of the dielectric layer 2702 is between approximately 30 Å and approximately 3000 Å.

The method 500 then proceeds to block 514 where a conductive material(s) is provided in the opening to form the conductive via. Referring to the example of FIG. 32, a metal layer 1204 is formed in the opening 3102 (FIG. 31). In an embodiment, the conductive fill metal 1204 is copper. However, other conductive materials may also be possible such as Ta, Ti, Al, Cu alloys, Co, TaN, TiN, TaN, and/or other suitable conductive materials. After deposition of the conductive fill metal, a planarization process (e.g., CMP) may be performed providing, as illustrated in FIG. 31, a planar top surface removing the excess material from the top of the substrate 202. In some implementations, a barrier layer such as TaN, TiN, WN, TbN, VN, ZrN, CrN, WC, WN, WCN, NbN, AlN, or combinations thereof may also be formed in the opening 3102.

As illustrated in FIG. 32, a conductive via 3202 is formed including the conductive fill metal 1204. The width w17 of an upper portion of the conductive via 3202 is greater than the width w18 of a lower portion of the conductive via 2802. A region having a width w19 interposes to two portions of the conductive via 2802. In an embodiment, the width w17 of the TSV 3202 ranges from between approximately 1 μm and approximately 10 μm. In an embodiment, the width w18 of the TSV 3202 ranges between approximately 0.5 μm and approximately 2 μm. The TSV 3202 having a configuration with three portions may provide a stepped profile that benefits gap filling.

In some embodiments, the dielectric layers 2502 and/or 2702 are disposed between the TSV 3202 and the enclosure structure 810 to balance stress induced by the metal composition of the TSV 3202. The TSV 3202 having a three-stepped profile may also provide for smaller size (CD) of TSV 3202 inside the enclosure structure 810 improving device density.

The method 500 may then proceed to block 516 where continued fabrication may be performed. In some implementations, an interconnect structure (e.g., metal lines and vias having surrounding dielectric) may be formed on a front surface of the device connecting to a top of the via 3202. In some implementations, an interconnect structure such as metal bump or bond pad may be coupled to the via 3202. Thus, the method 500 as illustrated by device 600*f* of FIGS. 30-32 provides for a conductive via 3202 that extends from a backside of the substrate 202 to a conductive feature 1904 of the device 600*f*, which may be coupled to the MLI of the second structure 2002.

The conductive vias 3202 may be referred to as a backside TSV 3202 or BTSV 3202. The BTSV 3202 is provided within the enclosure structure 810 provided by 706A, 706B, 808A, 808B, such that the enclosure structure completely surrounds or encases the portion of the BTSV 3202 that extends through dielectric layers 806.

Figure 23:
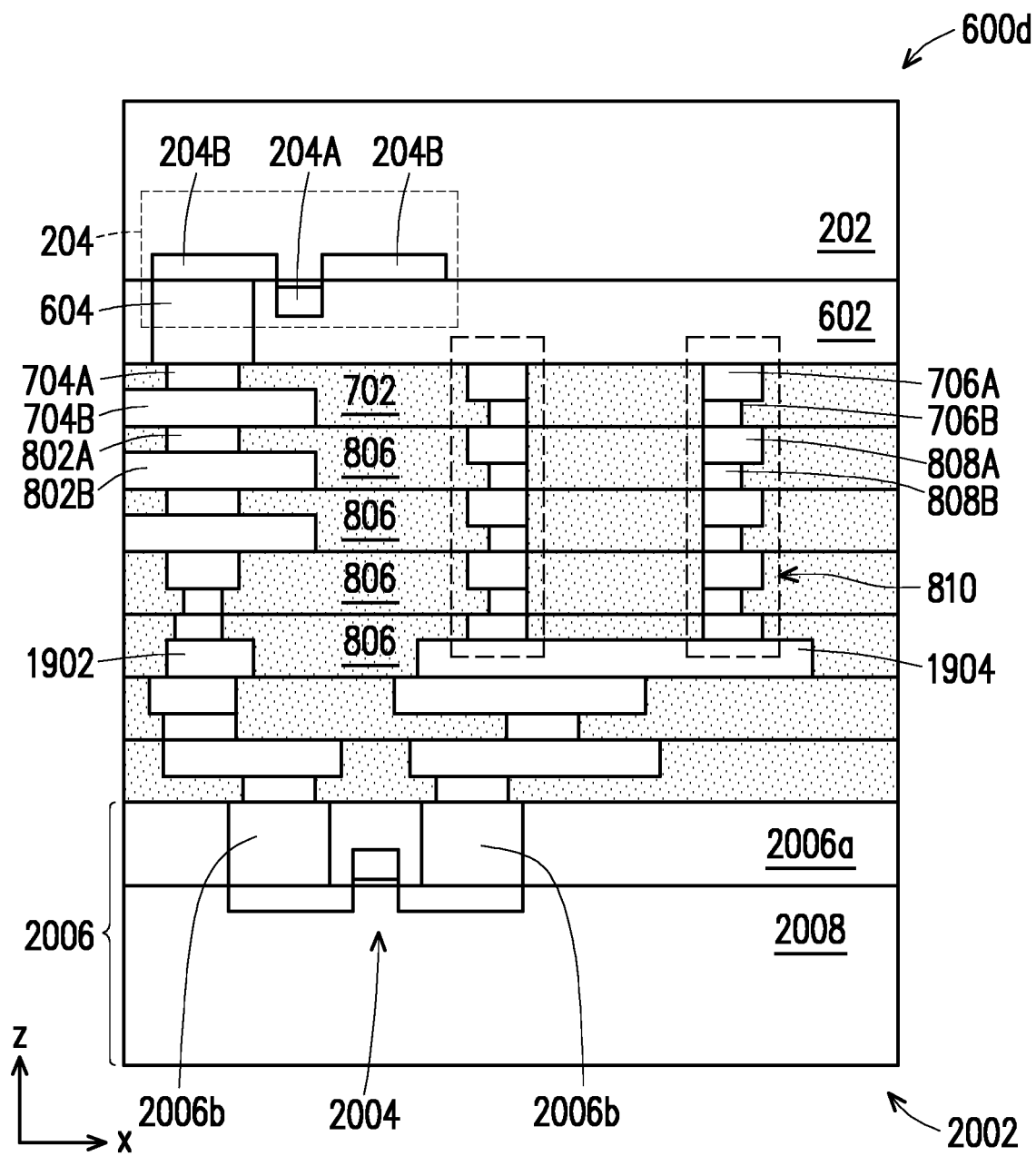
Figure 33:
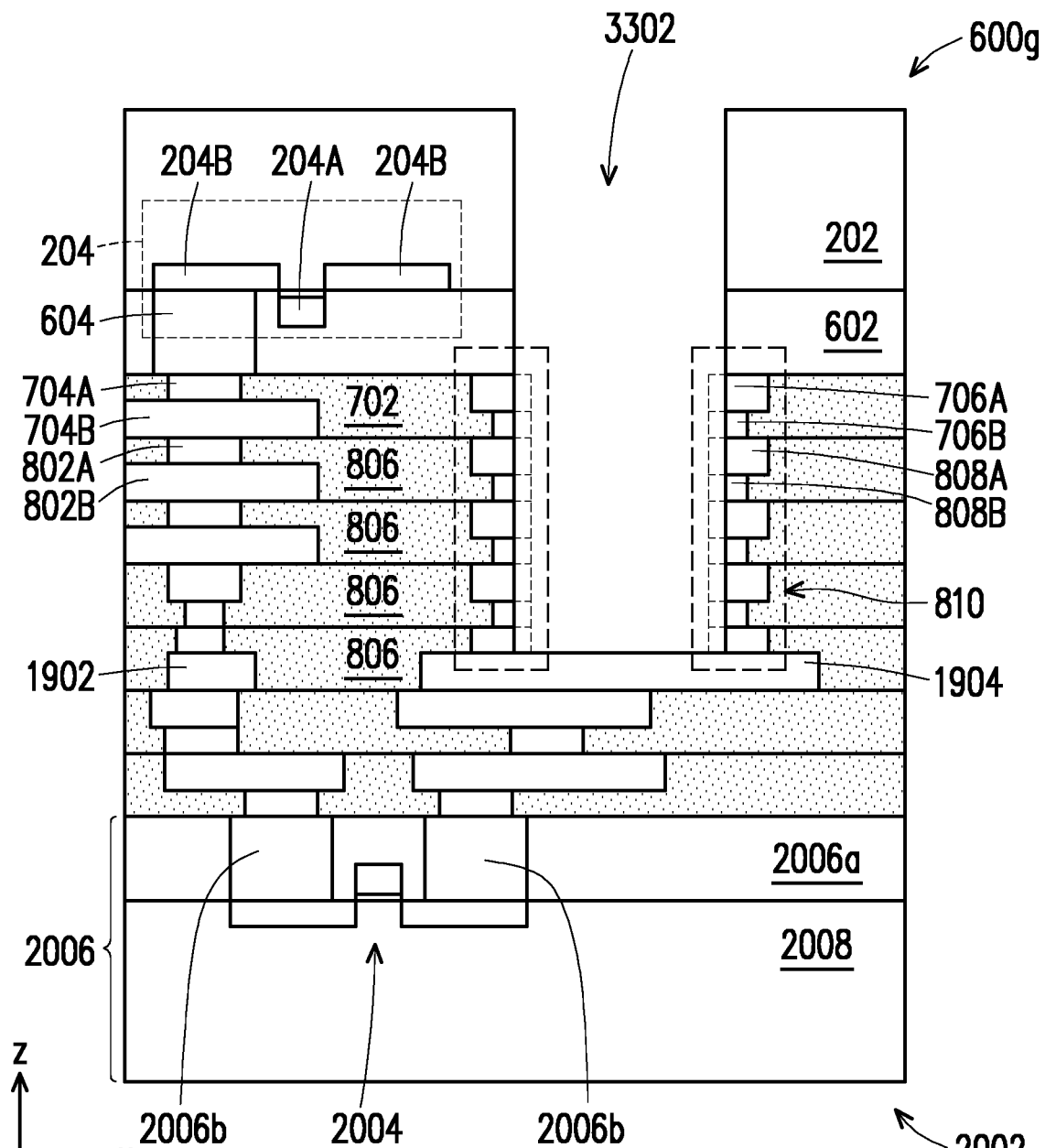
FIGS. 33-34 are fragmentary diagrammatic views of another integrated circuit device, in portion or entirety, at various fabrication stages associated with forming a TSV according to various aspects of the present disclosure corresponding to the method of FIG. 5.
Figure 34:
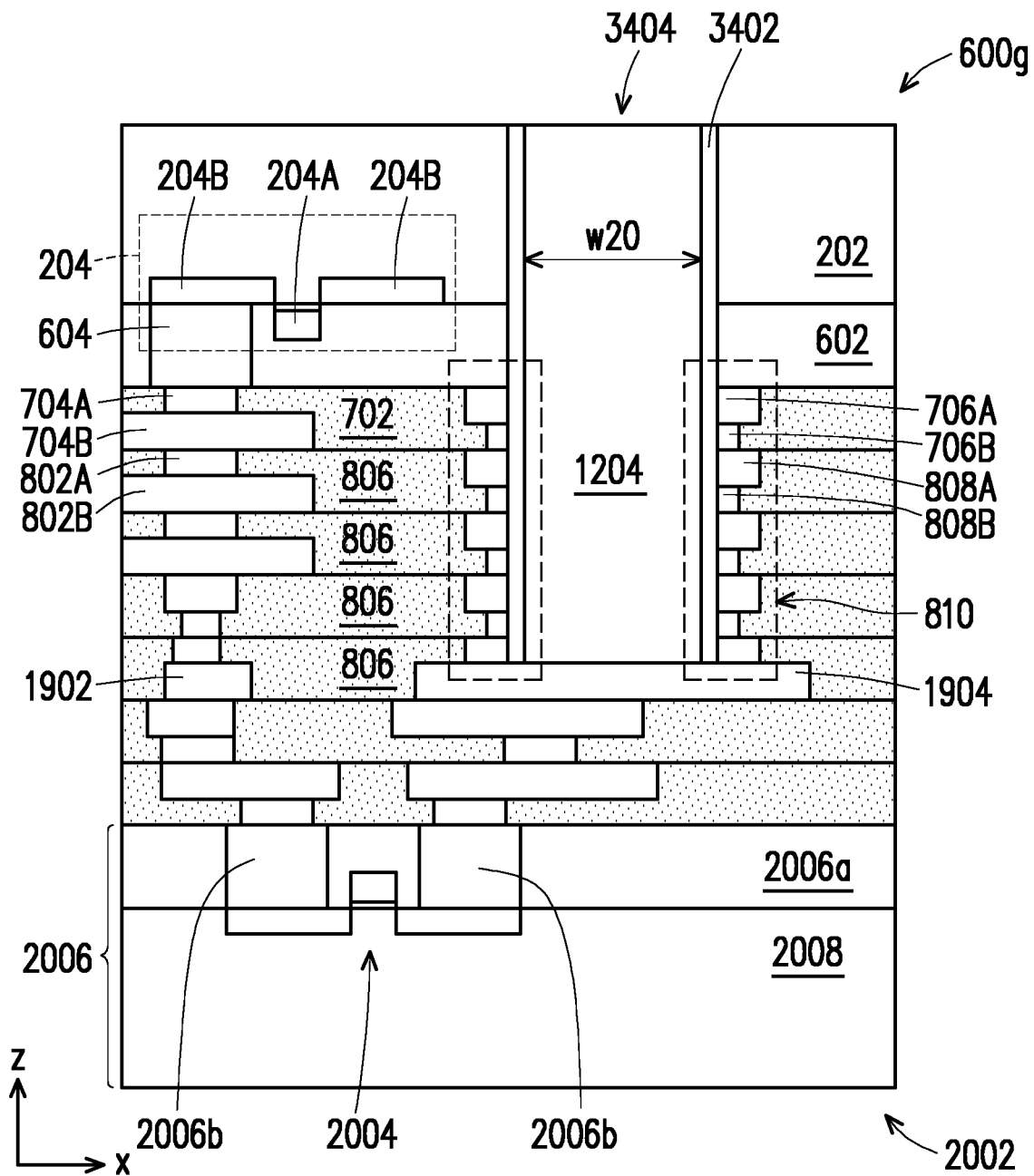

Referring now to FIGS. 33-34, illustrated is an exemplary device 600*g* that may be fabricated using one or more of the steps of the method 500 of FIG. 5. The device 600*g* differs from the description above in that a via having a single width, which may be formed in a single etching step may be formed. In an embodiment, after block 504 of the method 500, a device is provided having an enclosure structure within which a TSV is to be formed. The device of FIG. 23 is illustrative of this stage in the fabrication process.

In the embodiment of the method 500, proceeding to block 506, an opening is formed in the substrate. Referring to the example of FIG. 33, an opening 3302 is formed extending through the substrate 202, the dielectric layer 602, and through the enclosure structure 810.

In an embodiment of forming the opening 3302, a masking layer is formed over the substrate 202. Using the masking layer as a masking element during the etching, the opening 3302 is etched. The etching of the opening 3302 may be performed by a wet etch, dry etch (including plasma and/or REI) processes in one or more etching processes. In an embodiment, the etching stops at the conductive feature 1904. In some embodiments, the etching also removes ends of 706A, 706B, 808A, 808B as discussed above.

The embodiment of the method 500 then proceeds to block 512, omitting blocks 508 and 510, and a barrier layer is formed lining the opening. Referring to the example of FIG. 34, a barrier layer 3402 is formed lining the opening 3302. The barrier layer 3402 may include an oxide, such as silicon oxide; a nitride such as silicon nitride; an oxynitride such as silicon oxynitride; combinations thereof; and/or other suitable materials. The barrier layer 3402 may be deposited by a deposition process (such as CVD, PVD, ALD, HDPCVD, MOCVD, RPCVD, PECVD, LPCVD, ALCVD, APCVD, other suitable methods, or combinations thereof). In an embodiment, the barrier layer 3402 is formed by depositing dielectric material by CVD process or processes and performing an etching (e.g., dry etching process) to remove the dielectric layer such that it remains only the sidewalls of the opening 3302. In an embodiment, a thickness of the barrier layer 3402 is between approximately 30 Å and approximately 3000 Å.

The method 500 then proceeds to block 514 where conductive material(s) is provided in the opening to form the conductive via. Referring to the example of FIG. 34, a metal layer 1204 is formed in the opening 3302 (FIG. 33). In an embodiment, the conductive fill metal 1204 is copper. However, other conductive materials may also be possible such as Ta, Ti, Al, Cu alloys, Co, TaN, TiN, TaN, and/or other suitable conductive materials. After deposition of the conductive fill metal, a planarization process (e.g., CMP) may be performed providing, as illustrated in FIG. 34, a planar top surface removing the excess material from the top of the substrate 202. In some implementations, a barrier layer such as TaN, TiN, WN, TbN, VN, ZrN, CrN, WC, WN, WCN, NbN, AlN, or combinations thereof may also be formed in the opening 3302.

As illustrated in FIG. 34, a conductive via 3404 is formed including the conductive fill metal 1204. The width w20 of the conductive via 3404 may be substantially constant throughout the via 3404. In an embodiment, the width w20 of the TSV 3404 ranges between approximately 0.5 μm and approximately 10 μm. The method 500 may then proceed to block 516 where continued fabrication may be performed as discussed above. Thus, the method 500 as illustrated by device 600*g* of FIGS. 33-34 provides for a conductive via 3404 that extends from a backside of the substrate 202 to a conductive feature 1904 of the device 600*g*, which may be coupled to the MLI of the second structure 2002.

Referring now to FIG. 35, illustrated is a device 600*h* that is substantially similar to the device 600*b* discussed above. Device 600*h* is illustrative of an embodiment of an enclosure structure 810'. The enclosure structure 810' is substantially similar to the enclosure structure 810 discussed herein, but specifically illustrates a configuration of layers (706A, 706B, 808A, 808B) that are not vertically aligned. The vertical offset alignment may provide for residual dielectric material 802' within the enclosure structure 810', substantially similar to the residual dielectric material 206' of FIG. 2F discussed above. In some embodiments, while the layers (706A, 706B, 808A, 808B) of the enclosure structure 810' are not aligned, a portion of each layer interfaces the layer above and below such that a contiguous vertical enclosure structure is formed. The enclosure structure 810' may be provided in any of the embodiments discussed above.

The present disclosure provides for many different embodiments. Interconnect structures and corresponding techniques for forming the interconnect structures such as TSV are disclosed herein. The TSV are formed within an enclosure structure that encases the TSV. In some embodiments, the formation of the enclosure structure limits exposure of the adjacent layers (e.g., ILD such as low-k dielectric) from the etching and deposition processes used to form the TSV.

In an embodiment, a method includes providing a substrate having a semiconductor device disposed on the substrate. A multi-layer interconnect (MLI) structure is formed over the substrate. The MLI structure includes an enclosure structure. An opening is etched within the enclosure structure. A protection layer is deposited on sidewalls of the opening. A through-substrate via (TSV) is formed extending within the enclosure structure of the MLI into the substrate. The protection layer is disposed between the TSV and the enclosure structure.

In a further embodiment, etching the opening includes laterally etching end regions of the enclosure structure. The depositing of the protection layer may include depositing a dielectric material directly on the etched end regions of the enclosure structure. In an embodiment, depositing the protection layer includes depositing a thickness of the protection layer substantially equal to an amount of lateral etching of the end regions of the enclosure structure. In an embodiment, the enclosure structure is ring-shaped from a top view. In an embodiment, the enclosure structure surrounds the TSV. In some implementations, etching dielectric material from within the enclosure structure forms the opening; and the opening is filled with conductive material. In some implementations, a barrier layer is formed in the opening prior to filling the opening with conductive material, wherein the barrier layer physically interfaces the protection layer. Exemplary compositions for the barrier layer includes TaN, TiN, WN, TbN, VN, ZrN, CrN, WC, WN, WCN, NbN, AlN, or combinations thereof.

In another of the broader embodiments, a method includes providing a semiconductor substrate having a semiconductor device disposed over the semiconductor substrate. A first dielectric layer is deposited over the semiconductor device. The method includes forming, within the first dielectric layer, a first via, a first metal line over the first via, a first metal ring coplanar with the first via, and a second metal ring coplanar with the first metal line and on the first metal ring. A second dielectric layer is deposited over the first metal line and within the second dielectric layer, a second via, a second metal line over the second via, a third metal ring coplanar with the second via and on the second metal ring, and a fourth metal ring coplanar with the second metal line and on the third metal ring are formed. Another via is formed through a portion of the semiconductor substrate, wherein the forming the another via includes etching the first dielectric layer and the second dielectric layer to form an opening extending through a center region of each of the first metal ring, the second metal ring, the third metal ring, and the fourth metal ring, wherein at least one of the first metal ring, the second metal ring, the third metal ring, and the fourth metal ring are laterally etched during the etching to form the opening.

In an embodiment, the first via, the first metal line, the second via, and the second metal line are electrically coupled to a source/drain region of the semiconductor device. In an embodiment, the first dielectric layer and the second dielectric layer are low-k dielectric materials. In some implementations, the forming the another via includes depositing a protection layer between the first metal ring and the another via. In some implementations, the first metal ring includes depositing a conductive material having curvilinear edges. In an embodiment, forming the first metal ring and the second metal ring is performed using a dual damascene process. In an embodiment, the method includes thinning the semiconductor substrate after forming the another via.

In another embodiment, an integrated circuit device includes an active device (e.g., transistor) disposed on a substrate. A multi-layer interconnect (MLI) is over the substrate. The MLI includes a plurality of metal lines and surrounding dielectric material including a first composition. A through-substrate via (TSV) extends through the substrate and through the dielectric material of the MLI. A metal-containing enclosure structure surrounds the TSV. The metal-containing enclosure structure interposes the TSV and the dielectric material of the MLI. A protection layer has a second composition interposing the metal-containing enclosure structure and the TSV.

In an embodiment, the metal-containing enclosure structure is approximately circular in a top view. In an embodiment, the metal-containing enclosure structure is comprised of a same material as the plurality of metal lines. In an embodiment, the integrated circuit device also includes a metal nitride barrier layer interposing the protection layer and the TSV.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   providing a semiconductor substrate having a semiconductor device disposed over the semiconductor substrate;
   depositing a first dielectric layer over the semiconductor device;
   forming, within the first dielectric layer, a first via, a first metal line over the first via, a first metal ring coplanar with the first via, and a second metal ring coplanar with the first metal line and on the first metal ring;
   depositing a second dielectric layer over the first metal line;
   forming, within the second dielectric layer, a second via, a second metal line over the second via, a third metal ring coplanar with the second via and on the second metal ring, and a fourth metal ring coplanar with the second metal line and on the third metal ring; and
   forming another via through a portion of the semiconductor substrate, wherein the forming the another via includes etching the first dielectric layer and the second dielectric layer to form an opening extending through a center region of each of the first metal ring, the second metal ring, the third metal ring, and the fourth metal ring, wherein at least one of the first metal ring, the second metal ring, the third metal ring, and the fourth metal ring are laterally etched during the etching to form the opening.

2. The method of claim 1, wherein: the first via, the first metal line, the second via, and the second metal line are electrically coupled to a source/drain region of the semiconductor device.

3. The method of claim 1, wherein the first dielectric layer and the second dielectric layer are low-k dielectric materials.

4. The method of claim 1, wherein the forming the another via includes:
   depositing a protection layer between the first metal ring and the another via.

5. The method of claim 1, wherein the forming the first metal ring includes depositing a conductive material having curvilinear edges.

6. The method of claim 1, wherein the forming the first metal ring and the second metal ring is performed using a dual damascene process.

7. The method of claim 1, further comprising: thinning the semiconductor substrate after forming the another via.

8. A method comprising:
   depositing a first low-k dielectric layer over a semiconductor substrate;
   forming, within the first low-k dielectric layer, a first via, a first metal line over the first via, a first metal ring coplanar with the first via, and a second metal ring coplanar with the first metal line and on the first metal ring;
   depositing a second low-k dielectric layer over the first metal line;
   forming, within the second low-k dielectric layer, a second via, a second metal line over the second via, a third metal ring coplanar with the second via and on the second metal ring, and a fourth metal ring coplanar with the second metal line and on the third metal ring; and
   forming an opening, wherein the forming the opening includes etching the first low-k dielectric layer and the second low-k dielectric layer to form an opening extending through a center region of each of the first metal ring, the second metal ring, the third metal ring, and the fourth metal ring; and filling the opening with conductive material.

9. The method of claim 8, further comprising:

depositing a protection layer on sidewalls of the opening prior to filling the opening.

10. The method of claim 9, further comprising:

forming a barrier layer in the opening prior to filling the opening with conductive material, wherein the barrier layer physically interfaces the protection layer.

11. The method of claim 8, wherein the first, second and third metal ring are in a ring shape from a top view.

* * * * *